US007214467B2

(12) United States Patent
Kanna et al.

(10) Patent No.: US 7,214,467 B2
(45) Date of Patent: *May 8, 2007

(54) PHOTOSENSITIVE RESIN COMPOSITION

(75) Inventors: Shinichi Kanna, Shizuoka (JP); Kazuyoshi Mizutani, Shizuoka (JP); Tomoya Sasaki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 306 days.

This patent is subject to a terminal disclaimer.

(21) Appl. No.: 10/455,459

(22) Filed: Jun. 6, 2003

(65) Prior Publication Data
US 2004/0009430 A1 Jan. 15, 2004

(30) Foreign Application Priority Data
Jun. 7, 2002 (JP) ............ P. 2002-167393
Jun. 21, 2002 (JP) ............ P. 2002-181384
Jun. 21, 2002 (JP) ............ P. 2002-181588

(51) Int. Cl.
*G03F 7/00* (2006.01)

(52) U.S. Cl. .................. 430/270.1; 430/281.1; 430/913; 430/914

(58) Field of Classification Search ............ 430/270.1, 430/281.1, 913, 914
See application file for complete search history.

(56) References Cited

U.S. PATENT DOCUMENTS 5,663,035 A 9/1997 Masuda et al.
6,852,467 B2 * 2/2005 Aoai et al. ............. 430/270.1
6,878,502 B2 * 4/2005 Mizutani et al. ....... 430/270.1
6,939,662 B2 * 9/2005 Mizutani et al. ....... 430/270.1
2002/0168584 A1 * 11/2002 Aoai et al. ............. 430/270.1
2003/0134225 A1 * 7/2003 Fujimori et al. ....... 430/270.1

FOREIGN PATENT DOCUMENTS

EP 1243968 A2 * 9/2002

(Continued)

OTHER PUBLICATIONS

R.R. Kunz, et al., "Outlook for 157 nm resist designs". Part of the SPIE Conference on Advances in Resist Technology and Processing XVI, SPIE vol. 3678 (1999), p. 13-23.

(Continued)

*Primary Examiner*—Amanda Walke
(74) *Attorney, Agent, or Firm*—Sughrue Mion, PLLC

(57) ABSTRACT

The photosensitive resin composition of the present invention is an excellent photosensitive resin composition: exhibiting significant transmissibility at the use of an exposure light source of 160 nm or less, more specifically $F_2$ excimer laser light, where line edge roughness and development time dependence are small and a problem of footing formation is improved; and comprising a resin which decomposes by an action of acid to increase the solubility in alkali developer, in which the resin contains a specific repeat unit; a compound capable of generating an acid upon irradiation with one of an actinic ray and a radiation, in which the compound includes at least two kinds of compounds selected from the group consisting of specific compounds (B1), (B2), (B3) and (B4).

23 Claims, 1 Drawing Sheet

FOREIGN PATENT DOCUMENTS

| | | | |
|---|---|---|---|
| EP | 1296190 A1 | * | 3/2003 |
| JP | 11-125907 A | | 5/1999 |
| JP | 2003216005 A | * | 7/2003 |
| JP | 2003307850 A | * | 10/2003 |
| JP | 2003345022 A | * | 12/2003 |
| WO | WO 00/17712 WO | | 3/2000 |

OTHER PUBLICATIONS

Dirk Schmaljohann, "Design Strategies for 157 nm Single-Layer Photoresists: Lithographic Evaluation of a Poly ($\alpha$-trifluoromethyl vinyl alcohol) Copolymer", In Advances in Resist Technology and Processing XVII, Proceedings of SPIE vol. 3999 (2000), p. 330-374.

* cited by examiner

PHOTOSENSITIVE RESIN COMPOSITION

FIELD OF THE INVENTION

The present invention relates to photosensitive resin compositions suitably used for microlithography processes such as the fabrication of very large scale integration and high capacity microchips, and for other photo fabrication processes. More particularly, the invention relates to positive resist compositions capable of forming high-resolution patterns using vacuum ultraviolet light at 160 nm or less.

BACKGROUND OF THE INVENTION

Integrated circuits increase their degree of integration more and more, and it has become necessary to process ultrafine patterns made up of line widths of quarter micron or less in the fabrication of semiconductor substrates of very large scale integration (VLSI). As one of means to make ultrafine patterns, known is short-wavelength regime of an exposure light source used for pattern formation of resists.

For example, i-ray (365 nm) of a high pressure mercury lamp has been used to date for fabricating semiconductor devices with integration degrees up to 64 M bits. As positive type resists corresponding to this light source, compositions containing novolak resin and naphthoquinone diazide compound as a photosensitized material have been developed in large numbers, and sufficient outcomes have been obtained for processing the line widths up to about 0.3 μm. Also, Krf excimer laser light (248 nm) instead of i-ray has been employed as the exposure light source for fabricating semiconductor devices with the integration degrees of 256 M bits or more.

Furthermore, for the purpose of fabricating semiconductors with the integration degrees of 1 G bits or more, recently, the use of ArF excimer laser light (193 nm) which is the light source of shorter wavelength, and further the use of $F_2$ excimer laser light (157 nm) for forming the patterns of 0.1 μm or less have been studied.

Components and compound structures of resist materials have been largely changed in conjunction with the short-wavelength regimes of the light source.

As a resist composition for the exposure by KrF excimer laser light, a so-called chemically amplified resist has been developed, which is the composition where a resin having a backbone of poly (hydroxystyrene) with less absorbance at 248 nm area and protected with an acid degradable group is used as a primary component and a compound (photoacid generator) which generates an acid by the radiation of far ultraviolet light is combined.

Also, as the resist composition for the exposure of ArF excimer laser light (193 nm), the chemically amplified resist has been developed, which uses an acid degradable resin where an alicyclic structure having no absorbance at 193 nm is introduced in a main chain or a side chain of polymer.

It has been found that absorbance at a 157 nm area is high even in the above alicyclic resin for $F_2$ excimer laser light (157 nm) and thus it is insufficient to obtain the target patterns of 0.1 μm or less. On the contrary, it has been reported in Proc. SPIE., 3678:13, 1999 that the resin where fluorine atoms are introduced (perfluoro structure) has sufficient transparency at 157 nm. The structures of effective fluorine resins have been proposed in Proc. SPIE., 3999:330, ibid., 357, ibid., 365, 2000, and WO-00/17712, and the resist compositions containing fluorine-containing resins have been studied.

However, the resist compositions containing fluorine resins for the exposure of $F_2$ excimer laser light have problems such as line edge roughness, development time dependence, weak dissolution contrast and large footing formation, and solution of these points has been desired.

The line edge roughness is referred to exhibiting a shape where edges of a line pattern of the resist and a substrate interface irregularly fluctuate in a vertical direction for the line direction, attributing to the resist property. When these patterns are observed from right above, the edges look convexo-concave (±approximately some nm to tens nm). Since this convexo-concave state is transferred to the substrate by an etching process, if unevenness is remarkable, electric property faults are caused and process yields are reduced.

Also, the development time dependence is referred to degrees of changes of pattern sizes due to variation of the development time. When the development time dependence is remarkable, size uniformity in a wafer surface is aggravated, and controllability of the process becomes difficult.

Also, footing formation means the condition where a sectional shape of the line pattern forms a footing shape in a ground substrate interface. When the level of the footing formation of the pattern shape are remarkable, it is problematic because controllability (management) of the pattern size in the etching process is aggravated.

SUMMARY OF THE INVENTION

Accordingly, the object of the present invention is to provide photosensitive resin compositions suitable for the use of an exposure light source of light of 160 nm or less, particularly $F_2$ excimer laser light (157 nm), and specifically to provide excellent photosensitive resin compositions which exhibit significant transmissibility at the use of the light source of 157 nm, and with less line edge roughness and less development time dependence.

Another object of the invention is to provide photosensitive resin compositions suitable for the use of the exposure light source of 160 nm or less, particularly $F_2$ excimer laser light (157 nm), and specifically to provide excellent photosensitive resin compositions which exhibit significant transmissibility at the use of the light source of 157 nm, and with strong dissolution contrast, less line edge roughness and less footing formation.

As a result of an intensive study with taking notice of the above various properties, the present inventors have found that the objects of the invention are excellently achieved by the use of the following certain compositions, and have reached the invention.

That is, the present invention is the following constitution.

(1) A photosensitive resin composition comprising:

(A) a resin which decomposes by an action of acid to increase the solubility in alkali developer, in which the resin contains: a repeat unit having a group represented by the following general formula (Z); and a repeat unit having a group which decomposes by an action of acid to become an alkali soluble group;

(B) a compound capable of generating an acid upon irradiation with one of an actinic ray and a radiation, in which the compound includes at least two kinds of compounds selected from the group consisting of compounds (B1), (B2), (B3) and (B4):

(B1) a compound capable of generating aliphatic or aromatic sulfonic acid substituted with at least one fluorine atom upon irradiation with one of an actinic ray and a radiation;

(B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation;

(C) a solvent; and
(D) a surfactant:

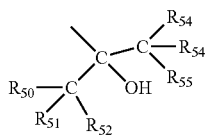

(Z)

wherein $R_{50}$ to $R_{55}$ are the same or different, and represent a hydrogen atom, a fluorine atom, or an alkyl group which may have a substituent, and at least one of $R_{50}$ to $R_{55}$ represents a fluorine atom, or an alkyl group wherein at least one hydrogen atom is substituted with a fluorine atom.

(2) The photosensitive resin composition according to (1), wherein the repeat unit having the group represented by the general formula (Z) is represented by the following general formula (1) or (2).

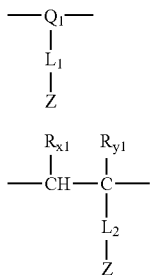

(1)

(2)

wherein $Q_1$ represents an alicyclic hydrocarbon group; $L_1$ and $L_2$ each independently represent a linking group; Z represents a group represented by the general formula (Z); $R_{x1}$ and $R_{y1}$ each independently represent a hydrogen atom, a halogen atom, a cyano group or an alkyl group which may have a substituent.

(3) The photosensitive resin composition according to (1), wherein the repeat unit having the group which decomposes by the action of acid to become the alkali soluble group is represented by the following formula (3) or (4):

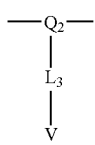

(3)

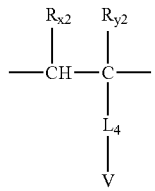

(4)

wherein $Q_2$ represents an alicyclic hydrocarbon group; $L_3$ and $L_4$ each independently represent a linking group; V represents a group which decomposes by an action of acid to become an alkali soluble group; $R_{x2}$ and $R_{y2}$ each independently represent a hydrogen atom, a halogen atom, a cyano group or an alkyl group which may have a substituent.

(4) The photosensitive resin composition according to (1), wherein the resin (A) is a resin having: at least one of repeat units represented by the following formula (I); at least one of repeat units represented by the following formula (II); and at least one of repeat units represented by the following formula (VI):

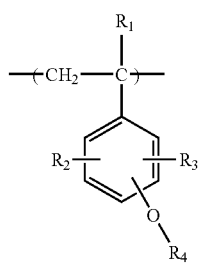

(I)

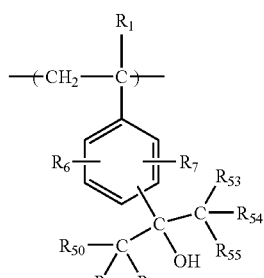

(II)

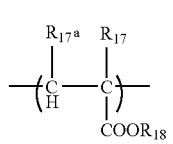

(VI)

wherein $R_1$, $R_5$, $R_{17a}$ and $R_{17}$ are the same or different, and represent a hydrogen atom, a halogen atom, a cyano group and an alkyl group which may have a substituent; $R_2$, $R_3$, $R_6$ and $R_7$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent; $R_{50}$ to $R_{55}$ are the same or different, and represent a hydrogen atom, a fluorine atom, or an alkyl group which may have a substituent, and at least one of $R_{50}$ to $R_{55}$ represents a fluorine atom, or an alkyl group wherein at least one hydrogen atom is substituted with a fluorine atom; $R_4$ represents a group represented by the following general formula (IV) or (V); $R_{18}$ represents —$C(R_{18d})(R_{18e})(R_{18f})$ or —$C(R_{18d})(R_{18e})(OR_{18g})$; $R_{18d}$ to $R_{18g}$ are the same or different, and represent a hydrogen atom, or an alkyl, cycloalkyl, alkenyl, aralkyl or aryl group which may have a substituent; two of $R_{18d}$, $R_{18e}$ and $R_{18f}$, or two of $R_{18d}$, $R_{18e}$ and $R_{18g}$ may combine to form a ring:

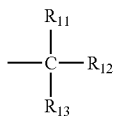
(IV)

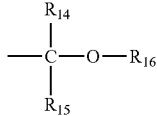
(V)

wherein $R_{11}$, $R_{12}$ and $R_{13}$ are the same or different, and represent an alkyl, cycloalkyl, alkenyl, aralkyl or aryl group which may have a substituent;

$R_{14}$ and $R_{15}$ are the same or different, and represent a hydrogen atom, or an alkyl group which may have a substituent; $R_{16}$ represents an alkyl, cycloalkyl, aralkyl or aryl group which may have a substituent; two of $R_{14}$ to $R_{16}$ may combine to form a ring.

(5) The photosensitive resin composition according to (4), wherein $R_{18}$ in the general formula (VI) is represented by the following general formula (VI-A):

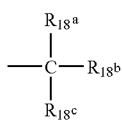
(VI-A)

wherein $R_{18a}$ and $R_{18b}$ are the same or different, and represent an alkyl group which may have a substituent; $R_{18c}$ represents a cycloalkyl group which may have a substituent.

(6) The photosensitive resin composition according to (4), wherein $R_{18}$ in the general formula (VI) is represented by the following general formula (VI-B):

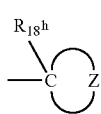
(VI-B)

wherein $R_{18h}$ represents an alkyl, alkenyl, alkynyl, aralkyl or aryl group which may have a substituent; Z represents an atomic group which composes a monocyclic or polycyclic alicyclic group with the carbon atom in the general formula (VI-B).

(7) The photosensitive resin composition according to (4), wherein $R_{18}$ in the general formula (VI) is represented by the following general formula (VI-C):

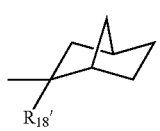
(VI-C)

wherein $R_{18'}$ represents an alkyl, alkenyl, alkynyl, aralkyl or aryl group which may have a substituent.

(8) The photosensitive resin composition according to (4), wherein at least one of $R_1$ in the general formula (I), $R_5$ in the general formula (II) and $R_{17}$ in the general formula (IV) is a trifluoromethyl group.

(9) The photosensitive resin composition according to (4), wherein the resin (A) further contains at least one repeat unit represented by the following general formula (III) or (VII):

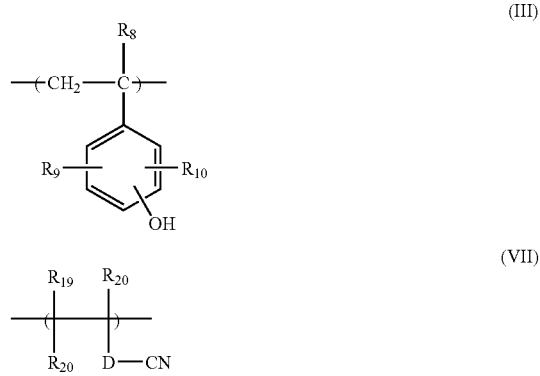

wherein $R_8$ represents a hydrogen atom, a halogen atom, a cyano group, or an alkyl group which may have a substituent; $R_9$ and $R_{10}$ are the same or different, and represent a hydrogen atom, a halogen atom, a cyano group, or an alkyl, cycloalkyl, alkoxy, acyl, acyloxy, alkenyl, aryl or aralkyl group which may have a substituent;

$R_{19}$ and $R_{20}$ are the same or different, and represent a hydrogen atom, a halogen atom, a cyano group, or an alkyl group which may have a substituent; $R_{21}$ represents a hydrogen atom, a halogen atom, an alkyl group which may have a substituent, or —D—CN group; D represents a single bond or a bivalent linking group.

(10) The photosensitive resin composition according to (4), wherein the resin (A) further contains at least one repeating unit represented by the following general formulae (VIII) to (XVII):

(VIII)

(IX)

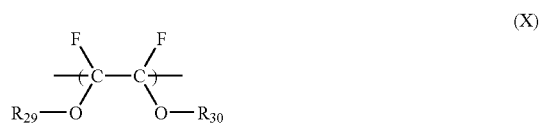
(X)

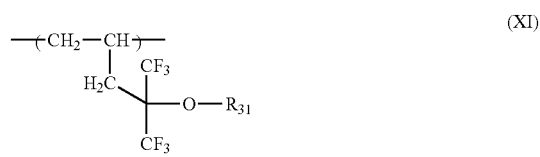
(XI)

-continued

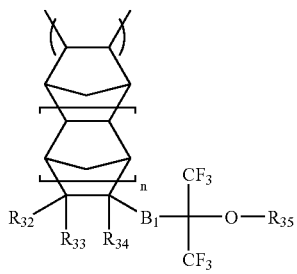
(XII)

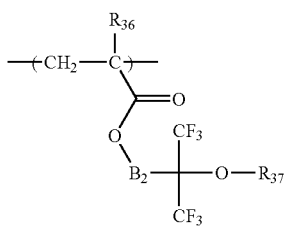
(XIII)

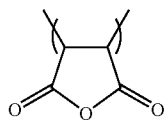
(XIV)

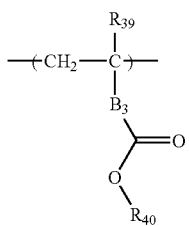
(XV)

(XVI)

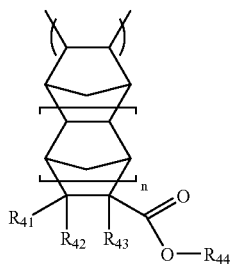
(XVII)

wherein $R_{25}$, $R_{26}$ and $R_{27}$ are the same or different, and represent a hydrogen atom, a fluorine atom, or an alkyl, cycloalkyl or aryl group which may have a substituent; $R_{28}$, $R_{29}$ and $R_{30}$ are the same or different, and represent an alkyl, cycloalkyl or aryl group which may have a substituent; $R_{25}$ and $R_{26}$, $R_{27}$ and $R_{28}$, and, $R_{29}$ and $R_{30}$ may combine each other to form a ring; $R_{31}$, $R_{35}$, $R_{37}$, $R_{40}$ and $R_{44}$ are the same or different, and represent a hydrogen atom, or an alkyl, cycloalkyl, acyl or alkoxycarbonyl group which may have a substituent; $R_{32}$, $R_{33}$, $R_{34}$, $R_{41}$, $R_{42}$ and $R_{43}$ are the same or different, and represent a hydrogen atom, a halogen atom, or an alkyl or alkoxy group which may have a substituent; $R_{36}$ and $R_{39}$ are the same or different, and represent a hydrogen atom, a halogen atom, a cyano group, or an alkyl group which may have a substituent; $R_{38}$ represents an alkyl, cycloalkyl, aralkyl or aryl group which may have a substituent; $B_1$ and $B_2$ each represents a single bond or bivalent linking group; $B_3$ represents a bivalent linking group; and n represents 0 or 1.

(11) A photosensitive resin composition comprising:

(A) a resin which decomposes by an action of an acid to increase the solubility in an alkali developer, in which the resin contains a repeat unit having a group represented by the following general formula (Y); and (B) a compound capable of generating an acid upon irradiation with one of an actinic ray and a radiation, in which the compound includes at least two kinds of compounds selected from the group consisting of compounds (B1), (B2), (B3) and (B4):

(B1) a compound capable of generating aliphatic or aromatic sulfonic acid substituted with at least one fluorine atom upon irradiation with one of an actinic ray and a radiation;

(B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation;

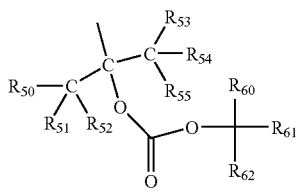
(Y)

wherein $R_{50}$ to $R_{55}$ are the same or different, and represent a hydrogen atom, a fluorine atom, or an alkyl group which may have a substituent; at least one of $R_{50}$ to $R_{55}$ represents a fluorine atom, or an alkyl group wherein at least one hydrogen atom is substituted with a fluorine atom; $R_{60}$ to $R_{62}$ are the same or different, and represent an alkyl, cycloalkyl, alkenyl, aralkyl or aryl group which may have a substituent.

(12) The photosensitive resin composition according to (11), wherein the repeat unit having the group represented by the general formula (Y) is represented by the following general formula (1') or (2'):

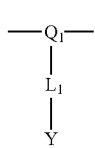
(1)

-continued

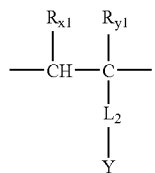
(2)

$Q_1$ represents an alicyclic hydrocarbon group; $L_1$ and $L_2$ each independently represent a linking group; Y represents a group represented by the general formula (Y); $R_{x1}$ and $R_{y1}$ each independently represent a hydrogen atom, a halogen atom, a cyano group or an alkyl group which may have a substituent.

(13) The photosensitive resin composition according to (11), wherein the resin (A) is a resin having: at least one of repeat units represented by the following formula (II); and at least one of repeat units represented by the following formula (II'):

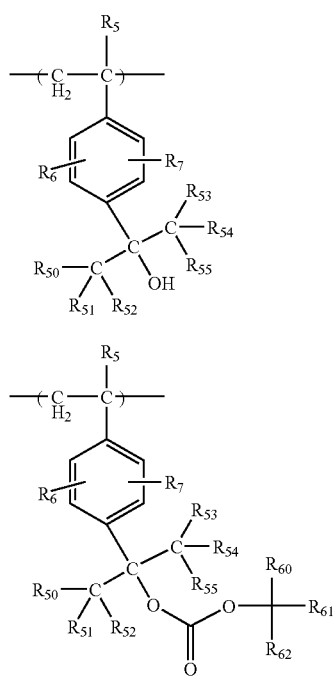

wherein $R_5$ are the same or different, and represents a hydrogen atom, a halogen atom, a cyano group, or an alkyl group which may have a substituent; $R_6$ and $R_7$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent;

$R_{50}$ to $R_{55}$ are the same or different, and represent a hydrogen atom, a fluorine atom, or an alkyl group which may have a substituent, and at least one of $R_{50}$ to $R_{55}$ represents a fluorine atom, or an alkyl group wherein at least one hydrogen atom is substituted with a fluorine atom;

$R_{60}$ to $R_{62}$ are the same or different, and represent an alkyl, cycloalkyl, alkenyl, aralkyl or aryl group which may have a substituent.

(14) The photosensitive resin composition according to (11), wherein the resin (A) is a resin having: at least one of repeat units represented by the following formula (I); at least one of repeat units represented by the following formula (II); and at least one of repeat units represented by the following formula (II'):

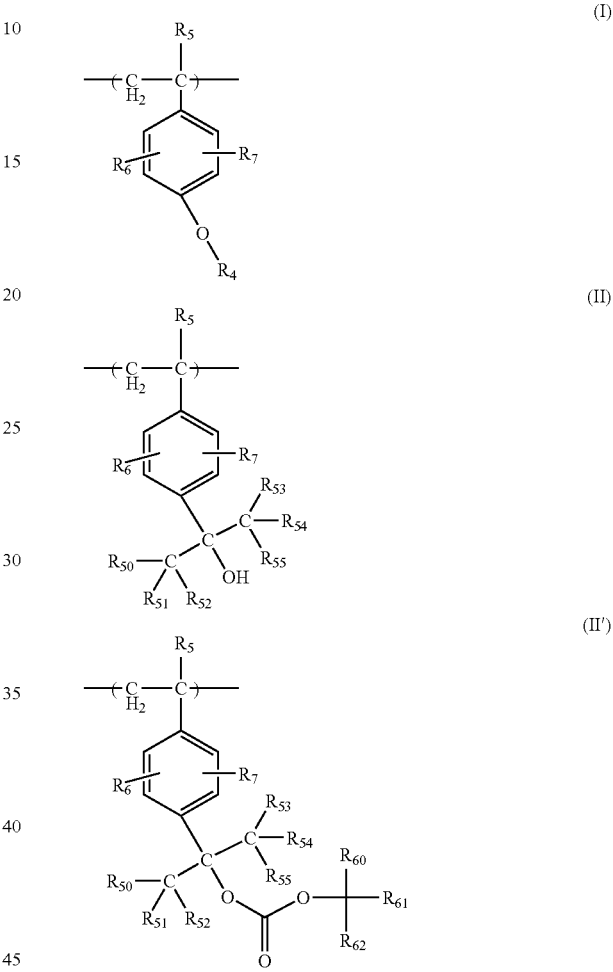

wherein $R_2$, $R_3$, $R_6$ and $R_7$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent;

$R_4$ represents a group of the following general formula (IV) or (V);

$R_5$ are the same or different, and represents a hydrogen atom, a halogen atom, a cyano group, or an alkyl group which may have a substituent;

$R_{50}$ to $R_{55}$ are the same or different, and represent a hydrogen atom, a fluorine atom, or an alkyl group which may have a substituent, and at least one of $R_{50}$ to $R_{55}$ represents a fluorine atom or an alkyl group wherein at least one hydrogen atom is substituted with a fluorine atom;

$R_{60}$ to $R_{62}$ are the same or different, and represent an alkyl, cycloalkyl, alkenyl, aralkyl or aryl group which may have a substituent;

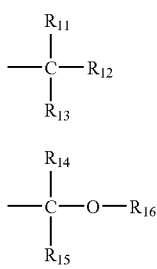
(IV)

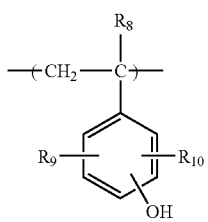 (V)

$R_{11}$, $R_{12}$ and $R_{13}$ are the same or different, and represent an alkyl, cycloalkyl, alkenyl, aralkyl or aryl group which may have a substituent;

$R_{14}$ and $R_{15}$ are the same or different, and represent a hydrogen atom or an alkyl group which may have a substituent;

$R_{16}$ represents an alkyl, cycloalkyl, aralkyl or aryl group which may have a substituent, and two of $R_{14}$ to $R_{16}$ may combine to form a ring.

(15) The photosensitive resin composition according to (14), wherein at least one of $R_5$ in the general formula (I), $R_5$ in the general formula (II) and $R_5$ in the general formula (II') is a trifluoromethyl group.

(16) The photosensitive resin composition according to (14), wherein the resin (A) further has at least one repeat unit represented by the following general formula (III) or (VII):

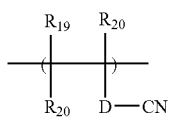 (III)

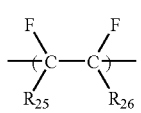 (VII)

wherein $R_8$ represents a hydrogen atom, a halogen atom a cyano group, or an alkyl group which may have a substituent; $R_9$ and $R_{10}$ are the same or different, and represent a hydrogen atom, a halogen atom, a cyano group, or an alkyl, cycloalkyl, alkoxy, acyl, acyloxy, alkenyl, aryl or aralkyl group which may have a substituent;

$R_{19}$ and $R_{20}$ are the same or different, and represent a hydrogen atom, a halogen atom, a cyano group, or an alkyl group which may have a substituent; $R_{21}$ represents a hydrogen atom, a halogen atom, an alkyl group which may have a substituent, or —D—CN group; D represents a single bond or a bivalent linking group.

(17) The photosensitive resin composition according to (14), wherein the resin (A) further has at least one repeat unit represented by the following general formulae (VIII) to (XVII):

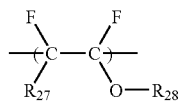 (VIII)

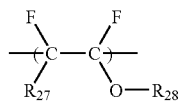 (IX)

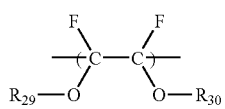 (X)

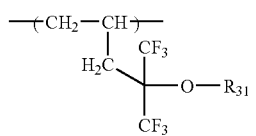 (XI)

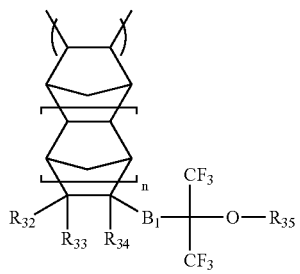 (XII)

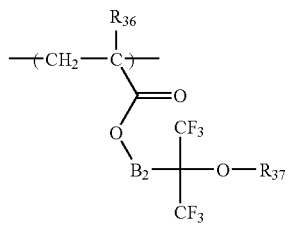 (XIII)

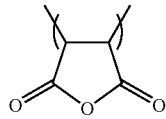 (XIV)

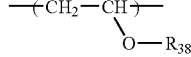 (XV)

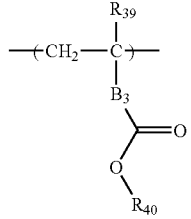 (XVI)

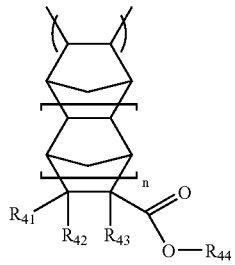 (XVII)

wherein $R_{25}$, $R_{26}$ and $R_{27}$ are the same or different, and represent a hydrogen atom, a fluorine atom, or an alkyl, cycloalkyl or aryl group which may have a substituent; $R_{28}$, $R_{29}$ and $R_{30}$ are the same or different, and represent an alkyl, cycloalkyl or aryl group which may have a substituent; $R_{25}$ and $R_{26}$, $R_{27}$ and $R_{28}$, and, $R_{29}$ and $R_{30}$ may combine each other to form a ring; $R_{31}$, $R_{35}$, $R_{37}$, $R_{40}$ and $R_{44}$ are the same or different, and represent a hydrogen atom, or an alkyl, cycloalkyl, acyl or alkoxycarbonyl group which may have a substituent; $R_{32}$, $R_{33}$, $R_{34}$, $R_{41}$, $R_{42}$ and $R_{43}$ are the same or different, and represent a hydrogen atom, a halogen atom, or an alkyl or alkoxy group which may have a substituent; $R_{36}$ and $R_{39}$ are the same or different, and represent a hydrogen atom, a halogen atom, a cyano group, or an alkyl group which may have a substituent; $R_{38}$ represents an alkyl, cycloalkyl, aralkyl or aryl group which may have a substituent; $B_1$ and $B_2$ each represents a single bond or a bivalent linking group; $B_3$ represents a bivalent linking group; and n represents 0 or 1.

(18) A photosensitive resin composition comprising:

(A) a resin which decomposes by an action of acid to increase the solubility in alkali developer, in which the resin has a repeat unit represented by the following general formula (IA) and a repeat unit represented by the following general formula (IIA); and (B) a compound capable of generating an acid upon irradiation with one of an actinic ray and a radiation, in which the compound includes at least two kinds of compounds selected from the group consisting of compounds (B1), (B2), (B3) and (B4):

(B1) a compound capable of generating aliphatic or aromatic sulfonic acid substituted with at least one fluorine atom upon irradiation with one of an actinic ray and a radiation;

(B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation:

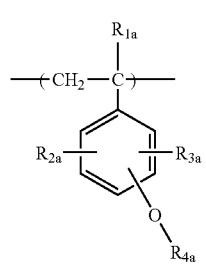

(IA)

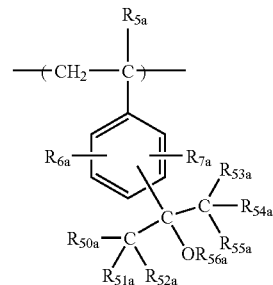

(IIA)

wherein $R_{1a}$ and $R_{5a}$ are the same or different, and represent a hydrogen atom, a halogen atom, a cyano group, or an alkyl group which may have a substituent; $R_{2a}$, $R_{3a}$, $R_{6a}$ and $R_{7a}$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent; $R_{50a}$ to $R_{55a}$ are the same or different, and represent a hydrogen atom, a fluorine atom, or an alkyl group which may have a substituent; at least one of $R_{50a}$ to $R_{55a}$ represents a fluorine atom or an alkyl group wherein at least one hydrogen atom is substituted with a fluorine atom; $R_{56a}$ represents a hydrogen atom, or an alkyl, cycloalkyl, acyl or alkoxycarbonyl group which may have a substituent; $R_{4a}$ represents a group of the following general formula (IVA) or (VA):

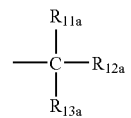

(IVA)

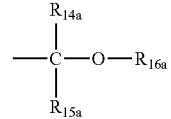

(VA)

wherein $R_{11a}$, $R_{12a}$ and $R_{13a}$ are the same or different, and represent an alkyl, cycloalkyl, alkenyl, aralkyl or aryl group which may have a substituent;

$R_{14a}$ and $R_{15a}$ are the same or different, and represent a hydrogen atom or an alkyl group which may have a substituent;

$R_{16a}$ represents an alkyl, cycloalkyl, aralkyl or aryl group which may have a substituent; two of $R_{14a}$ to $R_{16a}$ may combine to form a ring.

(19) A photosensitive resin composition comprising:

(A) a resin which decomposes by an action of acid to increase the solubility in alkali developer, in which the resin has a repeat unit represented by the following general formula (IIA) and a repeat unit represented by the following general formula (VIA); and (B) a compound capable of generating an acid upon irradiation with one of an actinic ray and a radiation, in which the compound includes at least two kinds of compounds selected from the group consisting of compounds (B1), (B2), (B3) and (B4):

(B1) a compound capable of generating aliphatic or aromatic sulfonic acid substituted with at least one fluorine atom upon irradiation with one of an actinic ray and a radiation;

(B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation:

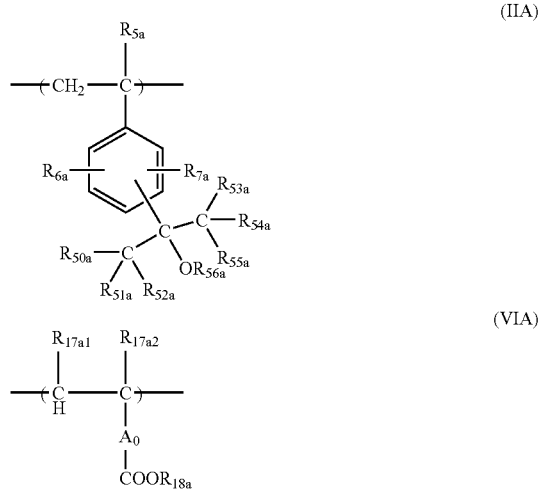

(IIA)

(VIA)

wherein $R_{5a}$ represents a hydrogen atom, a halogen atom, a cyano group, or an alkyl group which may have a substituent; $R_{6a}$ and $R_{7a}$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent; $R_{50a}$ to $R_{55a}$ are the same or different, and represent a hydrogen atom, a fluorine atom, or an alkyl group which may have a substituent, and at least one of $R_{50a}$ to $R_{55a}$ represents a fluorine atom or an alkyl group wherein at least one hydrogen atom is substituted with a fluorine atom; $R_{56a}$ represents a hydrogen atom, or an alkyl, cycloalkyl, acyl or alkoxycarbonyl group which may have a substituent; $R_{17a1}$ and $R_{17a2}$ are the same or different, and represent a hydrogen atom, a halogen atom, a cyano group and an alkyl group which may have a substituent; $R_{18a}$ represents $-C(R_{18a1})(R_{18a2})(R_{18a3})$ or $-C(R_{18a1})(R_{18a2})(OR_{18a4})$; $R_{18a1}$ to $R_{18a4}$ are the same or different, and represent a hydrogen atom or an alkyl, cycloalkyl, alkenyl, aralkyl or aryl group which may have a substituent, and two of $R_{18a1}$, $R_{18a2}$ and $R_{18a3}$ or two of $R_{18a1}$, $R_{18a2}$ and $R_{18a4}$ may combine to form a ring; $A_0$ represents a single bond or a bivalent linking group which may have a substituent.

(20) The photosensitive resin composition according to (19), wherein $R_{18a}$ in the general formula (VIA) is represented by the following general formula (VIA-A):

(VIA-A)

wherein $R_{18a5}$ and $R_{18a6}$ are the same or different, and represent an alkyl group which may have a substituent; $R_{18a7}$ represents a cycloalkyl group which may have a substituent.

(21) The photosensitive resin composition according to (19), wherein $R_{18a}$ in the general formula (VIA) is represented by the following general formula (VIA-B):

(VIA-B)

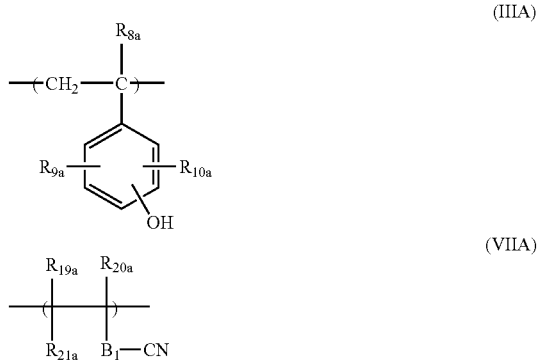

wherein $R_{18a8}$ represents an alkyl, alkenyl, alkynyl, aralkyl or aryl group which may have a substituent.

(22) The photosensitive resin composition according to (18) or (19), wherein at least one of $R_{1a}$ in the general formula (IA), $R_{5a}$ in the general formula (IIA) and $R_{17a2}$ in the general formula (VIA) is a trifluoromethyl group.

(23) The photosensitive resin composition according to (18) or (19), wherein the resin (A) further has at least one repeat unit represented by the following general formula (IIIA) or (VIIA):

(IIIA)

(VIIA)

wherein $R_{8a}$ represents a hydrogen atom, a halogen atom, a cyano group, or an alkyl group which may have a substituent; $R_{9a}$ and $R_{10a}$ are the same or different, and represent a hydrogen atom, a halogen atom, a cyano group, or an alkyl, cycloalkyl, alkoxy, acyl, acyloxy, alkenyl, aryl or aralkyl group which may have a substituent;

$R_{19a}$ and $R_{20a}$ are the same or different, and represent a hydrogen atom, a halogen atom, a cyano group, or an alkyl group which may have a substituent; $R_{21a}$ represents a hydrogen atom, a halogen atom, an alkyl group which may have a substituent, or $-B_1-CN$ group; $B_1$ represents a single bond or a bivalent linking group.

The photosensitive resin composition according to any one of the above items, which further contains (D) a fluorine and/or silicon surfactant.

The photosensitive resin composition according to any one of the above items, which further contains (E) a basic compound having a nitrogen atom as an acid diffusion inhibitor.

The photosensitive resin composition according to any one of the above items, which is used for the radiation by $F_2$ laser light with a wavelength of 157 nm.

DETAILED DESCRIPTION OF THE INVENTION

Figure 1:
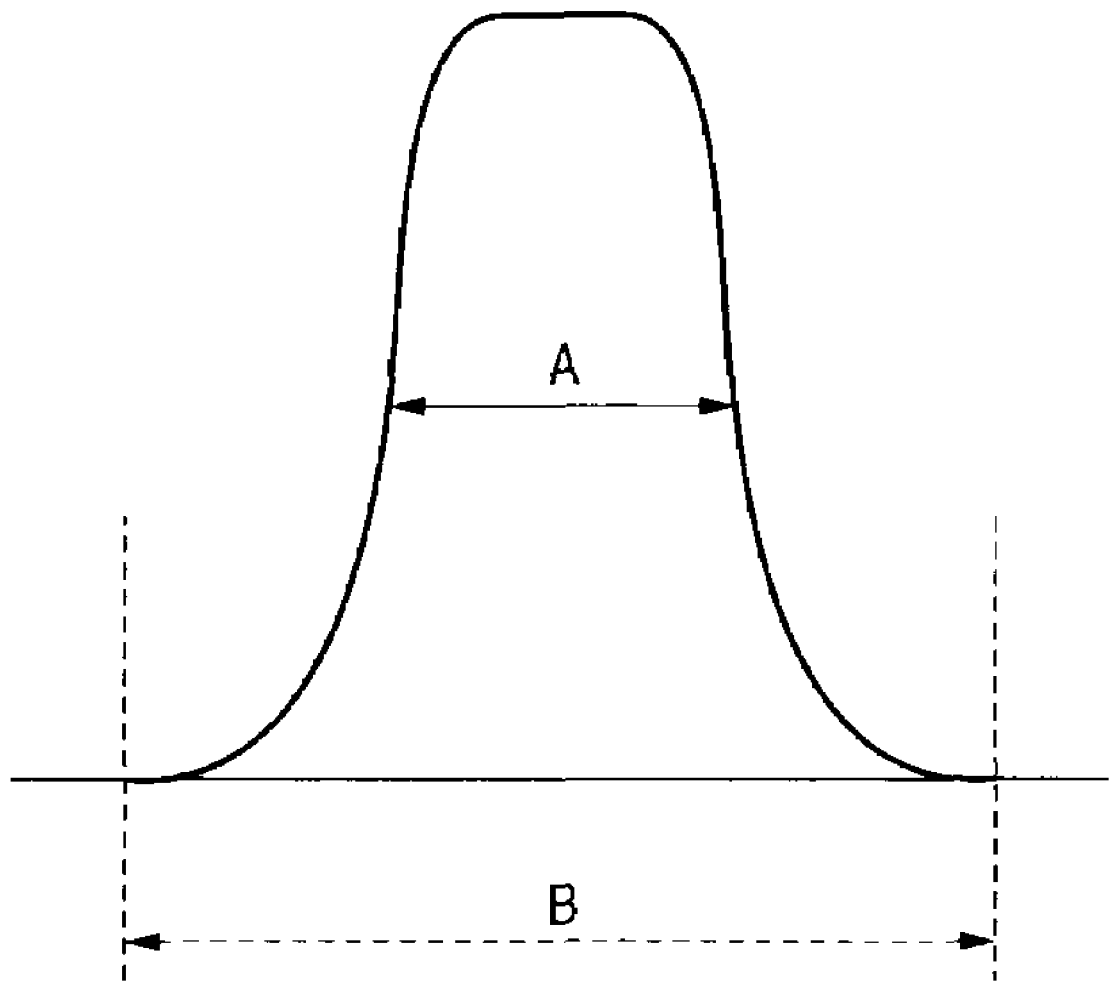
FIG. 1 is a figure showing a footing shape used for the evaluation of the footing formation in the examples.

The compounds used for the invention are described below in detail.

[1] Resin (A) of the Invention

[Resin (A) of a First Embodiment]

The resin (A) of the first embodiment of the invention contains (A1) a repeat unit having a group represented by the general formula (Z) and (A2) a repeat unit having a group which decomposes by an acid action to become an alkali soluble group.

The repeat unit (A1) having the group represented by the general formula (Z) is preferably the repeat unit represented by the above general formulae (1) and (2).

$Q_1$ in the formula (1) represents an alicyclic hydrocarbon group. $L_1$ and $L_2$ in the formulae (1) and (2) represent linking groups, and Z represents a group represented by the above general formula (Z).

The alicyclic hydrocarbon group as $Q_1$ is the group where at least one atom composing the alicycle is present by being included in a backbone of the resin, and the other one atom composing the alicycle binds to $L_1$.

The alicyclic hydrocarbon group as $Q_1$ may be monocyclic or polycyclic type. Monocyclic types can include those of 3 to 8 carbons, and for example, preferably cyclopropyl, cyclopentyl, cyclohexyl, cycloheptyl, and cyclooctyl groups. Polycyclic types can include those of 6 to 20 carbons, and for example, preferably adamanthyl, norbornyl, isobornyl, camphanyl, zincropentyl, α-pinel, tricyclodecanyl, tetracyclododecyl, androstanyl groups and the like. Cycloalkyl groups include those where a part of carbon atoms composing the ring is substituted with heteroatoms such as oxygen, sulfur and nitrogen atoms.

The linking groups as $L_1$ and $L_2$ represents bivalent alkylene, cycloalkylene, alkenylene or arylene which may have single bonds and substituents, or —O—CO—$R_{22a}$—, —CO—O—$R_{22b}$— or —CO—N ($R_{22c}$)—$R_{22d}$—. $R_{22a}$, $R_{22b}$ and $R_{22d}$ may be the same or different, and represent bivalent alkylene, cycloalkylene, alkenylene or arylene groups which may have single bonds, or ether, ester, amide, urethane or ureide groups. $R_{22c}$ represents a hydrogen atom, or an alkyl, cycloalkyl, aralkyl or aryl group which may have substituents.

Alkylene groups can include linear or branched alkylene groups, and for example, include those of 1 to 8 carbons such as methylene, ethylene, propylene, butylene, hexylene and octylene groups.

Cycloalkylene groups include those of 5 to 8 carbons such as cyclopentylene and cyclohexylene.

Alkenylene groups include those of 2 to 6 carbons such as ethenylene, propenylene and butenylene which may preferably have substituents.

Arylene groups include those of 6 to 15 carbons such as phenylene, trylene and naphthylene groups which may preferably have substituents.

The alkyl group of $R_{x1}$ and $R_{y1}$ may be substituted with halogen atoms such as fluorine atoms, cyan groups and the like, and preferably can include an alkyl group of 1 to 3 carbons such as methyl and trifluoromethyl group.

Preferred is norbornene as $Q_1$, an alkylene group as $L_1$, and arylene, ester (—CO—O—), alkylene, cycloalkylene or the combination thereof as $L_2$. $R_{x1}$ is preferably a hydrogen atom, and $R_{y1}$ is preferably a hydrogen atom, methyl or trifluoromethyl group.

The repeat unit (A2) having the group which decomposes by the acid action to become the alkali soluble group is preferably the repeat unit represented by the formulae (3) and (4). $Q_2$, $L_3$, $L_4$, $R_{x2}$ and $R_{y2}$ in the formulae (3) and (4) are the same as defined for $Q_1$, $L_1$, $L_2$, $R_{x1}$ and $R_{y1}$ in the formulae (1) and (2).

Preferred is norbornene as Q2, alkylene, —O— or the combination thereof as $L_3$, and a single bond as $L_4$. $R_{x2}$ is preferably a hydrogen atom, and $R_{y2}$ is preferably a hydrogen atom, methyl or trifluoromethyl group.

As V, the groups (acid degradable groups) which decompose by the acid action to become the alkali soluble groups include, for example, —O—C($R_{18d}$)($R_{18e}$)($R_{18f}$), —O—C($R_{18d}$)($R_{18e}$)(O$R_{18g}$), —O—COO—C($R_{18d}$)($R_{18e}$)($R_{18f}$), —O—C($R_{O1}$)($R_{O2}$) COO—C($R_{18d}$)($R_{18e}$)($R_{18f}$), —COO—C($R_{18d}$)($R_{18e}$)($R_{18f}$), —Coo—C($R_{18d}$)($R_{18e}$)(O$R_{18g}$), and the like. $R_{18d}$ to $R_{18g}$ are the same as defined above except for hydrogen atoms. $R_{O1}$ and $R_{O2}$ represent hydrogen atoms, or alkyl, cycloalkyl, alkenyl, aralkyl or aryl which may have substituents shown above.

Preferable specific examples of V preferably include ether or ester groups of tertiary alkyl groups such as t-butyl, t-amyl, 1-alkyl-1-cyclohexyl, 2-alkyl-2-adamanthyl, 2-adamanthyl-2-propyl and 2-(4-methylcyclohexyl)-2-propyl groups, acetal or acetal ester groups such as 1-alkoxy-1-ethoxy and tetrahydropyranyl groups, t-alkyl carbonate group, t-alkylcarbonylmethoxy group and the like. More preferable are acetal groups such as 1-alkoxy-1-ethoxy groups and tetrahydropyranyl group.

In the case of acetal group, acid degradability is great and the range of selection of acid generating compounds combined is expanded. Thus, it is effective in terms of sensitivity improvement and performance variation in an elapsed time till heating after the exposure. Particularly preferable are the acetal groups containing an alkoxy group derived from the above perfluoroalkyl group as 1-alkoxy component of the acetal group. In this case, transmissibility at the exposure light with short wavelength (e.g., 157 nm of $F_2$ excimer laser light) can be further enhanced.

Specific examples of the repeat unit (A1) can include specific examples of the repeat unit represented by the general formula (II) described below, F-20' exemplified as the repeat unit represented by the general formula (XII), F-39 exemplified as the repeat unit of the general formula (XIII), and the like.

Specific examples of the repeat unit (A2) can include (A-1) to (A-39) exemplified as the repeat units of the general formula (I) described below, (F-14) to (F-16) and (F-18) exemplified as the repeat units of the general formula (XI), (F-20), (F-21) to (F-23), (F-25) and (F-28) exemplified as the repeat units of the general formula (XII), (F-30), (F-33), (F-34) and (F-38) exemplified as the repeat units of the general formula (XIII), and (B-1) to (B-30) exemplified as the repeat units of the general formulae (VI) and (XVII).

It is preferred that the resin (A) of the invention is the resin having each at least one of the respective repeat units represented by the above general formulae (I), (II) and (VI), which decomposes by the acid action to increase solubility for the alkali developing solutions.

In the resin (A) of the invention, it is preferable that $R_{18}$ in the general formula (VI) is represented by the above general formula (VI-A), (VI-B) or (VI-C).

The resin (A) in the invention may further have at least one of the repeat units represented by the above general formulae (III) and (VII) to (XVII).

$R_1$, $R_5$, $R_{17a}$ and $R_{17}$ in the general formulae (I), (II) and (VI) maybe the same or different, and represent hydrogen atoms, halogen atoms, cyano groups, or alkyl groups which may have substituents. $R_2$, $R_3$, $R_6$ and $R_7$ may be the same or different, and represent hydrogen atoms, halogen atoms, cyano groups, hydroxyl groups, or alkyl, cycloalkyl, alkoxy, acyl, acyloxy, alkenyl, aryl or aralkyl groups which may have substituents. $R_{50}$ to $R_{55}$ may be the same or different, and represent hydrogen atoms, fluorine atoms, or alkyl groups which may have substituents. But, at least one in $R_{50}$ to $R_{55}$ represents a fluorine atom or an alkyl group wherein at least one hydrogen atom is substituted with a fluorine atom. $R_4$ represents a group of the following general formula (IV) or (V). $R_{18}$ represents $-C(R_{18d})(R_{18e})(R_{18f})$ or $-C(R_{18d})(R_{18e})(OR_{18g})$. $R_{18d}$ to $R_{18g}$ may be the same or different, and represent hydrogen atoms, or alkyl, cycloalkyl, alkenyl, aralkyl or aryl groups which may have substituents. Two of $R_{18d}$, $R_{18e}$ and $R_{18f}$ or two of $R_{18d}$, $R_{18e}$ and $R_{18g}$ may join to form a ring.

In the general formula (IV), $R_{11}$, $R_{12}$ and $R_{13}$ may be the same or different, and represent alkyl, cycloalkyl, alkenyl, aralkyl or aryl groups which may have substituents.

In the general formula (V), $R_{14}$ and $R_{15}$ may be the same or different, and represent hydrogen atoms or alkyl groups which may have substituents. $R_{16}$ represents an alkyl, cycloalkyl, aralkyl or aryl group which may have substituents. Two of $R_{14}$ to $R_{16}$ may join to form a ring.

In the general formula (VI-A), $R_{18a}$ and $R_{18b}$ may be the same or different, and represent alkyl groups which may have substituents. $R_{18c}$ represents a cycloalkyl group which may have substituents.

In the general formula (VI-B), $R_{18h}$ represents an alkyl, alkenyl, alkynyl, aralkyl or aryl group which may have substituents. Z represents an atomic group which composes a monocyclic or polycyclic alicyclic group with carbon atoms in the general formula (VI-B).

In the general formula (VI-C), $R_{18'}$ represents an alkyl, alkenyl, alkynyl, aralkyl or aryl group which may have substituents.

In the general formula (III), $R_8$ represents a hydrogen atom, a halogen atom, a cyano group, or an alkyl group which may have substituents. $R_9$ and $R_{10}$ may be the same or different, and represent hydrogen atoms, halogen atoms, cyano groups, or alkyl, cycloalkyl, alkoxy, acyl, acyloxy, alkenyl, aryl or aralkyl groups which may have substituents.

In the general formula (VII), $R_{19}$ and $R_{20}$ may be the same or different, and represent hydrogen atoms, halogen atoms, cyano groups, or alkyl groups which may have substituents. $R_{21}$ represents a hydrogen atom, a halogen atom, an alkyl group which may have substituents, or —D—CN group. D represents a single bond or a bivalent linking group.

In the general formulae (VIII) to (XVII), $R_{25}$, $R_{26}$ and $R_{27}$ may be the same or different, and represent hydrogen atoms, fluorine atoms, or alkyl, cycloalkyl or aryl groups which may have substituents. $R_{28}$, $R_{29}$ and $R_{30}$ may be the same or different, and represent alkyl, cycloalkyl or aryl groups which may have substituents. Also, $R_{25}$ and $R_{26}$, $R_{27}$ and $R_{28}$, $R_{29}$ and $R_{30}$ may join one another to form a ring. $R_{31}$, $R_{35}$, $R_{37}$, $R_{40}$ and $R_{44}$ may be the same or different, and represent hydrogen atoms, or alkyl, cycloalkyl, acyl or alkoxycarbonyl groups which may have substituents. $R_{32}$, $R_{33}$, $R_{34}$, $R_{41}$, $R_{42}$ and $R_{43}$ may be the same or different, and represent hydrogen atoms, halogen atoms, or alkyl or alkoxy groups which may have substituents. $R_{36}$ and $R_{39}$ may be the same or different, and represent hydrogen atoms, halogen atoms, cyano groups, or alkyl groups which may have substituents. $R_{38}$ represents alkyl, cycloalkyl, aralkyl or aryl groups which may have substituents. $B_1$ and $B_2$ represent single bonds or bivalent linking groups. $B_3$ represents a bivalent linking group, and n represents 0 or 1.

Details of the above respective groups are as follows.

Alkyl groups can include linear and branched alkyl groups, for example, alkyl groups of 1 to 8 carbons, and can specifically include preferably methyl, ethyl, propyl, n-butyl, sec-butyl, hexyl, 2-ethylhexyl and octyl groups.

Cycloalkyl groups may be monocyclic or polycyclic types. Monocyclic types can include those of 3 to 8 carbons, and for example, preferably cyclopropyl, cyclopentyl, cyclohexyl, cycloheptyl, and cyclooctyl groups. Polycyclic types can include those of 6 to 20 carbons, and for example, preferably adamanthyl, norbornyl, isobornyl, camphanyl, zincropentyl, α-pinel, tricyclodecanyl, tetracyclododecyl, androstanyl groups and the like. Cycloalkyl groups include those where a part of carbon atoms composing the ring is substituted with heteroatoms such as oxygen, sulfur and nitrogen atoms.

Aryl groups are, for example, aryl groups of 6 to 15 carbons, and can specifically include preferably phenyl, tolyl, dimethylphenyl, 2,4,6-trimethylphenyl, naphthyl, anthryl, 9,10-dimethoxyanthryl groups and the like.

Aralkyl groups are, for example, aralkyl groups of 7 to 12 carbons, and can specifically include preferably benzyl, phenetyl, naphthylmethyl groups and the like.

Alkenyl groups are, for example, alkenyl groups of 2 to 8 carbons, and can specifically include preferably vinyl, allyl, butenyl, and cyclohexenyl groups.

Alkoxy groups are, for example, alkoxy groups of 1 to 8 carbons, and can specifically include preferably methoxy, ethoxy, n-propoxy, iso-propoxy, butoxy, pentoxy, allyloxy, octoxy groups and the like.

Acyl groups are, for example, acyl groups of 1 to 10 carbons, and can specifically include preferably formyl, acetyl, propanoyl, butanoyl, pivaloyl, octanoyl, benzoyl groups and the like.

Acyloxy groups are preferably acyloxy groups of 2 to 12 carbons, and include, for example, acetoxy, propionyloxy, benzoyloxy groups and the like.

Alkynyl groups are preferably alkynyl groups of 2 to 5 carbons, and can include, for example, ethynyl, propinyl, butynyl and the like.

Alkoxycarbonyl groups include tertiary alkoxycarbonyl groups such as t-butoxycarbonyl, t-amyloxycarbonyl and 1-methyl-1-cyclohexyloxycarbonyl groups.

Halogen atoms can include fluorine, chlorine, bromine and iodine atoms and the like.

The bivalent linking groups represent bivalent alkylene, cycloalkylene, alkenylene or arylene groups which may have substituents, or $-O-CO-R_{22a}-$, $-CO-O-R_{22b}-$ or $-CO-N(R_{22c})-R_{22d}-$. $R_{22a}$, $R_{22b}$ and $R_{22d}$ may be the same or different, and represent bivalent alkylene, cycloalkylene, alkenylene or arylene groups which may have single bonds, or ether, ester, amide, urethane or ureide groups. $R_{22c}$ represents a hydrogen atom, or an alkyl, cycloalkyl, aralkyl or aryl group which may have substituents.

Alkylene groups can include linear or branched alkylene groups, and include, for example, those of 1 to 8 carbons such as methylene, ethylene, propylene, butylene, hexylene and octylene groups.

Cycloalkylene groups include those of 5 to 8 carbons such as cyclopentylene and cyclohexylene.

Alkenylene groups include those of 2 to 6 carbons such as ethenylene, propenylene and butenylene which may preferably have substituents.

Arylene groups include those of 6 to 15 carbons such as phenylene, trylene and naphthylene groups which may preferably have substituents.

The ring which two of $R_{18d}$ to $R_{18f}$, two of $R_{18d}$, $R_{18e}$ and $R_{18g}$, two of $R_{14}$ to $R_{16}$, $R_{25}$ and $R_{26}$, $R_{27}$ and $R_{28}$, or $R_{29}$ and $R_{30}$ join one another to form is, for example, a 3 to 8-membered ring, and specifically includes cyclopropane, cyclopentane, cyclohexane, tetramethyleneoxide, pentamethyleneoxide, hexamethyleneoxide, furan, pyran, dioxonol, 1,3-dioxoran rings and the like.

Z represents an atomic group which composes a monocyclic or polycyclic alicyclic group with carbon atoms in the general formula (VI-B). Monocyclic alicyclic groups are preferably those of 3 to 8 carbons, and can include for example, cyclopropyl, cyclopentyl, cyclohexyl, cycloheptyl, and cyclooctyl groups. Polycyclic alicyclic groups are preferably those of 6 to 20 carbons, and can include for example, adamanthyl, norbornyl, isobornyl, camphanyl, zincropentyl, α-pinel, tricyclodecanyl, tetracyclododecyl, androstanyl groups and the like.

The above alkyl, cycloalkyl, alkoxy, acyl, acyloxy, alkynyl, alkenyl, aryl, aralkyl, alkoxycarbonyl, alkylene, cycloalkylene, alkenylene, arylene groups and the like may have substituents.

The substituents substituted in these groups include those having active hydrogen such as amino, amide, ureido, urethane, hydroxyl and carboxyl groups, halogen atoms (fluorine, chlorine, bromine and iodine atoms), alkoxy groups (methoxy, ethoxy, propoxy and butoxy groups etc.), thioether groups, acyl groups (acetyl, propanoyl and benzoyl groups, etc.), acyloxy groups (acetoxy, propanoyloxy and benzoyloxy groups, etc.), alkoxycarbonyl groups (methoxycarbonyl, ethoxycarbonyl, propoxycarbonyl groups, etc.), alkyl groups (methyl, ethyl, propyl, and butyl groups), cycloalkyl groups (cyclohexyl group), aryl groups (phenyl group), cyano group, nitro group, and the like.

In the invention, it is preferable that at least one of $R_1$ of the general formula (I), $R_5$ of the general formula (II) and $R_{17}$ of the general formula (VI) is a trifluoromethyl group.

The groups contained in the resin (A) of the invention, which decomposes by the acid action to exhibit alkali solubility include for example, —O—C($R_{18d}$)($R_{18e}$)($R_{18f}$), —O—C($R_{18d}$)($R_{18e}$)(O$R_{18g}$), —O—COO—C($R_{18d}$)($R_{18e}$)($R_{18f}$), —O—C($R_{01}$)($R_{02}$) COO—C($R_{18d}$)($R_{18e}$)($R_{18f}$), —COO—C($R_{18d}$)($R_{18e}$)($R_{18f}$), —Coo—C($R_{18d}$)($R_{18e}$)(O$R_{18g}$), and the like. $R_{18d}$ to $R_{18g}$ are the same as defined above except for hydrogen atoms. $R_{01}$ and $R_{02}$ represent hydrogen atoms, or alkyl, cycloalkyl, alkenyl, aralkyl or aryl which may have substituents shown above.

Preferable specific examples preferably include ether or ester groups of tertiary alkyl groups such as t-butyl, t-amyl, 1-alkyl-1-cyclohexyl, 2-alkyl-2-adamantyl, 2-adamanthyl-2-propyl and 2-(4-methylcyclohexyl)-2-propyl groups, acetal or acetal ester group such as 1-alkoxy-1-ethoxy and tetrahydropyranyl groups, t-alkyl carbonate group, t-alkylcarbonylmethoxy group and the like. More preferable are acetal groups such as 1-alkoxy-1-ethoxy groups and tetrahydropyranyl group.

In the case of acetal group, acid degradability is great and the range of selection of acid generating compounds combined is expanded. Thus, it is effective in terms of sensitivity improvement and performance variation in an elapsed time till heating after the exposure. Particularly preferable are the acetal groups containing an alkoxy group derived from the above perfluoroalkyl group as 1-alkoxy component of the acetal group. In this case, transmissibility at the exposure light with short wavelength (e.g., 157 nm of $F_2$ excimer laser light) can be further enhanced.

A content of the repeat unit (A1) having the group represented by the general formula (Z) is used in the range of generally from 5 to 80%, preferably from 7 to 70%, and more preferably from 10 to 65% by mole in the resin (A).

The content of the repeat unit (A2) having the group which decomposes by the acid action to become the alkali soluble group is used in the range of generally from 1 to 70%, preferably from 1 to 65%, and more preferably from 5 to 60% by mole in the resin (A)

The content of the repeat unit represented by the general formula (I) is used in the range of generally from 5 to 80%, preferably from 7 to 75%, and more preferably from 10 to 70% by mole in the resin (A).

The content of the repeat unit represented by the general formula (II) is used in the range of generally from 5 to 80%, preferably from 7 to 70%, and more preferably from 10 to 65% by mole in the resin (A).

The content of the repeat unit represented by the general formula (VI) is used in the range of from generally 1 to 70%, preferably from 1 to 65%, and more preferably from 5 to 60% by mole in the resin (A).

The content of the repeat unit represented by the general formula (III) is used in the range of generally from 1 to 40%, preferably from 3 to 35%, and more preferably from 5 to 30% by mole in the resin (A).

The content of the repeat unit represented by the general formula (VII) is used in the range of generally from 1 to 40%, preferably from 3 to 35%, and more preferably from 5 to 30% by mole in the resin (A).

The content of the repeat unit represented by the general formulae (VIII) to (X) is used in the range of generally from 1 to 40%, preferably from 3 to 35%, and more preferably from 5 to 30% by mole in the resin (A).

The content of the repeat unit represented by the general formulae (XI) to (XIII) is used in the range of generally from 1 to 40%, preferably from 3 to 35%, and more preferably from 5 to 30% by mole in the resin (A).

The content of the repeat unit represented by the general formula (XIV) is used in the range of generally from 1 to 40%, preferably from 3 to 35%, and more preferably from 5 to 30% by mole in the resin (A).

The content of the repeat unit represented by the general formula (XV) is used in the range of generally from 1 to 40%, preferably from 3 to 35%, and more preferably from 5 to 30% by mole in the resin (A).

The content of the repeat unit represented by the general formula (XVI) is used in the range of generally from 1 to 40%, preferably from 3 to 35%, and more preferably from 5 to 30% by mole in the resin (A).

The content of the repeat unit represented by the general formula (XVII) is used in the range of generally from 1 to 40%, preferably from 3 to 35%, and more preferably from 5 to 30% by mole in the resin (A).

The resin (A) of the invention may copolymerize the other polymerizable monomers in addition to the above repeat structure units for the purpose of further enhancing the performance of the photosensitive resin of the invention.

Those shown below are included as copolymerizable monomers. For example, they are compounds having one addition polymerizable unsaturated bond, selected from acrylate esters, acrylamides, methacrylate esters, methacrylamides, allyl compounds, vinyl ethers, vinyl esters, styrenes, crotonate esters and the like.

Specific examples of the repeat structure units represented by the general formula (I) are shown below, but the invention is not limited thereto.
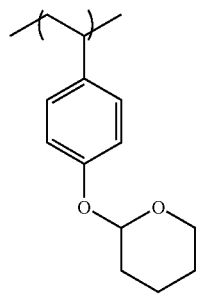
(A-1)
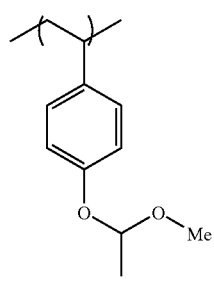
(A-2)
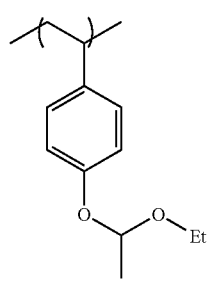
(A-3)
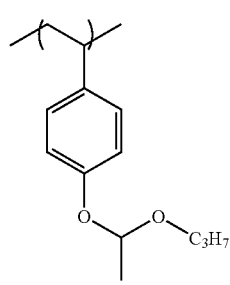
(A-4)
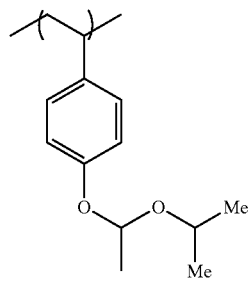
(A-5)
-continued
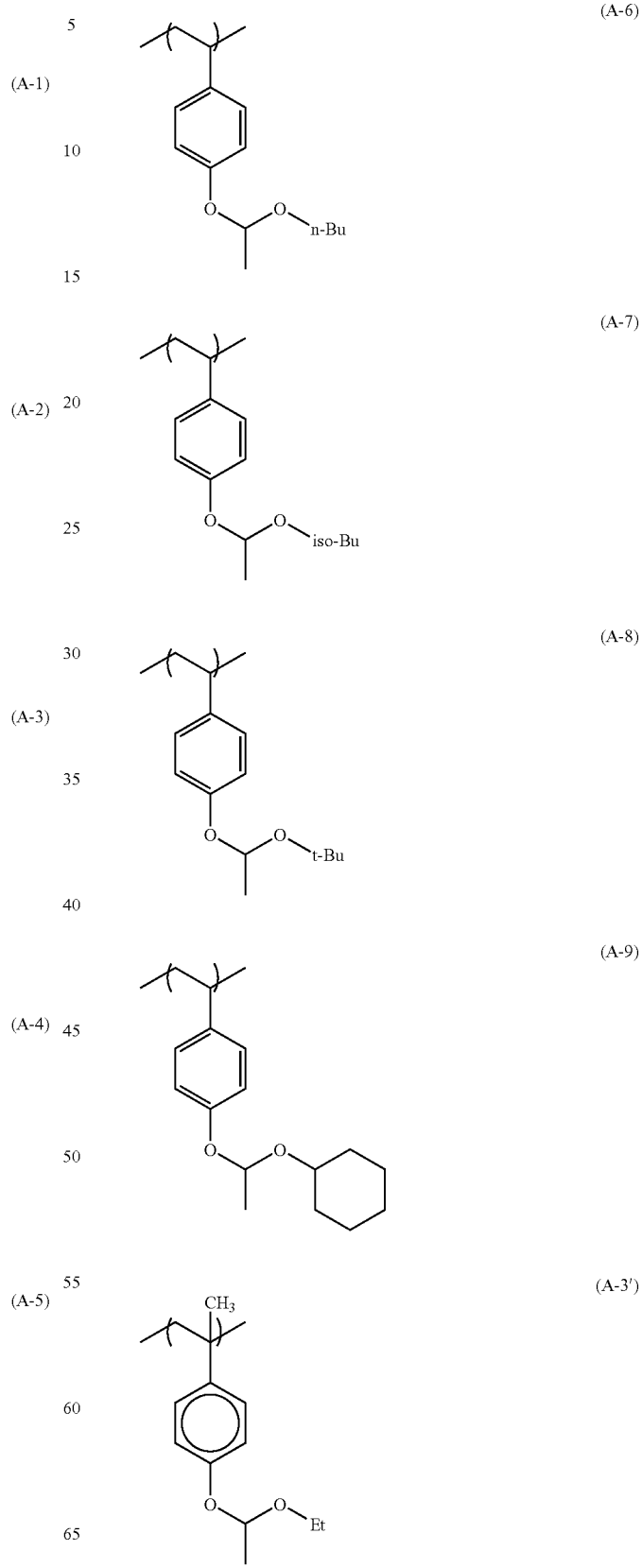

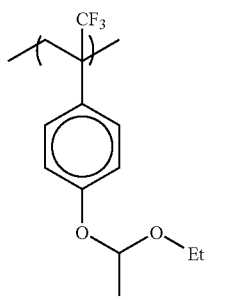 (A-3″)
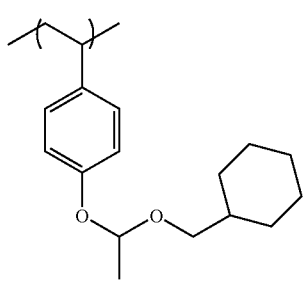 (A-10)
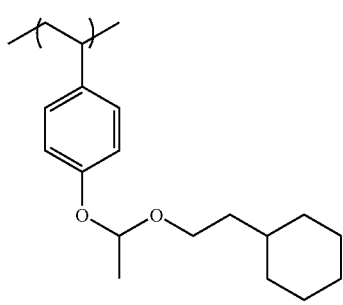 (A-11)
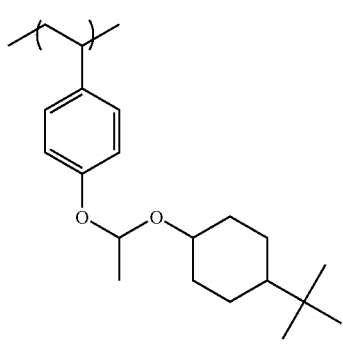 (A-12)
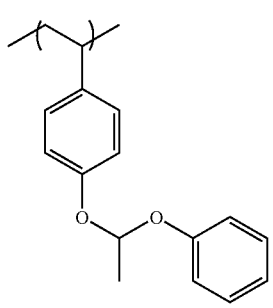 (A-13)
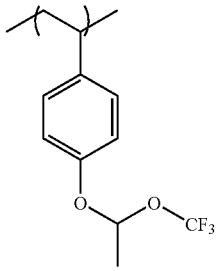 (A-14)
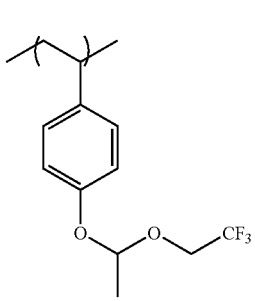 (A-15)
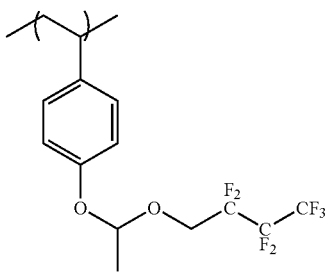 (A-16)
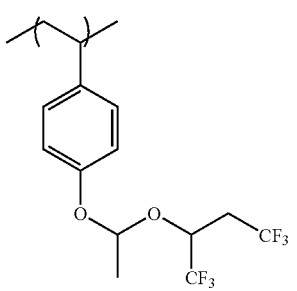 (A-17)
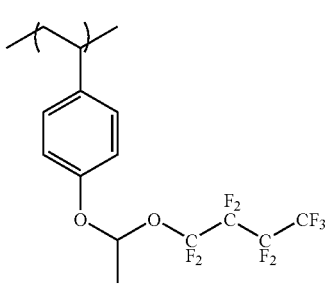 (A-18)

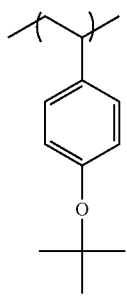
(A-19)
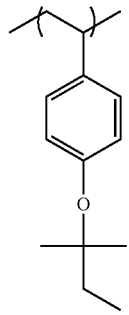
(A-25)
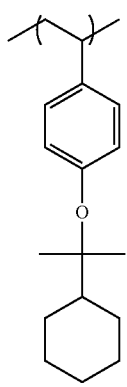
(A-20)
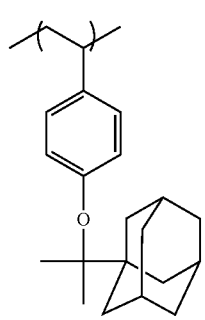
(A-26)
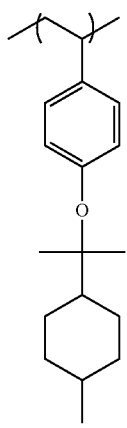
(A-20')
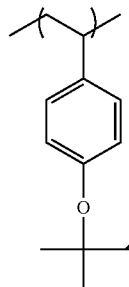
(A-27)
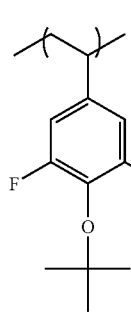
(A-28)
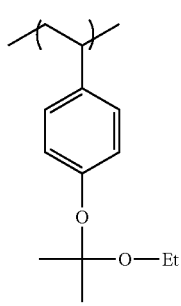
(A-24)
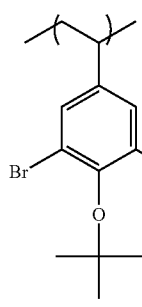
(A-29)

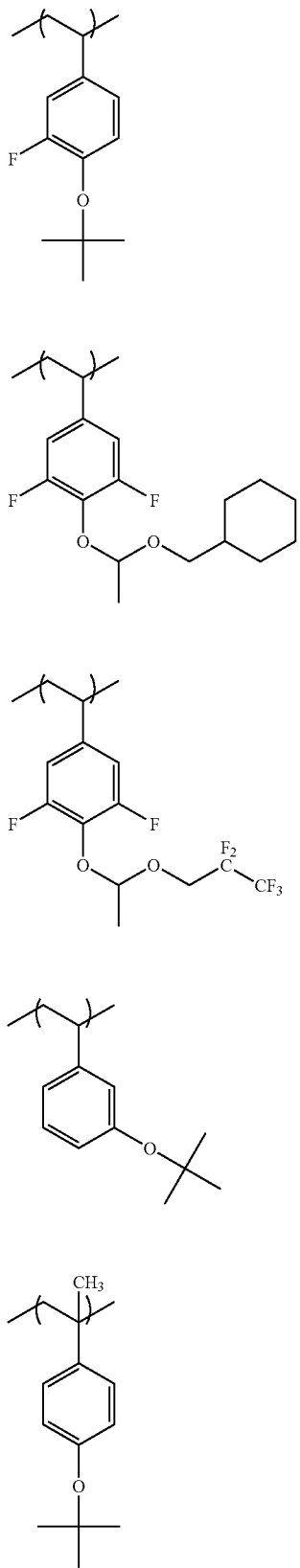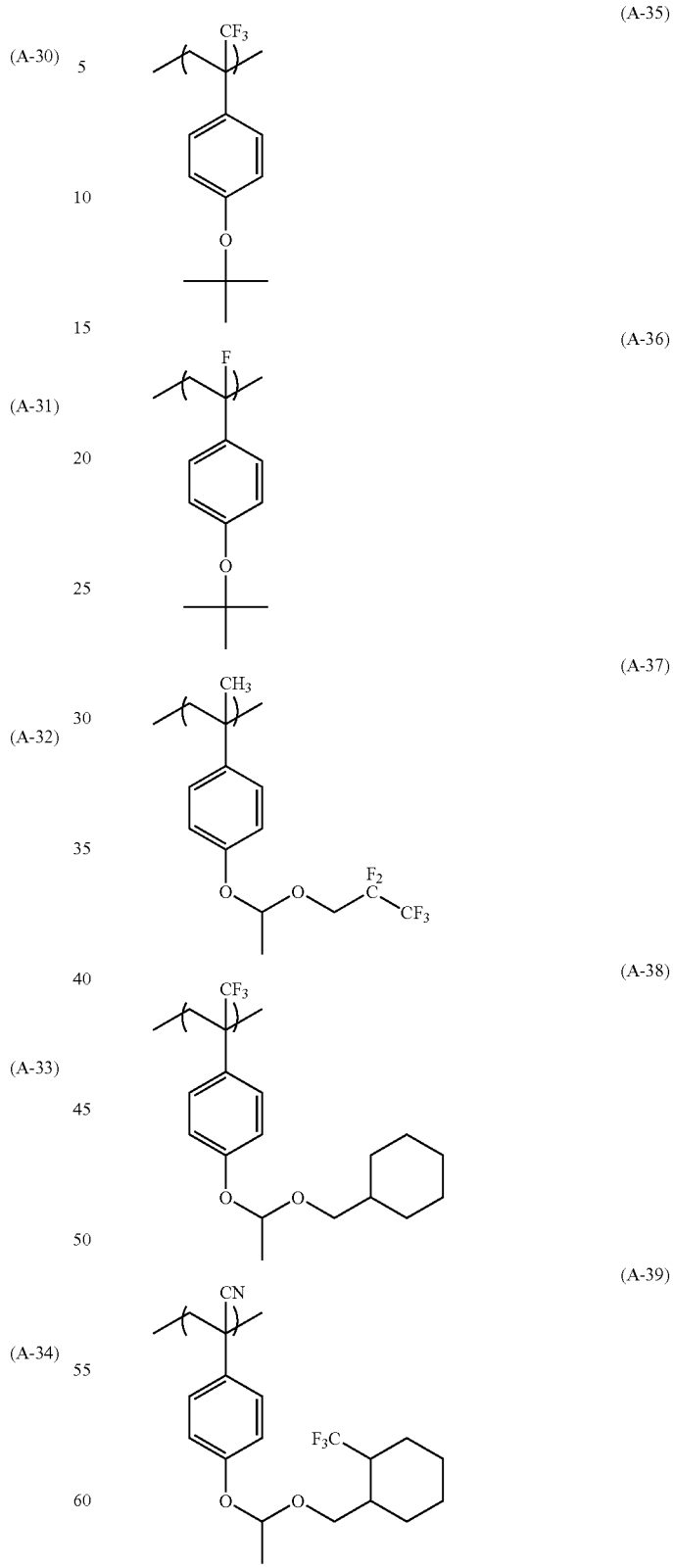
Specific examples of the repeat structure units represented by the general formula (II) are shown below, but the invention is not limited thereto.

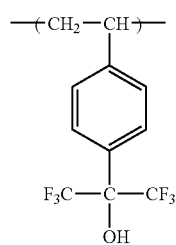
(II-1)
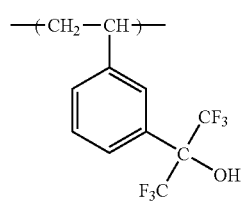
(II-2)
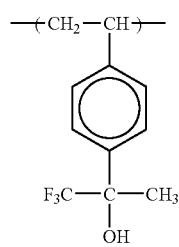
(II-1')
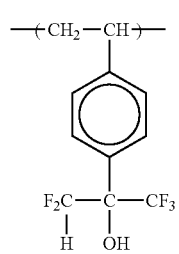
(II-1")
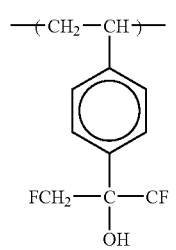
(II-1''')
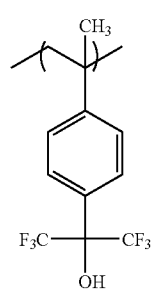
(II-3)
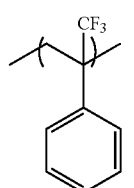
(II-3')
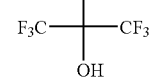
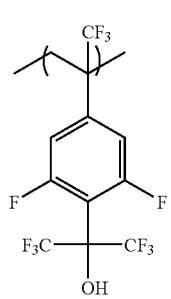
(II-4)
Specific examples of the repeat structure units represented by the general formula (III) are shown below, but the invention is not limited thereto.
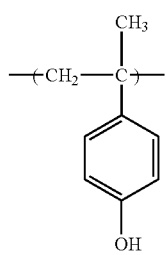
(C-1)
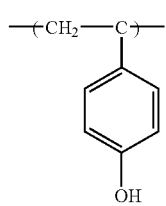
(C-2)
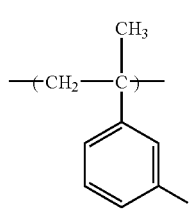
(C-3)
Specific examples of the repeat structure units represented by the general formula (VII) are shown below, but the invention is not limited thereto.

Specific examples of the repeat structure units represented by the general formulae (VIII) to (XIII) are shown below, but the invention is not limited thereto.

-continued
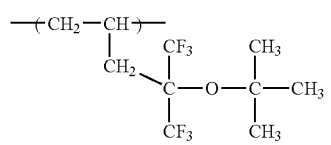 (F-14)
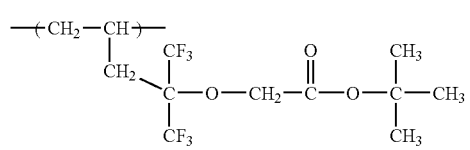 (F-15)
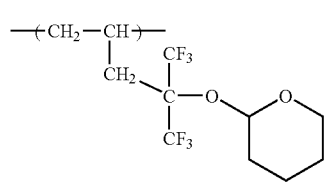 (F-16)
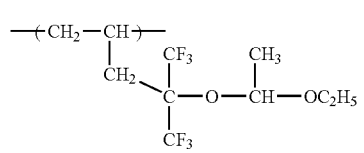 (F-17)
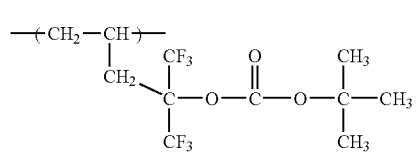 (F-18)
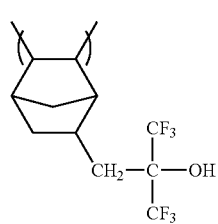 (F-19)
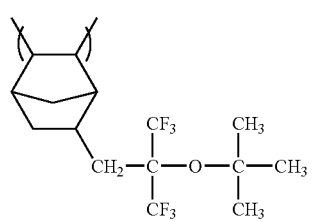 (F-20)
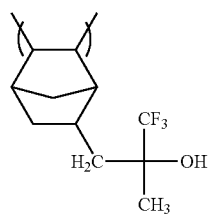 (F-20′)
-continued
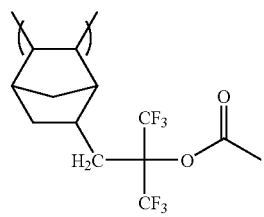 (F-20″)
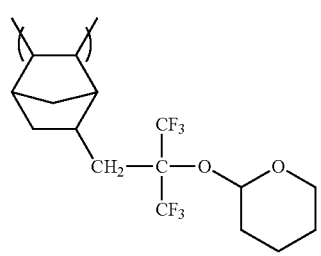 (F-21)
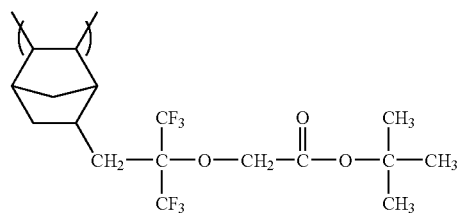 (F-22)
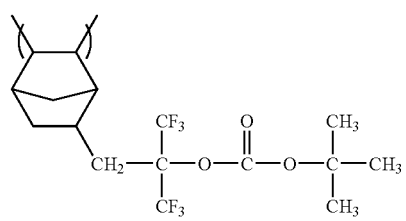 (F-23)
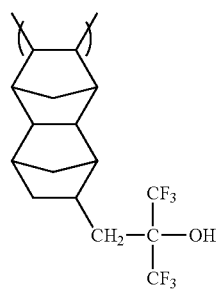 (F-24)
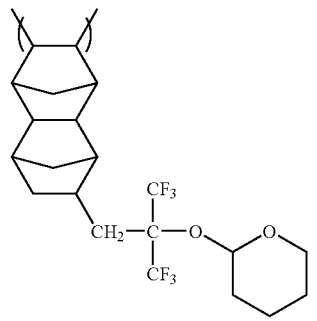 (F-25)

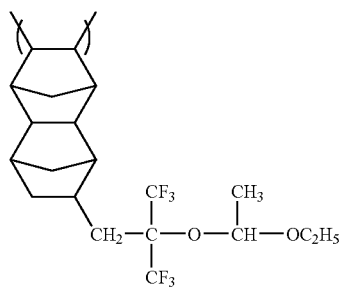 (F-26)
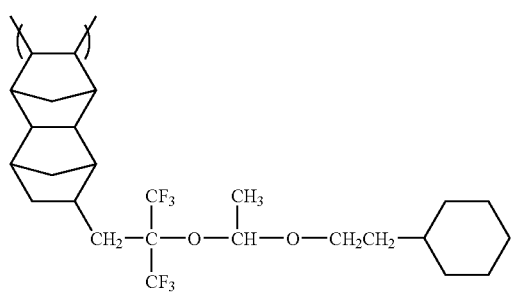 (F-27)
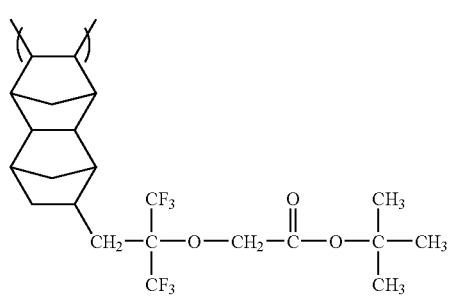 (F-28)
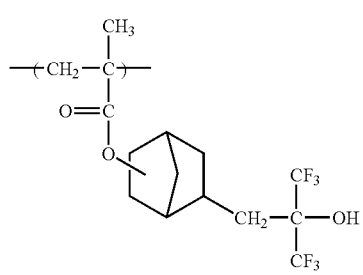 (F-29)
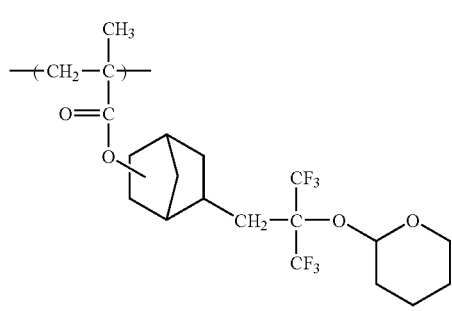 (F-30)
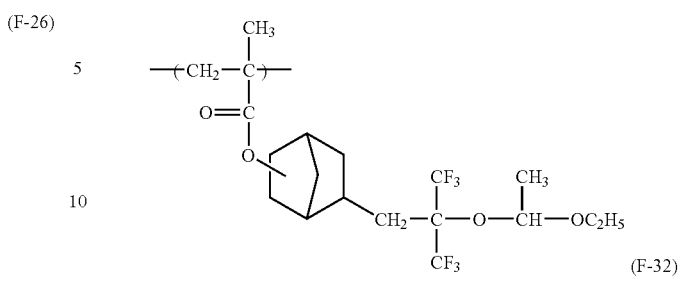 (F-31)
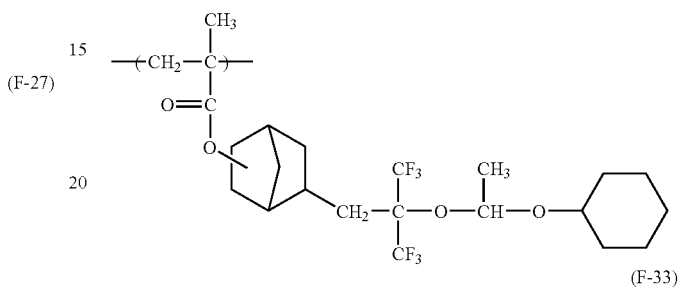 (F-32)
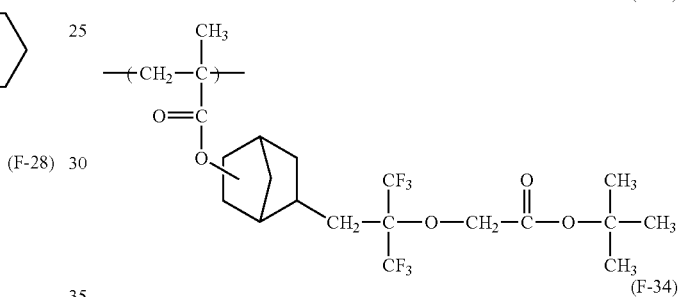 (F-33)
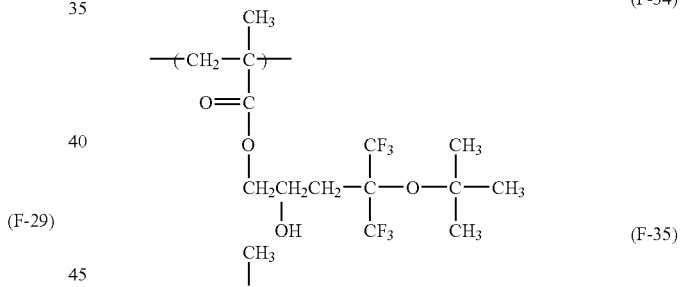 (F-34)
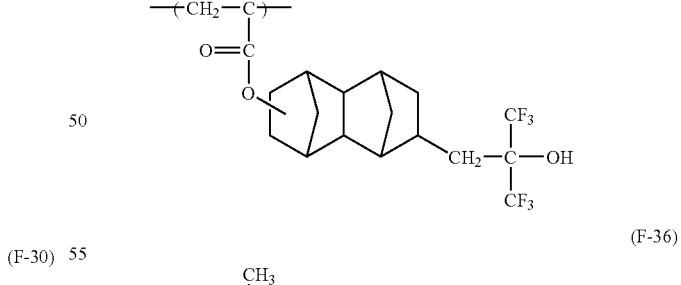 (F-35)
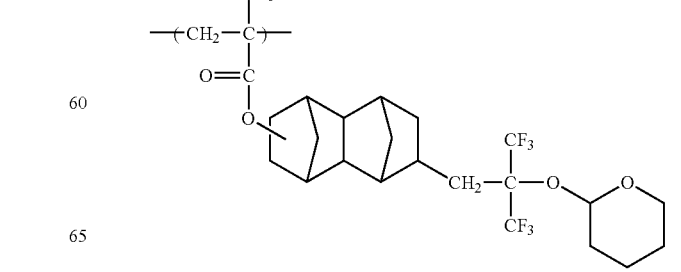 (F-36)

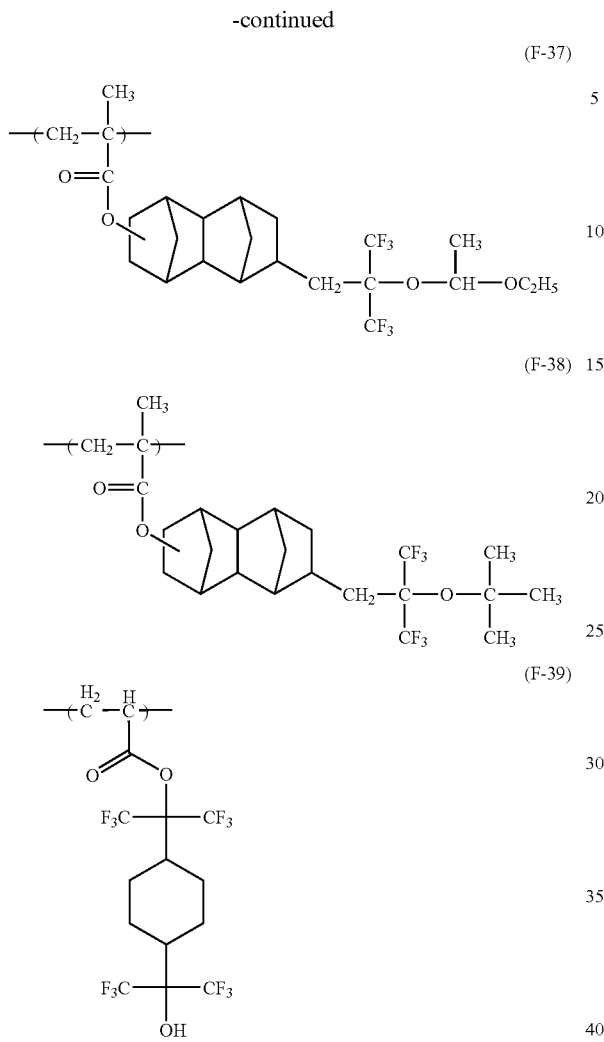
Specific examples of the repeat structure units represented by the general formulae (VI) and (XVII) are shown below, but the invention is not limited thereto.
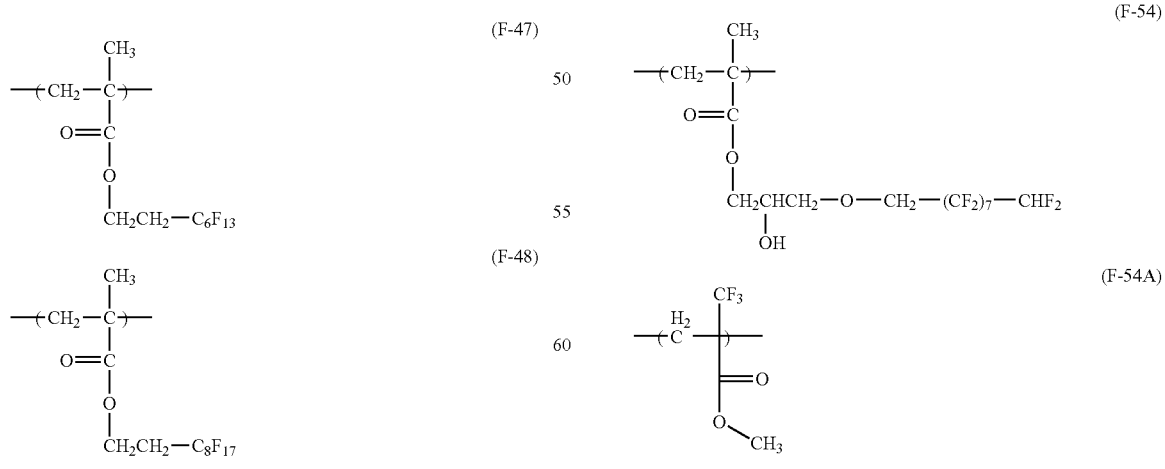

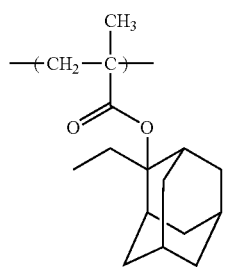
(F-54B)
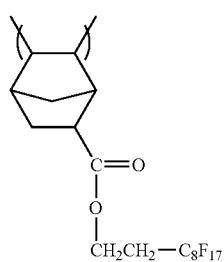
(F-55)
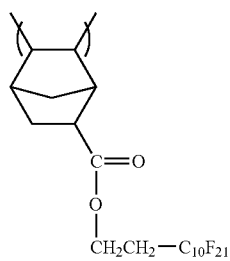
(F-56)
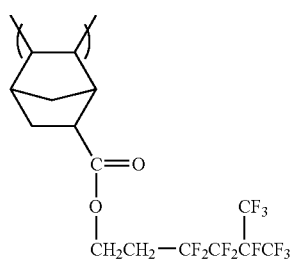
(F-57)
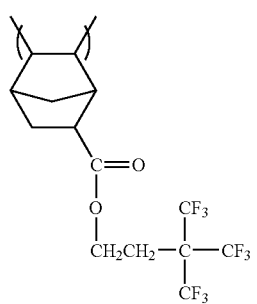
(F-58)
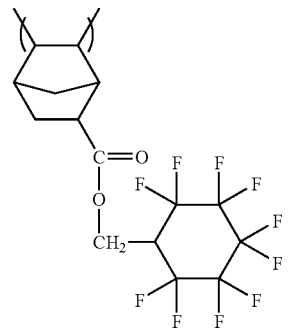
(F-59)
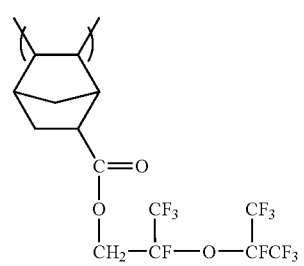
(F-60)
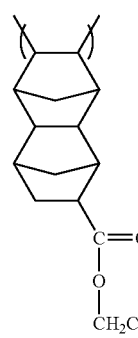
(F-61)
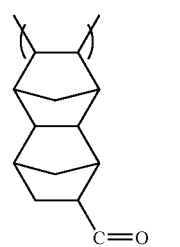
(F-62)
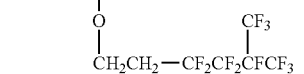
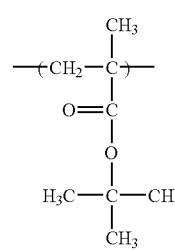
(B-1)

-continued
(B-2) 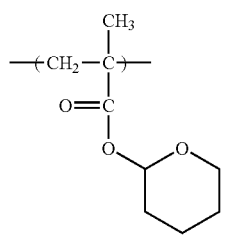
(B-3) 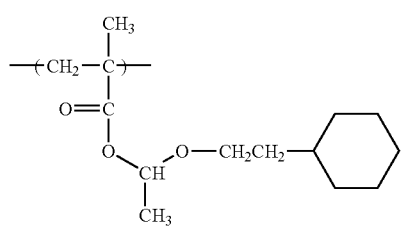
(B-4) 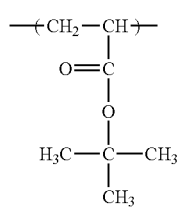
(B-5) 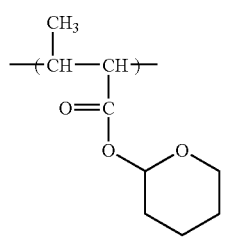
(B-6) 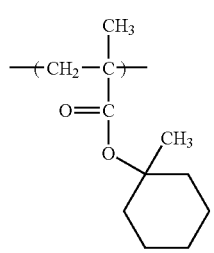
(B-7) 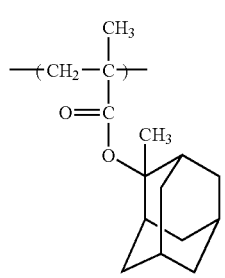
-continued
(B-8) 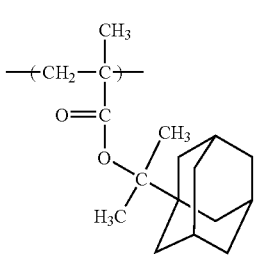
(B-9) 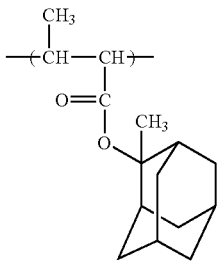
(B-10) 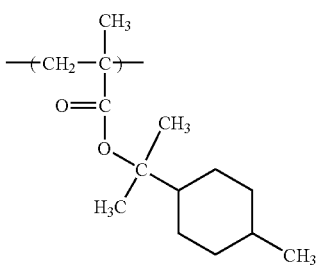
(B-11) 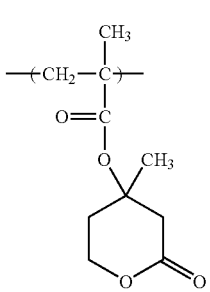
(B-12) 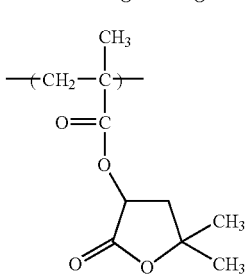
(B-13) 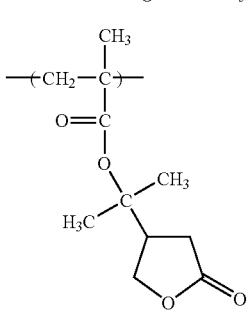

(B-14) 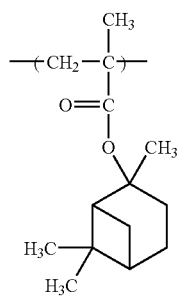
(B-15) 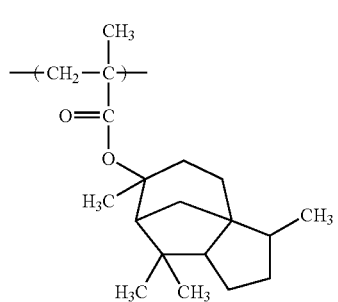
(B-16) 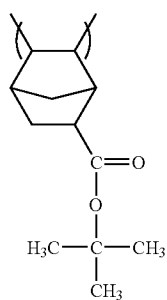
(B-17) 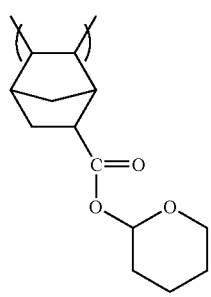
(B-18) 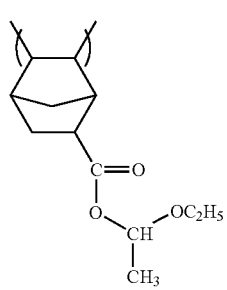
(B-19) 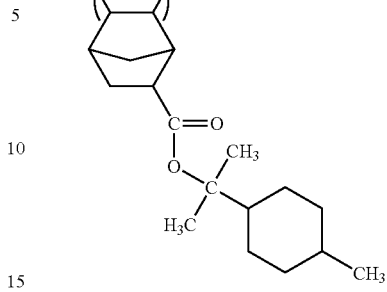
(B-20) 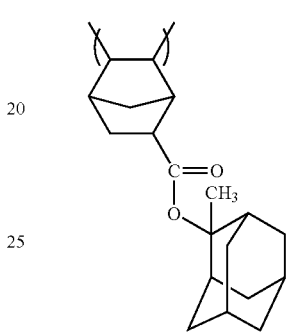
(B-21) 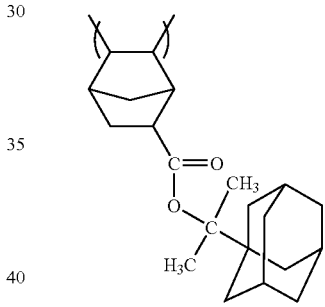
(B-22) 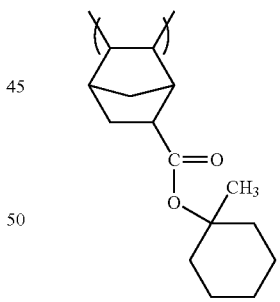
(B-23) 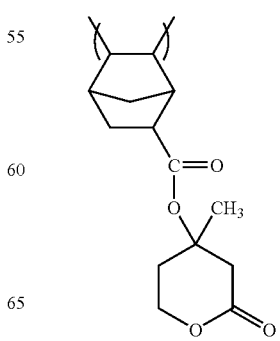

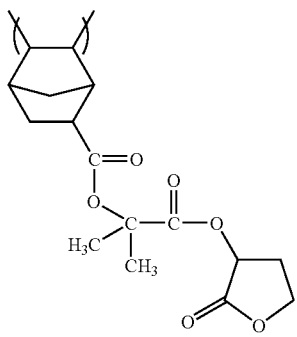
(B-24)
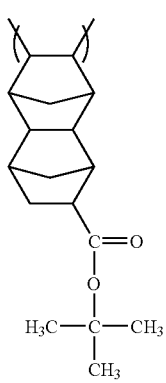
(B-25)
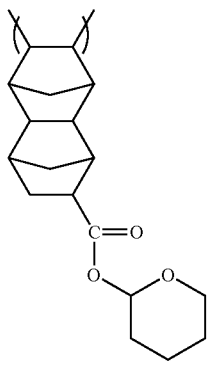
(B-26)
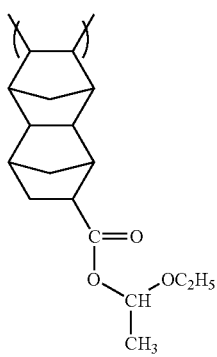
(B-27)
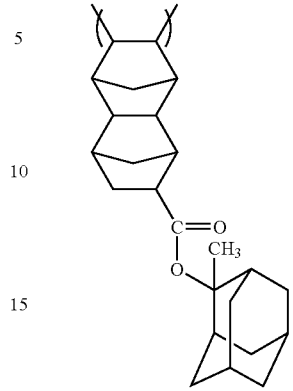
(B-28)
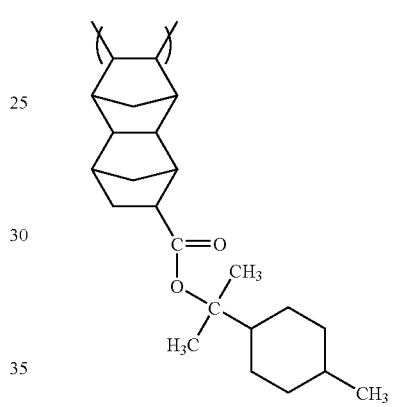
(B-29)
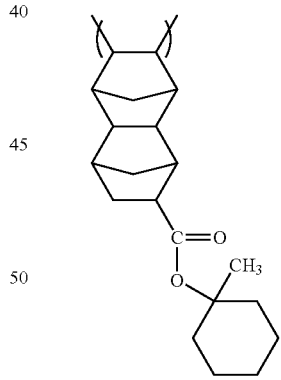
(B-30)
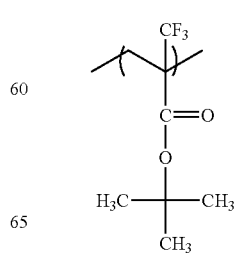
(B-1')

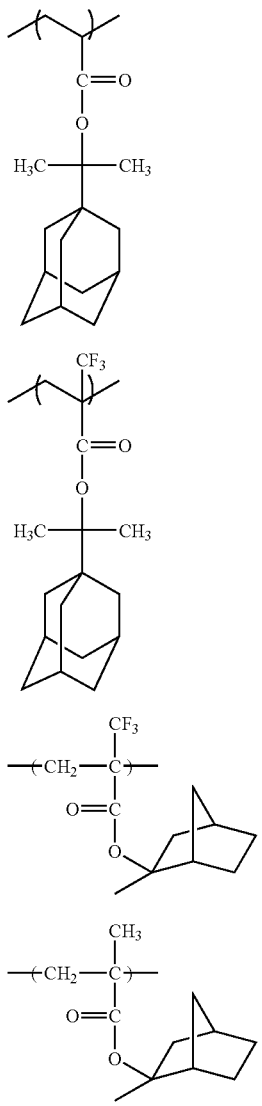

Specific examples of the repeat structure units represented by the general formula (XV) can include, for example, the repeat structure units formed by said vinyl ethers.

[Resin (A) of a Second Embodiment]

The resin (A) of the second embodiment of the invention is not limited as long as it is the resin containing the repeat unit (A1) having the group represented by the general formula (Y), and decomposing by the acid action to increase solubility for alkali developing solutions. However, it is preferable to further contain the repeat unit (A2) having the group which decomposes by the acid action described in detail below to become the alkali soluble group.

The repeat units (A1) having the group represented by the general formula (Y) are preferably the repeat units represented by the above general formulae (1') and (2').

$Q_1$ in the formula (1') represents an alicyclic hydrocarbon group. $L_1$ and $L_2$ in the formulae (1') and (2') represents linking groups, and Y represents the group represented by the above general formula (Y).

$Q_1$, $L_1$, $L_2$, $R_{x1}$ and $R_{y1}$ in the general formulae (1') and (2') are the same as defined for those in the general formulae (1) and (2), respectively.

In the formulae (1') and (2'), preferred is norbornene as $Q_1$, an alkylene group as $L_1$, and arylene group, ester group (—CO—O—), alkylene group, cycloalkylene group or the combination thereof as $L_2$. $R_{x1}$ is preferably a hydrogen atom, and $R_{y1}$ is preferably a hydrogen atom, methyl or trifluoromethyl group.

The repeat unit (A2) capable of being contained in the resin (A) of the invention, having the group which decomposes by the action of the acid to become the alkali soluble group is preferably the repeat units represented by the above formulae (3) and (4).

Preferred is norbornene as $Q_1$, an alkylene group, —O— or the combination thereof as $L_3$, and a single bond as $L_4$. $R_{x2}$ is preferably a hydrogen atom, and $R_{y2}$ is preferably a hydrogen atom, methyl or trifluoromethyl group.

In order to decompose the resin (A) of the invention by the acid action to increase solubility for alkali developing solutions, the resin (A) typically contains the group which decomposes by the acid action to exhibit alkali solubility (acid degradable group). Acid degradable groups (corresponding to the above V when the resin (A) contains the above formulae (3) and (4)) include, for example, —O—C($R_{18d}$)($R_{18e}$)($R_{18f}$), —O—C($R_{18d}$)($R_{18e}$)(O$R_{18g}$), —O—COO—C($R_{18d}$)($R_{18e}$)($R_{18f}$), —O—C($R_{O1}$)($R_{O2}$)COO—C($R_{18d}$)($R_{18e}$)($R_{18f}$), —COO—C($R_{18d}$)($R_{18e}$)($R_{18f}$), —COO—C($R_{18d}$)($R_{18e}$)(O$R_{18g}$), and the like. $R_{18d}$ to $R_{18g}$ may be the same or different, and represent alkyl, cycloalkyl, alkenyl, aralkyl or aryl groups which may have substituents. Two of $R_{18d}$, $R_{18e}$ and $R_{18f}$ or two of $R_{18d}$, $R_{18e}$ and $R_{18g}$ may join to form a ring.

$R_{O1}$ and $R_{O2}$ represent hydrogen atoms, or alkyl, cycloalkyl, alkenyl, aralkyl or aryl which may have substituents shown above.

Preferable specific examples preferably include ether or ester groups of tertiary alkyl groups such as t-butyl, t-amyl, 1-alkyl-1-cyclohexyl, 2-alkyl-2-adamantyl, 2-adamanthyl-2-propyl and 2-(4-methylcyclohexyl)-2-propyl groups, acetal or acetal ester groups such as 1-alkoxy-1-ethoxy and tetrahydropyranyl groups, t-alkyl carbonate groups, t-alkylcarbonylmethoxy groups and the like. More preferable are acetal groups such as 1-alkoxy-1-ethoxy groups and tetrahydropyranyl group.

In the case of acetal group, acid degradability is great and the range of selection of acid generating compounds combined is expanded. Thus, it is effective in terms of sensitivity improvement and performance variation in an elapsed time till heating after the exposure. Particularly preferable are the acetal groups containing an alkoxy group derived from the above perfluoroalkyl group as 1-alkoxy component of the acetal group. In this case, transmissibility at the exposure light with a short wavelength (e.g., 157 nm of $F_2$ excimer laser light) can be further enhanced.

Specific examples of the repeat unit (A1) can include specific examples of the repeat unit represented by the general formula (II) described below, F-20' exemplified as the repeat unit represented by the general formula (XII) described above, and the like.

Specific examples of the repeat unit (A2) can include (A-1) to (A-39) exemplified as the repeat unit of the general formula (I) described above, (F-14) to (F-16) and (F-18) exemplified as the repeat unit of the general formula (XI), (F-20), (F-21) to (F-23), (F-25) and (F-28) exemplified as the repeat unit of the general formula (XII), (F-30), (F-33), (F-34) and (F-38) exemplified as the repeat unit of the general formula (XIII), and (B-1) to (B-30).

It is preferable that the resin (A) of the invention is the resin having each at least one repeat unit represented by the above respective general formulae (II) and (II'), which decomposes by the acid action to increase solubility for alkali developing solutions, and it is preferable that it is the resin further having each at least one repeat unit represented by the above respective general formulae (I), (II) and (II').

The resin (A) in the invention may have at least one of repeat units represented by the above general formulae (III) and (VII) to (XVII).

In the general formulae (I), (II) and (II'), $R_2$, $R_3$, $R_6$ and $R_7$ may be the same or different, and represent hydrogen atoms, halogen atoms, cyano groups, hydroxyl groups, or alkyl, cycloalkyl, alkoxy, acyl, acyloxy, alkenyl, aryl or aralkyl groups which may have substituents.

$R_4$ represents a group of the above general formula (IV) or (V).

$R_5$ may be the same or different, and represents a hydrogen atom, a halogen atom, a cyano group, or an alkyl group which may have substituents.

$R_{50}$ to $R_{55}$ may be the same or different, and represent hydrogen atoms, fluorine atoms, or alkyl groups which may have substituents. But, at least one in $R_{50}$ to $R_{55}$ represents a fluorine atom or an alkyl group wherein at least one hydrogen atom is substituted with a fluorine atom.

$R_{60}$ to $R_{62}$ may be the same or different, and represent alkyl, cycloalkyl, alkenyl, aralkyl or aryl groups which may have substituents.

In the general formula (IV), $R_{11}$, $R_{12}$ and $R_{13}$ may be the same or different, and represent alkyl, cycloalkyl, alkenyl, aralkyl or aryl groups which may have substituents.

In the general formula (V), $R_{14}$ and $R_{15}$ may be the same or different, and represent hydrogen atoms or alkyl groups which may have substituents. $R_{16}$ represents alkyl, cycloalkyl, aralkyl or aryl groups which may have substituents. Two of $R_{14}$ to $R_{16}$ may join to form a ring.

In the general formula (III), $R_8$ represents a hydrogen atom, a halogen atom a cyano group, or an alkyl group which may have substituents. $R_9$ and $R_{10}$ may be the same or different, and represent hydrogen atoms, halogen atoms, cyano groups, or alkyl, cycloalkyl, alkoxy, acyl, acyloxy, alkenyl, aryl or aralkyl groups which may have substituents.

In the general formula (VII), $R_{19}$ and $R_{20}$ may be the same or different, and represent hydrogen atoms, halogen atoms, cyano groups, or alkyl groups which may have substituents. $R_{21}$ represents a hydrogen atom, a halogen atom, an alkyl group which may have substituents, or —D—CN group. D represents a single bond or a bivalent linking group.

In the general formulae (VIII) to (XVII), $R_{25}$, $R_{26}$ and $R_{27}$ may be the same or different, and represent hydrogen atoms, fluorine atoms, or alkyl, cycloalkyl or aryl groups which may have substituents. $R_{28}$, $R_{29}$ and $R_{30}$ may be the same or different, and represent alkyl, cycloalkyl or aryl groups which may have substituents. Also, $R_{25}$ and $R_{26}$, $R_{27}$ and $R_{28}$, $R_{29}$ and $R_{30}$ may join one another to form a ring. $R_{31}$, $R_{35}$, $R_{37}$, $R_{40}$ and $R_{44}$ may be the same or different, and represent hydrogen atoms, or alkyl, cycloalkyl, acyl or alkoxycarbonyl groups which may have substituents. $R_{32}$, $R_{33}$, $R_{34}$, $R_{41}$, $R_{42}$ and $R_{43}$ may be the same or different, and represent hydrogen atoms, halogen atoms, or alkyl or alkoxy groups which may have substituents. $R_{36}$ and $R_{39}$ may be the same or different, and represent hydrogen atoms, halogen atoms, cyano groups, or alkyl groups which may have substituent. $R_{38}$ represents an alkyl, cycloalkyl, aralkyl or aryl groups which may have substituents. $B_1$ and $B_2$ represent single bonds or bivalent linking groups. $B_3$ represents a bivalent linking group, and n represents 0 or 1.

The details of the above respective groups (alkyl, cycloalkyl, aryl, aralkyl, alkenyl, alkoxy, acyl, acyloxy, alkoxycarbonyl, halogen atoms, bivalent linking group) are as described above.

The ring which two of $R_{14}$ to $R_{16}$, $R_{25}$ and $R_{26}$, $R_{27}$ and $R_{28}$, or $R_{29}$ and $R_{30}$ join one another to form is, for example, a 3 to 8-membered ring, and specifically includes cyclopropane, cyclopentane, cyclohexane, tetramethyleneoxide, pentamethyleneoxide, hexamethyleneoxide, furan, pyran, dioxonol, 1,3-dioxoran rings and the like.

The above alkyl, cycloalkyl, alkoxy, acyl, acyloxy, alkynyl, alkenyl, aryl, aralkyl, alkoxycarbonyl, alkylene, cycloalkylene, alkenylene, arylene groups and the like may have substituents.

The substituents substituted in these groups include those having active hydrogen such as amino, amido, ureido, urethane, hydroxyl and carboxyl groups, halogen atoms (fluorine, chlorine, bromine and iodine atoms), alkoxy groups (methoxy, ethoxy, propoxy and butoxy groups etc.), thioether groups, acyl groups (acetyl, propanoyl and benzoyl groups, etc.), acyloxy groups (acetoxy, propanoyloxy and benzoyloxy groups, etc.), alkoxycarbonyl groups (methoxycarbonyl, ethoxycarbonyl, propoxycarbonyl groups, etc.), alkyl groups (methyl, ethyl, propyl, and butyl groups), cycloalkyl groups (cyclohexyl group), aryl groups (phenyl group), cyano group, nitro group, and the like.

In the invention, it is preferred that at least one of $R_5$ in the above general formula (I), $R_5$ in the general formula (II) and $R_5$ in the general formula (II') is a trifluoromethyl group.

The content of the repeat unit (A1) having the group represented by the general formula (Y) is used in the range of generally from 5 to 80%, preferably from 7 to 70%, and more preferably from 10 to 65% by mole in the resin (A).

In the case of containing the repeat unit (A2) having the group which decomposes by the acid action to become the alkali soluble group, the content is used in the range of generally from 1 to 70%, preferably from 1 to 65%, and more preferably from 5 to 60% by mole in the resin (A)

The content of the repeat unit represented by the general formula (I) is used in the range of generally from 5 to 80%, preferably from 7 to 75%, and more preferably from 10 to 70% by mole in the resin (A).

The content of the repeat unit represented by the general formula (II) is used in the range of generally from 5 to 80%, preferably from 7 to 70%, and more preferably from 10 to 65% by mole in the resin (A).

The content of the repeat unit represented by the general formula (II') is used in the range of generally from 1 to 70%, preferably from 1 to 65%, and more preferably from 5 to 60% by mole in the resin (A).

The content of the repeat unit represented by the general formula (III) is used in the range of generally from 1 to 40%, preferably from 3 to 35%, and more preferably from 5 to 30% by mole in the resin (A).

The content of the repeat unit represented by the general formula (VII) is used in the range of generally from 1 to 40%, preferably from 3 to 35%, and more preferably from 5 to 30% by mole in the resin (A).

The content of the repeat unit represented by the general formulae (VIII) to (X) is used in the range of generally from 1 to 40%, preferably from 3 to 35%, and more preferably from 5 to 30% by mole in the resin (A).

The content of the repeat unit represented by the general formulae (XI) to (XIII) is used in the range of generally from 1 to 40%, preferably from 3 to 35%, and more preferably from 5 to 30% by mole in the resin (A).

The content of the repeat unit represented by the general formula (XIV) is used in the range of generally from 1 to 40%, preferably from 3 to 35%, and more preferably from 5 to 30% by mole in the resin (A).

The content of the repeat unit represented by the general formula (XV) is used in the range of generally from 1 to 40%, preferably from 3 to 35%, and more preferably from 5 to 30% by mole in the resin (A).

The content of the repeat unit represented by the general formula (XVI) is used in the range of generally from 1 to 40%, preferably from 3 to 35%, and more preferably from 5 to 30% by mole in the resin (A).

The content of the repeat unit represented by the general formula (XVII) is used in the range of generally from 1 to 40%, preferably from 3 to 35%, and more preferably from 5 to 30% by mole in the resin (A).

The resin of the invention (A) may copolymerize the other polymerizable monomers in addition to the above repeat structure units for the purpose of further enhancing the performance of the photosensitive resin of the invention.

Those shown below are included as copolymerizable monomers. For example, they are compounds having one addition polymerizable unsaturated bond, selected from acrylate esters, acrylamides, methacrylate esters, methacrylamides, allyl compounds, vinyl ethers, vinyl esters, styrenes, crotonate esters and the like.

The resin (A) of the second embodiment of the invention may contain the repeat unit represented by the general formula (VI) described above.

It is preferable that $R_{18}$ in the general formula (VI) is represented by any of the general formulae (VI-A) to (VI-C) described above.

The content of the repeat unit represented by the general formula (VI) is used in the range of generally from 1 to 70%, preferably from 1 to 65%, and more preferably from 5 to 60% by mole in the resin (A).

Specific examples of the repeat units represented by the general formulae (I), (II), (III), (VI), (VII), (VIII) to (XIII) and (XVII) include those described above, respectively, but the invention is not limited thereto.

Specific examples of the repeat units represented by the general formula (II') are shown below, but the invention is not limited thereto.

(Y-1)

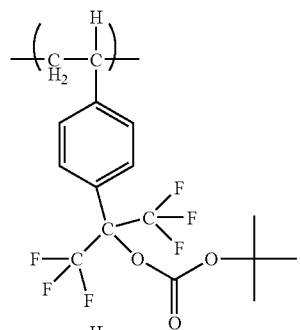

(Y-2)

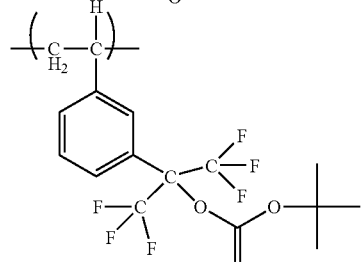

(Y-3)

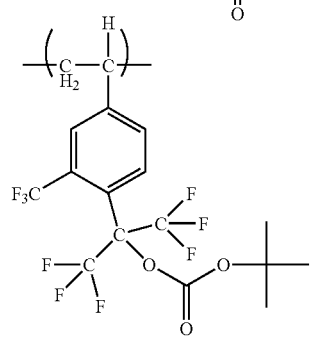

-continued (Y-4)

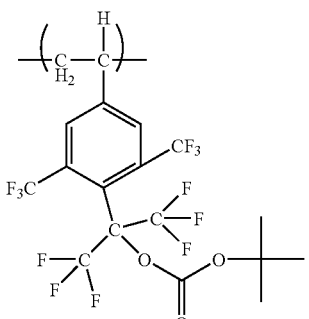

(Y-5)

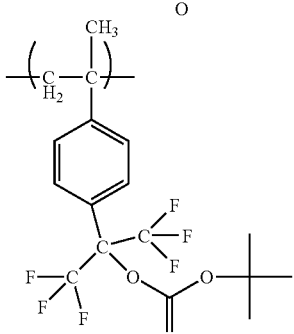

(Y-6)

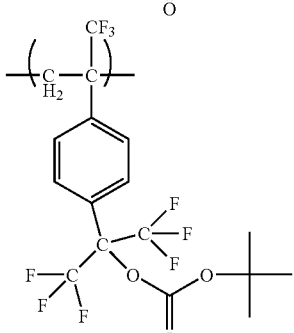

(Y-7)

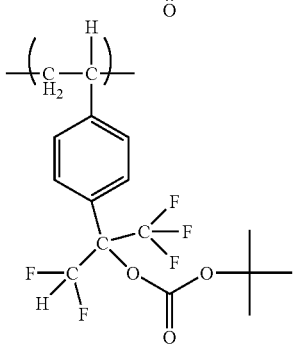

(Y-8)

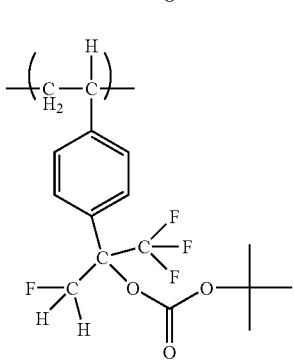

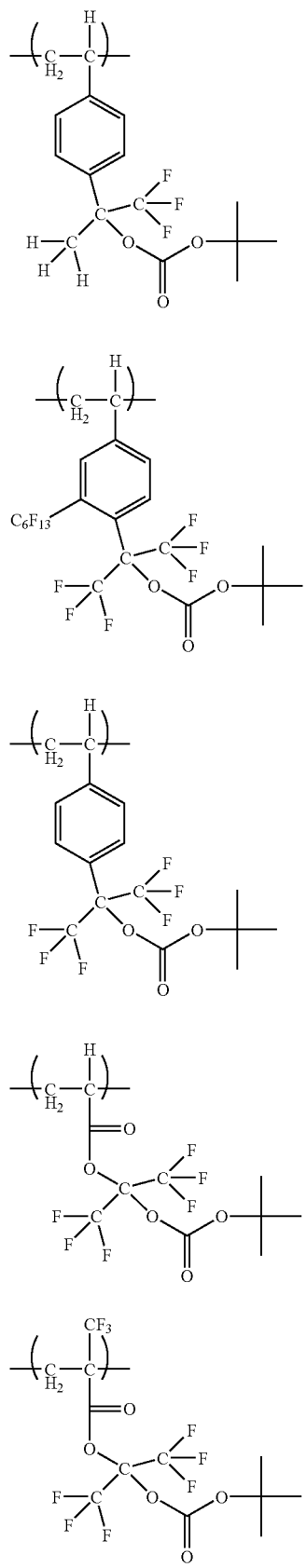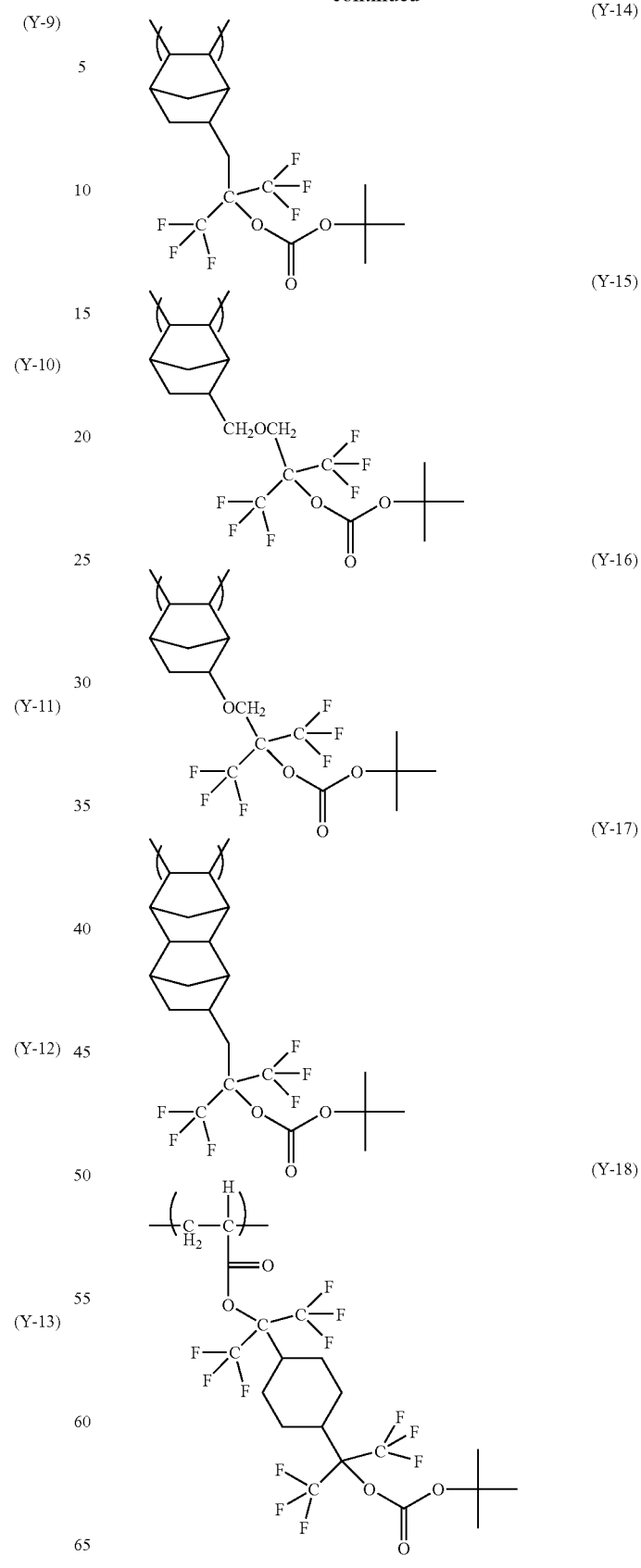

Specific examples of the repeat units represented by the general formula (XV) can include, for example, the repeat units formed by said vinyl esters.

[Resin (A) of a Third Embodiment]

The resin (A) of the third embodiment used in the invention can include a fluorine-group containing resin having each at least one of the respective repeat units represented by the above general formulae (1A) and (IIA) and the fluorine-group containing resin having each at least one of the respective repeat units represented by the above general formulae (IIA) and (VIA). These fluorine containing resins may further have at least one of the repeat units represented by the above general formula (IIIA) or (VIIA). In these fluorine group containing resins, it is preferable that $R_{18a}$ in the general formula (VIA) is represented by the above general formula (VIA-A) or (VIA-B) Also in these fluorine group containing resins (A), it is preferred that at least one of $R_{1a}$ in the general formula (IA), $R_{5a}$ in the general formula (IIA) and $R_{17a2}$ in the general formula (VIA) is a trifluoromethyl group.

In the general formulae (IA) and (IIA), $R_{1a}$ and $R_{5a}$ may be the same or different, and represent hydrogen atoms, halogen atoms, cyano groups and alkyl groups which may have substituents. $R_{2a}$, $R_{3a}$, $R_{6a}$ and $R_{7a}$ may be the same or different, and represent hydrogen atoms, halogen atoms, cyano groups, hydroxyl groups, or alkyl, cycloalkyl, alkoxy, acyl, acyloxy, alkenyl aryl or aralkyl groups which may have substituents. $R_{50a}$ to $R_{55a}$ may be the same or different, and represent hydrogen atoms, fluorine atoms, and alkyl groups which may have substituents. But, at least one in $R_{50a}$ to $R_{55a}$ represents a fluorine atom or an alkyl group wherein at least one hydrogen atom is substituted with a fluorine atom. $R_{56a}$ represents a hydrogen atom, or an alkyl, cycloalkyl, acyl or alkoxycarbonyl group which may have substituents, and is preferably a hydrogen atom. $R_{4a}$ represents a group of the above general formula (IVA) or (VA)

In the general formula (IVA), $R_{11a}$, $R_{12a}$ and $R_{13a}$ may be the same or different, and represent alkyl, cycloalkyl, alkenyl, aralkyl or aryl groups which may have substituents.

In the general formula (VA), $R_{14a}$ and $R_{15a}$ may be the same or different, and represent hydrogen atoms or alkyl groups which may have substituents. $R_{16a}$ represents alkyl, cycloalkyl, aralkyl or aryl groups which may have substituents. Two of $R_{14a}$ to $R_{16a}$ may join to form a ring.

In the general formula (VIA), $R_{17a1}$ and $R_{17a2}$ may be the same or different, and represent hydrogen atoms, halogen atoms, cyano groups and alkyl groups which may have substituents. $R_{18a}$ represents —C($R_{18a1}$)($R_{18a2}$)($R_{18a3}$) or —C($R_{18a1}$)($R_{18a2}$)(O$R_{18a4}$). $R_{18a1}$ to $R_{18a4}$ may be the same or different, and represent hydrogen atoms or alkyl, cycloalkyl, alkenyl, aralkyl or aryl groups which may have substituents. Two of $R_{18a1}$, $R_{18a2}$ and $R_{18a3}$ or two of $R_{18a1}$, $R_{18a2}$ and $R_{18a4}$ may join to form a ring. $A_0$ represents a single bond or a bivalent linking group which may have substituents, and is preferably the single bond.

In the general formula (VIA-A), $R_{18a5}$ and $R_{18a6}$ may be the same or different, and represent alkyl groups which may have substituents. $A_{18a7}$ represents a cycloalkyl group which may have substituents.

In the general formula (VIA-B), $A_{18a8}$ represents an alkyl, alkenyl, alkynyl, aralkyl or aryl group which may have substituents.

In the general formula (IIIA), $R_{8a}$ represents a hydrogen atom, a halogen atom, a cyano group, or an alkyl group which may have substituents. $R_{9a}$ and $R_{10a}$ may be the same or different, and represent hydrogen atoms, halogen atoms, cyano groups, or alkyl, cycloalkyl, alkoxy, acyl, acyloxy, alkenyl, aryl or aralkyl groups which may have substituents.

In the general formula (VIIA), $R_{19a}$ and $R_{20a}$ may be the same or different, and represent hydrogen atoms, halogen atoms, cyano groups, or alkyl groups which may have substituents. $R_{21a}$ represents a hydrogen atom, a halogen atom, an alkyl group which may have substituents, or —B$_1$—CN group. B$_1$ represents a single bond or a bivalent linking group.

The above alkyl groups are for example, alkyl groups of 1 to 8 carbons, and can specifically include preferably methyl, ethyl, propyl, n-butyl, sec-butyl, hexyl, 2-ethylhexyl and octyl groups.

Cycloalkyl groups may be monocyclic or polycyclic types. Monocyclic types are those of 3 to 8 carbons, and can include for example, preferably cyclopropyl, cyclopentyl, cyclohexyl, cycloheptyl, and cyclooctyl groups. Polycyclic types are those of 6 to 20 carbons, and can include, for example, preferably adamanthyl, norbornyl, isobornyl, camphanyl, zincropentyl, α-pinel, tricyclodecanyl, tetracyclododecyl, androstanyl groups and the like. But, the carbon atoms in the above monocyclic or polycyclic cycloalkyl group may be substituted with heteroatoms such as oxygen atoms.

Perfluoroalkyl groups are, for example, those of 4 to 12 carbons, and can specifically include preferably perfluorobutyl, perfluorohexyl, perfluorooctyl, perfluorooctylethyl, perfluorododecyl groups and the like.

Haloalkyl groups are, for example, the haloalkyl groups of 1 to 4 carbons, and can specifically include preferably chloromethyl, chloroethyl, chloropropyl, chlorobutyl, bromomethyl, bromoethyl groups and the like.

Aryl groups are, for example, aryl groups of 6 to 15 carbons, and can specifically include preferably phenyl, tolyl, dimethylphenyl, 2,4,6-trimethylphenyl, naphthyl, anthryl, 9,10-dimethoxyanthryl groups and the like.

Aralkyl groups are, for example, aralkyl groups of 7 to 12 carbons, and can specifically include preferably benzyl, phenetyl, naphthylmethyl groups and the like.

Alkenyl groups are, for example, alkenyl groups of 2 to 8 carbons, and can specifically include preferably vinyl, allyl, butenyl, and cyclohexenyl groups.

Alkoxy groups are, for example, alkoxy groups of 1 to 8 carbons, and can specifically include preferably methoxy, ethoxy, n-propoxy, iso-propoxy, butoxy, pentoxy, allyloxy, octoxy groups and the like.

Acyl groups are, for example, acyl groups of 1 to 10 carbons, and can specifically include preferably formyl, acetyl, propanoyl, butanoyl, pivaloyl, octanoyl, benzoyl groups and the like.

Acyloxy groups are preferably acyloxy groups of 2 to 12 carbons, and include, for example, acetoxy, propionyloxy, benzoyloxy groups and the like.

Alkynyl groups are preferably alkynyl groups of 2 to 5 carbons, and can include, for example, ethynyl, propinyl, butynyl and the like.

Alkoxycarbonyl groups include preferably secondary, and more preferably tertiary alkoxycarbonyl groups such as i-propoxycarbonyl, t-butoxycarbonyl, t-amyloxycarbonyl and 1-methyl-1-cyclohexyloxycarbonyl groups.

Halogen atoms can include, for example, fluorine, chlorine, bromine and iodine atoms and the like.

Alkylene groups include those of 1 to 8 carbons such as methylene, ethylene, propylene, butylene, hexylene and octylene groups which may preferably have substituents.

Alkenylene groups include those of 2 to 6 carbons such as ethenylene, propenylene and butenylene which may preferably have substituents.

Cycloalkylene groups include those of 5 to 8 carbons such as cyclopentylene and cyclohexylene which may preferably have substituents.

Arylene groups include those of 6 to 15 carbons such as phenylene, trylene and naphthylene groups which may preferably have substituents.

The bivalent linking group represents a bivalent alkylene, cycloalkylene, alkenylene or arylene which may have single bonds and substituents, or —O—CO—$R_{22a}$—, —CO—O—$R_{23a}$— or —CO—N($R_{24a}$)—$R_{25a}$—. $R_{22a}$, $R_{23a}$ and $R_{25a}$ may be the same or different, and represent bivalent alkylene, alkenylene, cycloalkylene, or arylene groups which may have single bonds, or ether, ester, amide, urethane or ureide groups. $R_{24a}$ represents a hydrogen atom, or an alkyl, cycloalkyl, aralkyl or aryl group which may have substituents.

The ring which $R_0$ and $R_1$, $R_0$ and $R_2$, or $R_3$ and $R_4$ join to form is, for example, a 5 to 7-membered ring, and specifically includes pentane, hexane, furan, dioxonol, 1,3-dioxoran rings and the like where fluorine is substituted.

The ring which two of $R_{36}$ to $R_{38}$, or two of $R_{36}$ to $R_{37}$ and $R_{39}$ join to form is, for example a 3 to 8-membered ring, and can specifically include preferably cyclopropane, cyclopentane, cyclohexane, furan, pyran rings and the like.

The ring which two of $R_{14a}$ to $R_{16a}$, two of $R_{18a1}$ to $R_{18a3}$, or two of $R_{18a1}$, $R_{18a2}$ and $R_{8a4}$ join to form is preferably a 3 to 8-membered ring, and can include, for example, cyclopropane, cyclopentane, cyclohexane, tetramethyleneoxide, pentamethyleneoxide, hexamethyleneoxide, furan, pyran, dioxonol, 1,3-dioxoran rings and the like.

Z represents an atomic group composing monocyclic or polycyclic alicyclic group. For the formed alicyclic groups, monocyclic types are those of 3 to 8 carbons, and preferably can include for example, cyclopropyl, cyclopentyl, cyclohexyl, cycloheptyl, and cyclooctyl groups. Polycyclic types are those of 6 to 20 carbons, and preferably can include for example, adamanthyl, norbornyl, isobornyl, camphanyl, zincropentyl, α-pinel, tricyclodecanyl, tetracyclododecyl, androstanyl groups and the like.

The substituents substituted in these groups include those having active hydrogen such as alkyl, cycloalkyl, aryl, amino, amide, ureido, urethane, hydroxyl and carboxyl groups, halogen atoms (fluorine, chlorine, bromine and iodine atoms), alkoxy groups (methoxy, ethoxy, propoxy and butoxy groups etc.), thioether groups, acyl groups (acetyl, propanoyl and benzoyl groups, etc.), acyloxy groups (acetoxy, propanoyloxy and benzoyloxy groups, etc.), alkoxycarbonyl groups (methoxycarbonyl, ethoxycarbonyl, propoxycarbonyl groups, etc.), cyano group, nitro group, and the like.

Here, alkyl, cycloalkyl and aryl groups include those represented above, but the alkyl groups may be further substituted with fluorine atoms and cycloalkyl groups.

The group contained in the fluorine group-containing resin of the invention, which decomposes by the acid action to exhibit alkali solubility includes for example, —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$), —COO—C($R_{36}$)($R_{37}$)(O$R_{39}$), and the like. $R_{36}$ to $R_{39}$ are the same as defined above. $R_{01}$ and $R_{02}$ represent hydrogen atoms, or alkyl, cycloalkyl, alkenyl, aralkyl or aryl groups which may have substituents shown above.

Preferable specific examples preferably include ether or ester groups of tertiary alkyl groups such as t-butyl, t-amyl, 1-alkyl-1-cyclohexyl, 2-alkyl-2-adamanthyl, 2-adamanthyl-2-propyl and 2-(4-methylcyclohexyl)-2-propyl groups, acetal or acetal ester group such as 1-alkoxy-1-ethoxy and tetrahydropyranyl groups, t-alkyl carbonate group, t-alkyl-carbonylmethoxy group and the like.

The content of the repeat unit represented by the general formula (IA) is generally from 5 to 80%, preferably from 10 to 75%, and more preferably from 20 to 70% by mole in the fluorine group-containing resin (A) having each at least one of the repeat units represented by the general formulae (IA) and (IIA), respectively.

The content of the repeat unit represented by the general formula (IIA) is generally from 5 to 80%, preferably from 10 to 70%, and more preferably from 20 to 65% by mole in the fluorine group-containing resin (A) having each at least one of the repeat units represented by the general formulae (IA) and (IIA), respectively.

The content of the repeat unit represented by the general formula (IIA) is generally from 5 to 80%, preferably from 10 to 70%, and more preferably from 20 to 65% by mole in the fluorine group-containing resin (A) having each at least one of the repeat units represented by the general formulae (IIA) and (VIA), respectively.

The content of the repeat unit represented by the general formula (VIA) is generally from 5 to 80%, preferably from 10 to 70%, and more preferably from 20 to 65% by mole in the fluorine group-containing resin (A) having each at least one of the repeat units represented by the general formulae (IIA) and (VIA), respectively.

The content of the repeat unit represented by the general formula (IIIA) is generally from 1 to 40%, preferably from 3 to 35%, and more preferably from 5 to 30% by mole in these fluorine group-containing resins (A).

The content of the repeat unit represented by the general formula (VIIA) is generally from 1 to 40%, preferably from 3 to 35%, and more preferably from 5 to 30% by mole in these fluorine group-containing resins (A).

Below, specific examples of the repeat structure units represented by the general formula (IA) include the specific examples of the general formula (I) described above, but the invention is not limited thereto.

Specific examples of the repeat structure units represented by the general formula (IIA) are shown below, but the invention is not limited thereto.

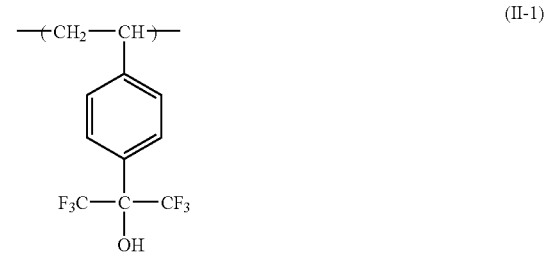

(II-1)

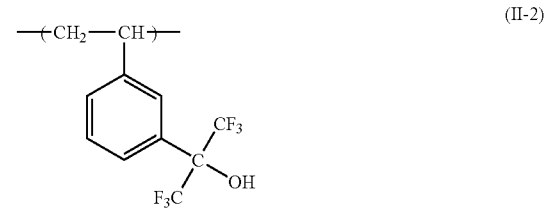

(II-2)

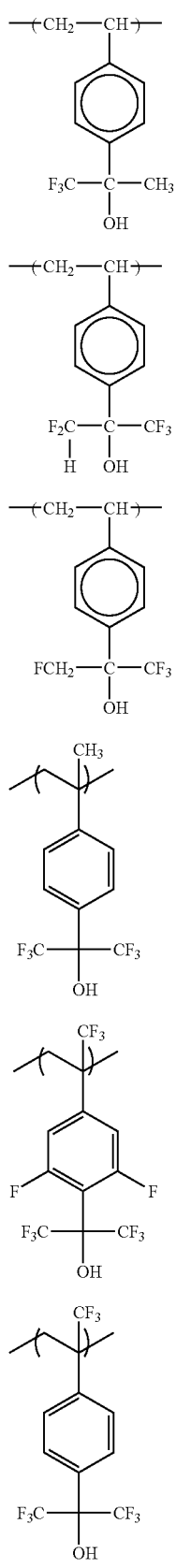
Furthermore, specific examples of the repeat structure units represented by the general formula (IIA) can include the following (F-40) to (F-46).
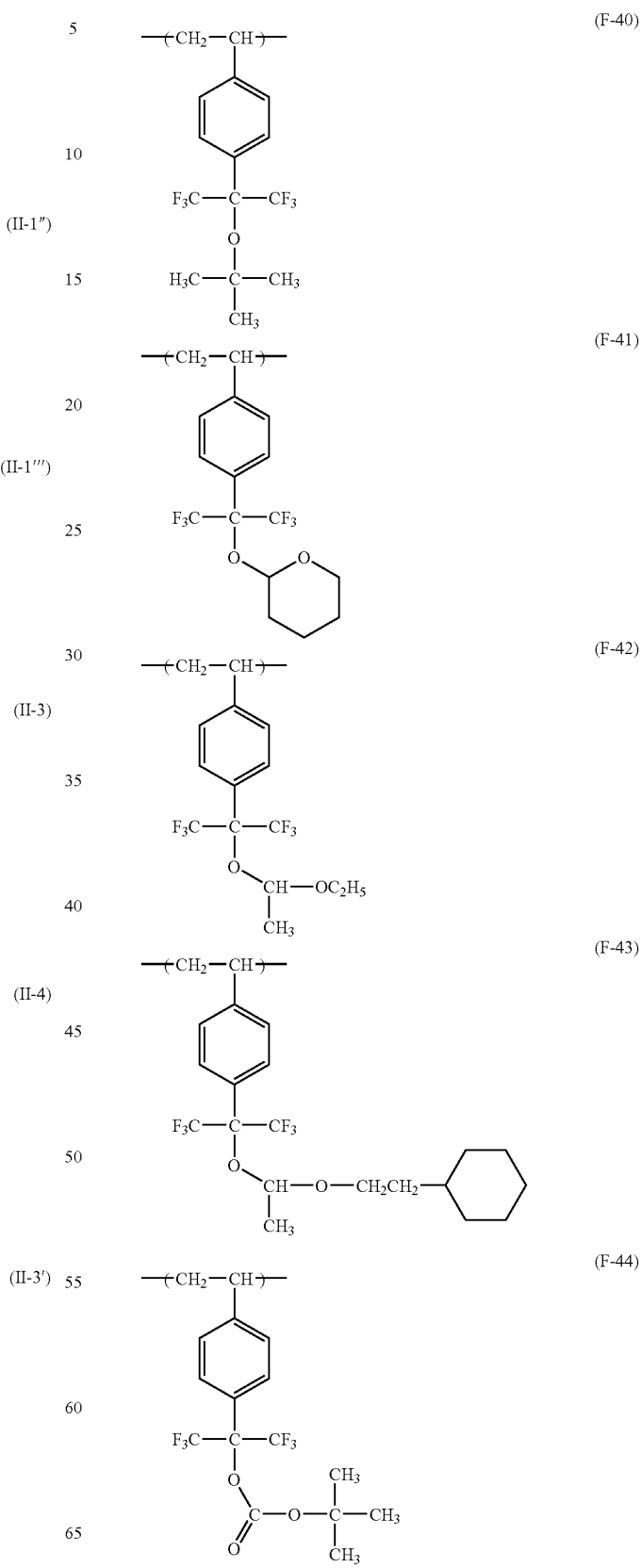

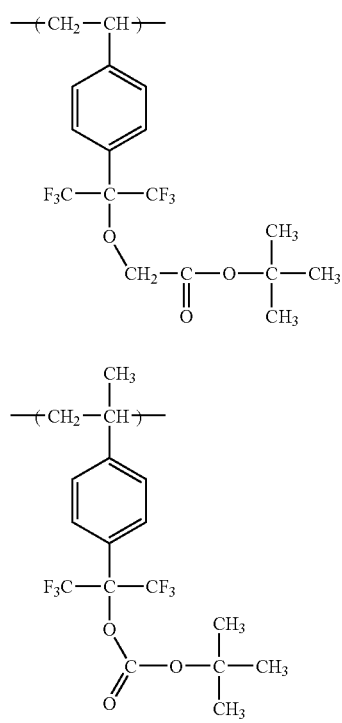 (F-45)
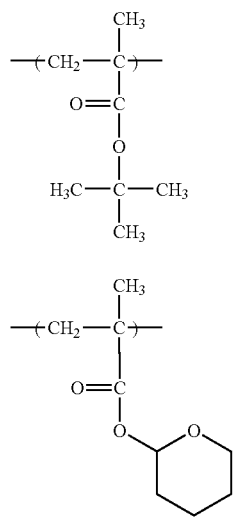 (F-46)
Specific examples of the repeat structure units represented by the general formula (VIA) are shown below, but the invention is not limited thereto.
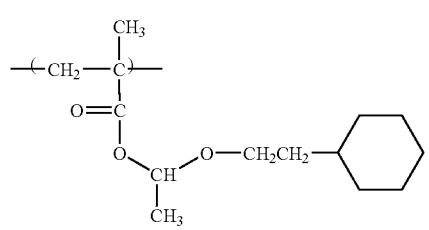 (B-1)
(B-2)
(B-3)
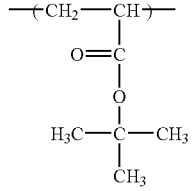 (B-4)
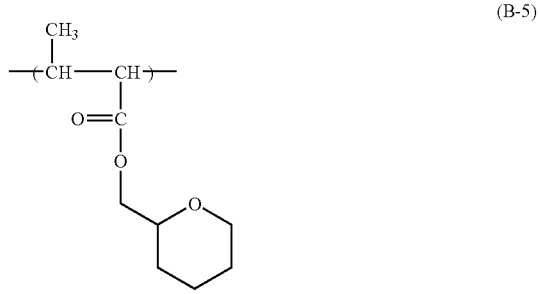 (B-5)
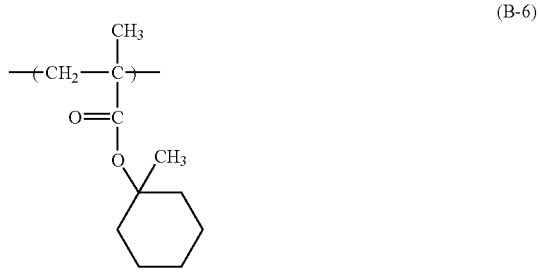 (B-6)
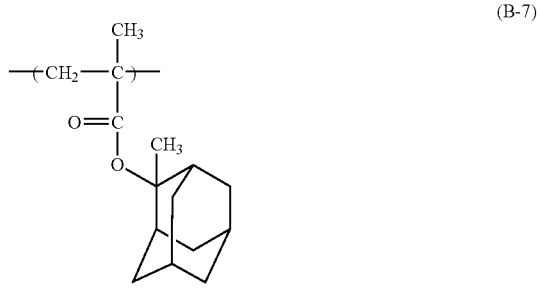 (B-7)
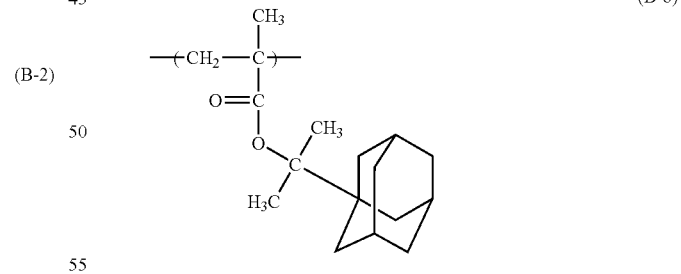 (B-8)
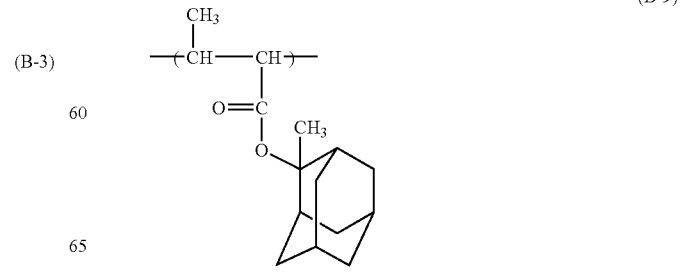 (B-9)

-continued
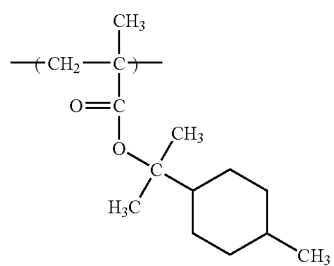
(B-10)
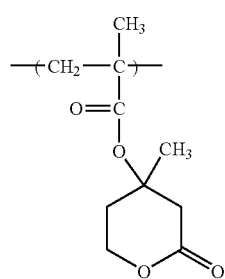
(B-11)
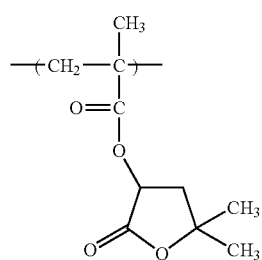
(B-12)
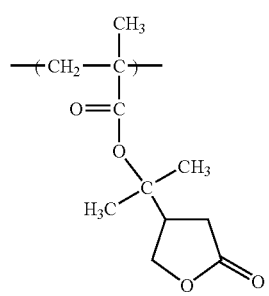
(B-13)
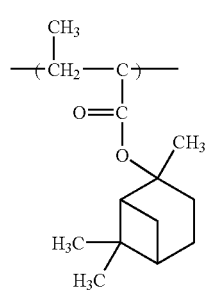
(B-14)
-continued
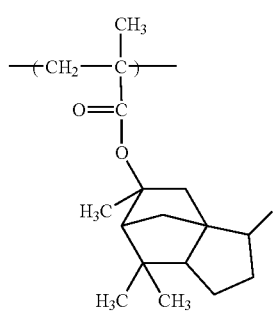
(B-15)
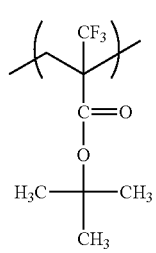
(B-1')
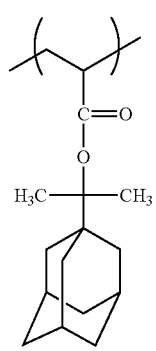
(B-8')
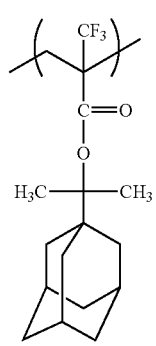
(B-8")
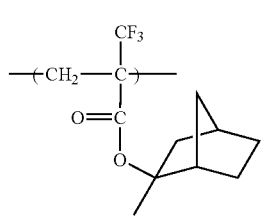
(B-12')

(B-12″)
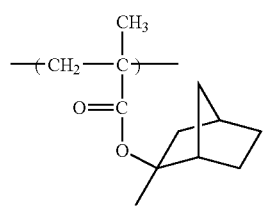
Furthermore, specific examples of the repeat structure units represented by the general formula (VIA) can include the following (F-29) to (F-38) and (F-47) to (F-54).
(F-29)
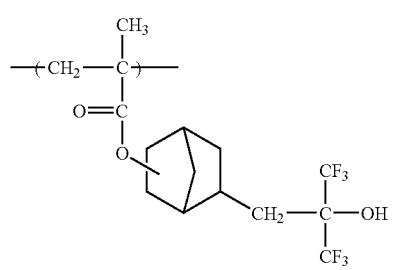
(F-30)
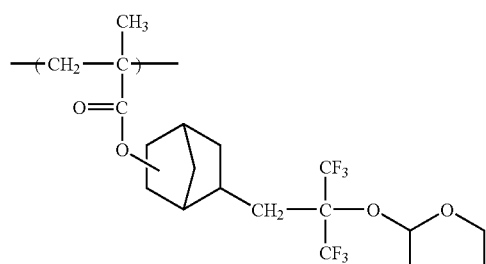
(F-31)
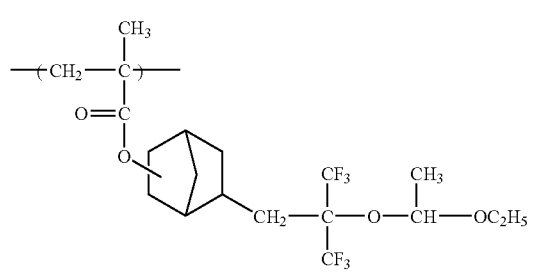
(F-32)
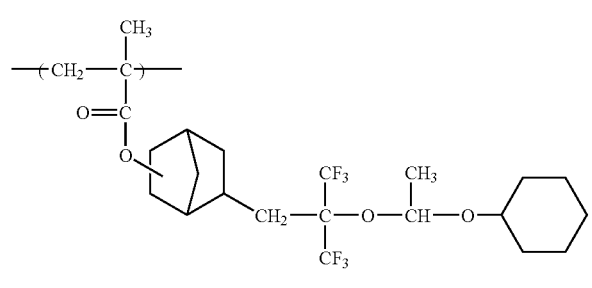
(F-33)
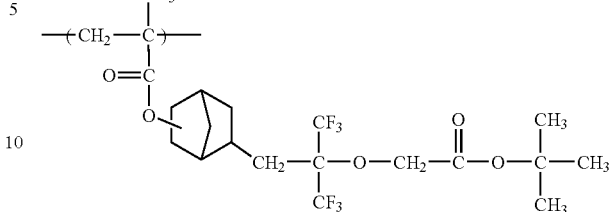
(F-34)
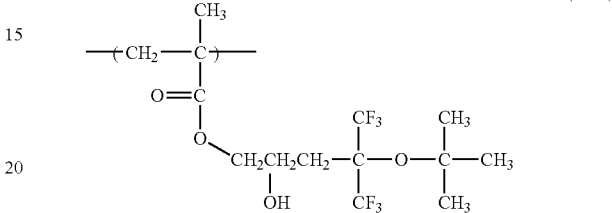
(F-35)
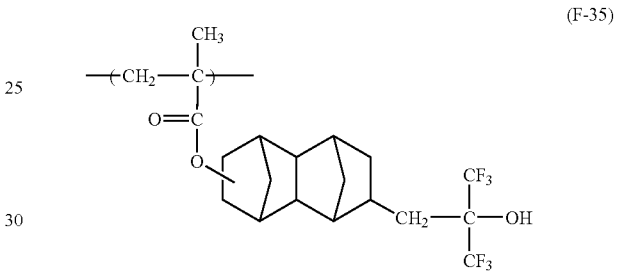
(F-36)
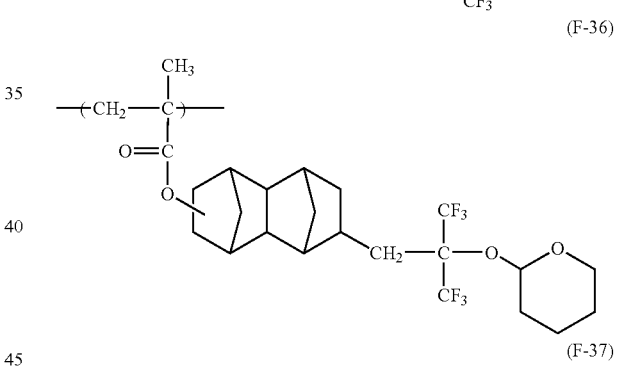
(F-37)
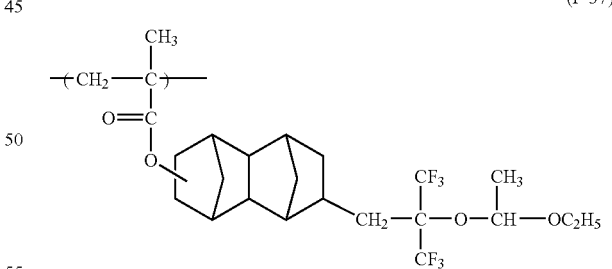
(F-38)
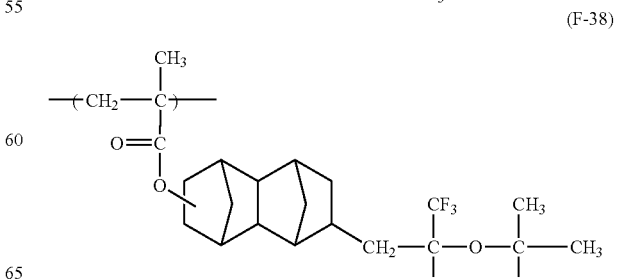

(F-47) 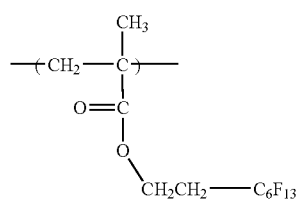
(F-48) 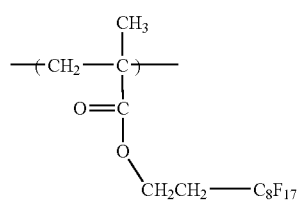
(F-49) 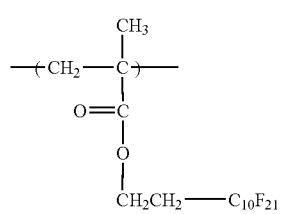
(F-50) 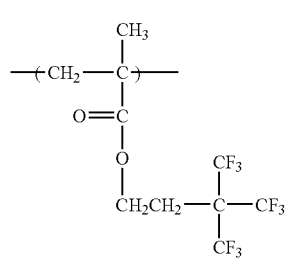
(F-51) 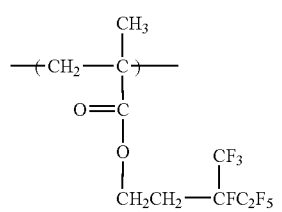
(F-52) 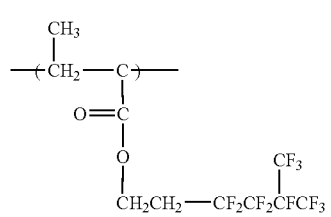
(F-53) 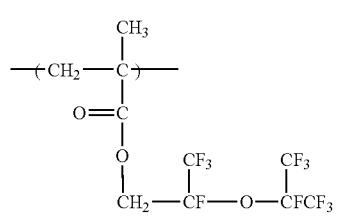
(F-54) 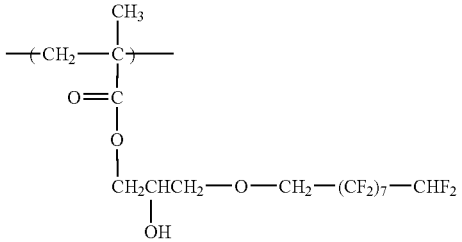
Specific examples of the repeat structure units represented by the general formula (IIIA) are shown below, but the invention is not limited thereto.
(III-1) 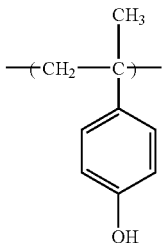
(III-2) 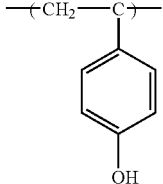
(III-3) 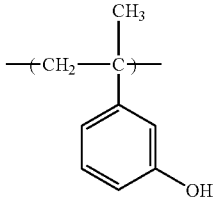
(III-4) 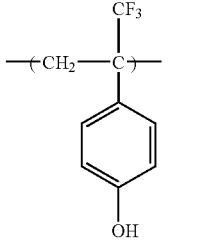
(III-5) 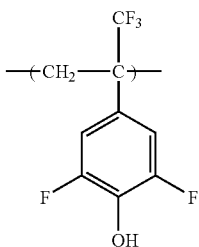

Specific examples of the repeat structure units represented by the general formula (VIIA) are shown below, but the invention is not limited thereto.

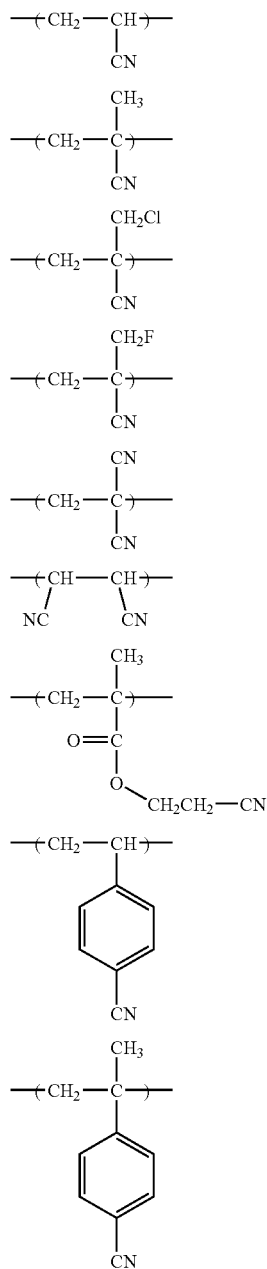

The resin of A component used in the invention may copolymerize the other polymerizable monomers in addition to the above repeat structure units for the purpose of further enhancing the performance of the photosensitive resin of the invention.

Additionally, the resin used in the invention can have the repeat units represented by the following general formulae (I) to (X):

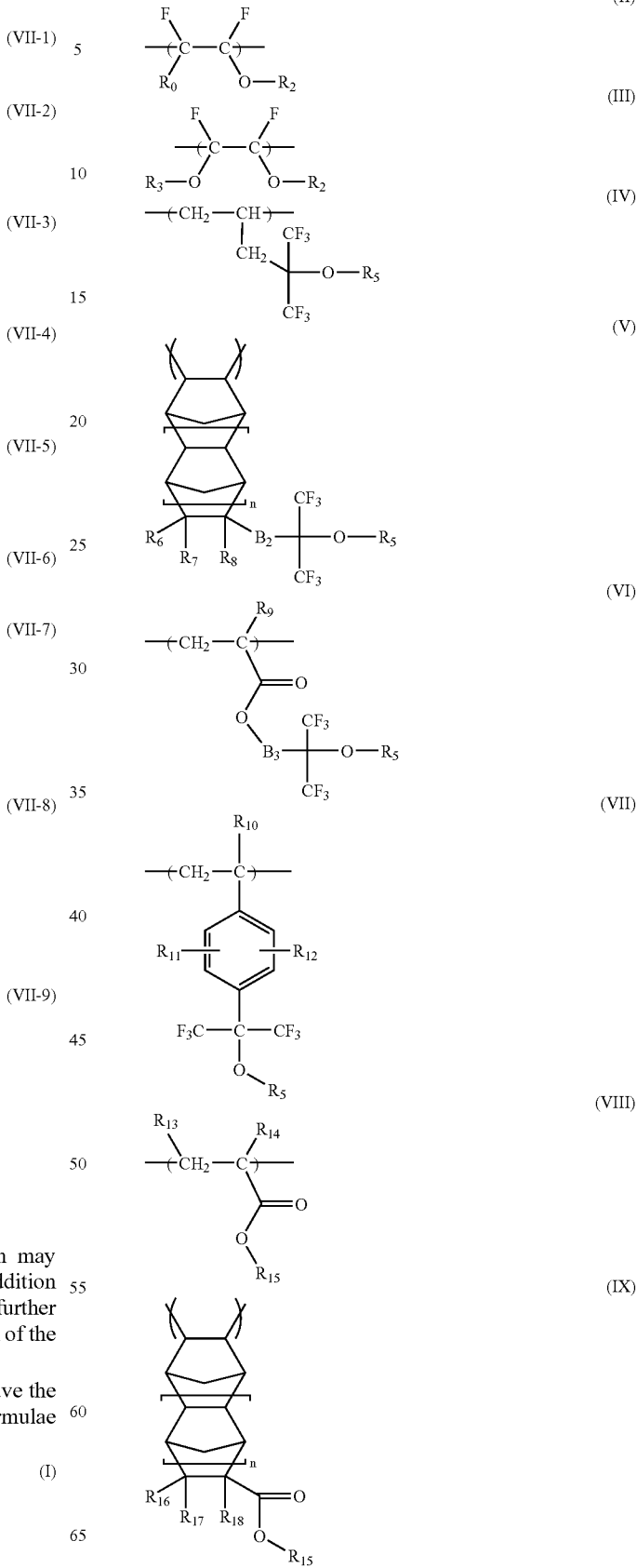

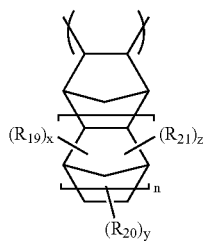
(X)

In the formulae, $R_0$ and $R_1$ represent hydrogen atoms, fluorine atoms, or alkyl, perfluoroalkyl, cycloalkyl or aryl groups which may have substituents.

$R_2$ to $R_4$ represent alkyl, perfluoroalkyl, cycloalkyl or aryl groups which may have substituents. Also, $R_0$ and $R_1$, $R_0$ and $R_2$, $R_3$ and $R_4$ may join to form a ring.

$R_5$ represents a hydrogen atom, an alkyl, perfluoroalkyl, monocyclic or polycyclic cycloalkyl, acyl or alkoxycarbonyl group which may have substituents.

$R_6$, $R_7$ and $R_8$ may be the same or different, and represent hydrogen atoms, halogen atoms, or alkyl, perfluoroalkyl or alkoxy groups which may have substituents.

$R_9$ and $R_{10}$ may be the same or different, and represent hydrogen atoms, halogen atoms, cyano groups, or alkyl or haloalkyl groups which may have substituents.

$R_{11}$ and $R_{12}$ may be the same or different, and represent hydrogen atoms, hydroxyl groups, halogen atoms, cyano, alkoxy, acyl groups, or alkyl, cycloalkyl, alkenyl, aralkyl or aryl groups which may have substituents.

$R_{13}$ and $R_{14}$ may be the same or different, and represent hydrogen atoms, halogen atoms, cyano groups, or alkyl or haloalkyl groups which may have substituents.

$R_{15}$ represents an alkyl, monocyclic or polycyclic cycloalkyl, alkenyl, aralkyl or aryl group which has fluorine atoms.

$R_{16}$, $R_{17}$ and $R_{18}$ may be the same or different, and represent hydrogen atoms, halogen atoms, cyano groups, or alkyl, perfluoroalkyl, alkoxy groups or —CO—O—$R_{15}$ which may have substituents.

$R_{19}$, $R_{20}$ and $R_{21}$ may be the same or different, and represent hydrogen atoms, fluorine atoms, or alkyl, monocyclic or polycyclic cycloalkyl, alkenyl, aralkyl, aryl or alkoxy groups which have fluorine atoms. But, at least one of $R_{19}$, $R_{20}$ and $R_{21}$ is a group other than a hydrogen atom.

$B_2$ and $B_3$ represent bivalent alkylene, alkenylene, cycloalkylene or arylene which may have single bonds and substituents, or —O—CO—$R_{22}$—, —CO—O—$R_{23}$— or —CO—N($R_{24}$)—$R_{25}$—.

$R_{22}$, $R_{23}$ and $R_{25}$ may be the same or different, and represent bivalent alkylene, alkenylene, cycloalkylene or arylene groups which may have single bonds, or ether, ester, amide, urethane or ureido groups. $R_{24}$ represents a hydrogen atom, or an alkyl, cycloalkyl, aralkyl or aryl group which may have substituents, and n represents 0 or 1, and x, y and z represent integers of 0 to 4.

The details of respective substituents in the general formulae (I) to (X) are the same as those in the previous general formulae (IA) to (VIIA).

Specific examples of the repeat structure units represented by the general formulae (I) to (X) are shown below, but are not limited thereto.

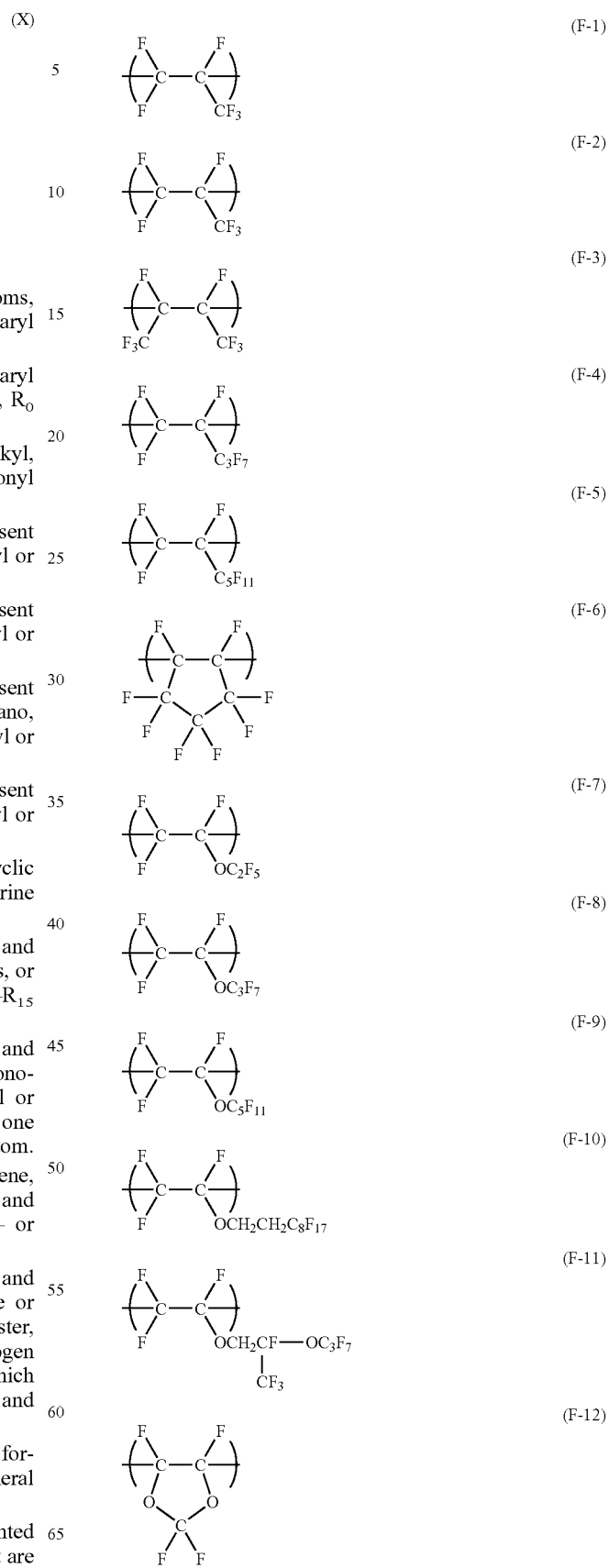

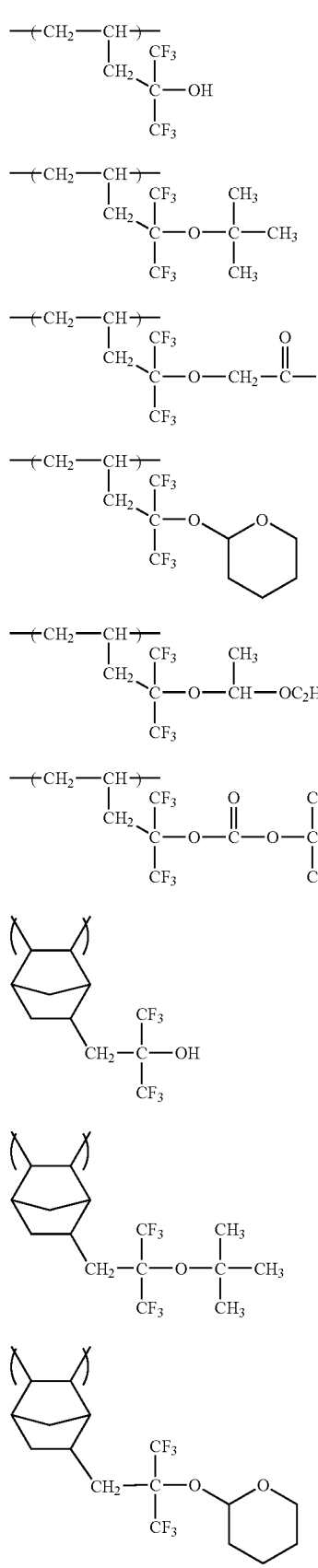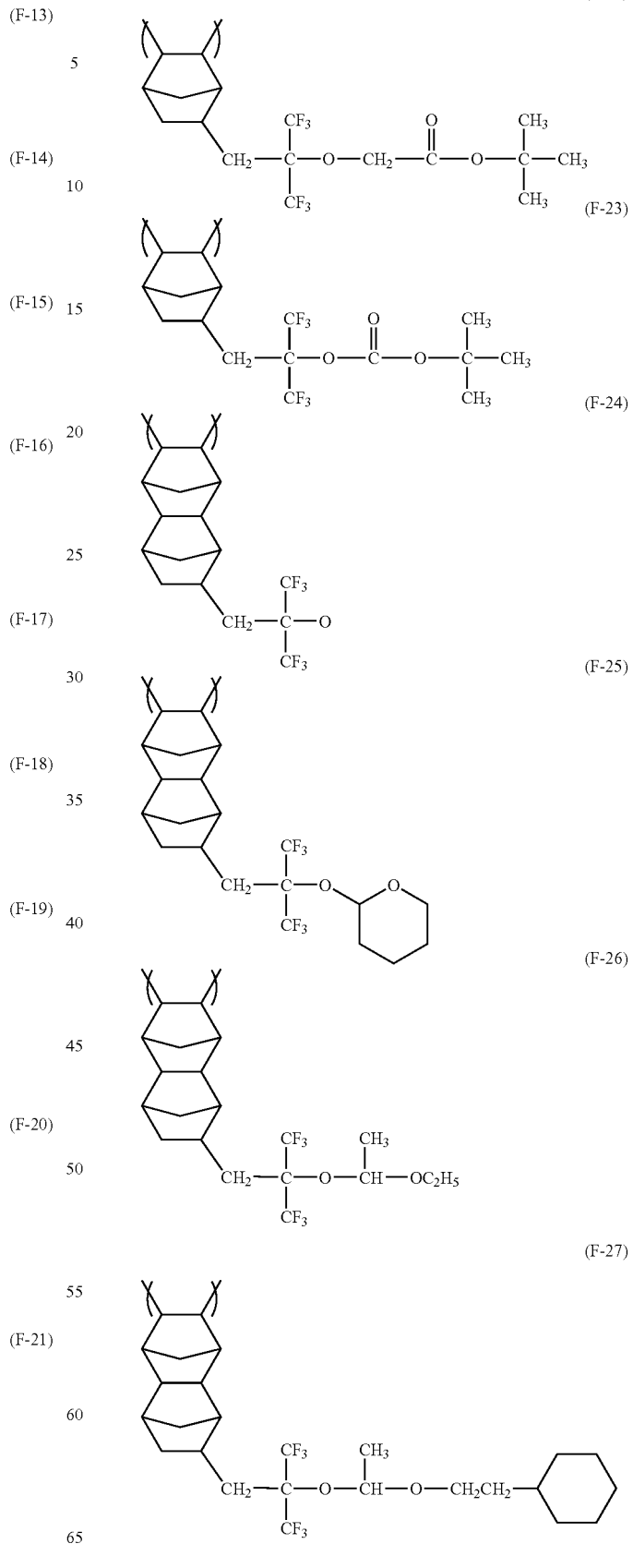

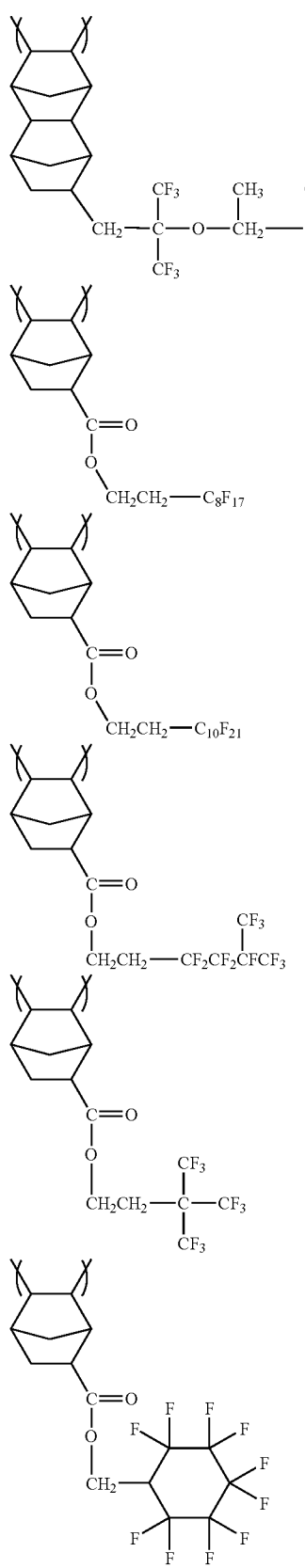
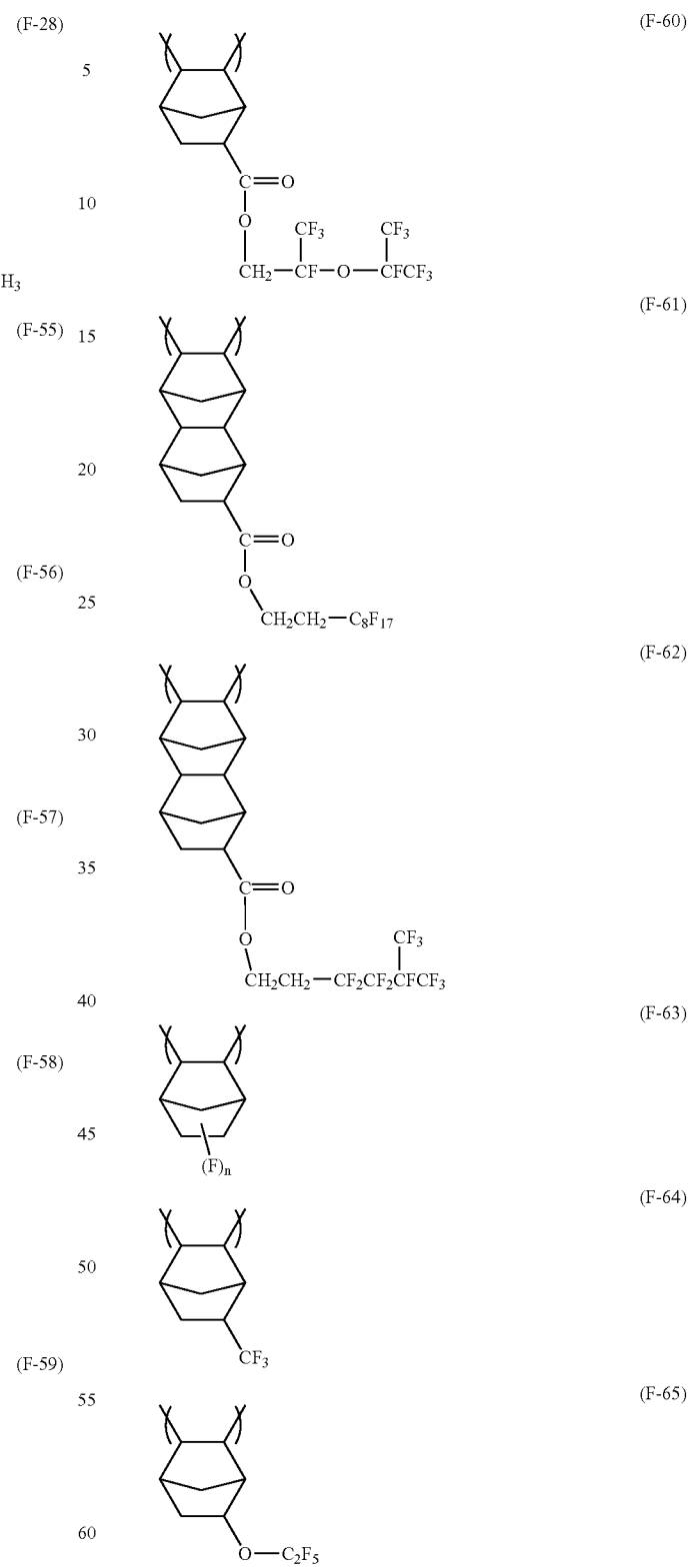
Furthermore, copolymerizable monomers which can be combined include those shown below. For example, they are compounds having one addition polymerizable unsaturated bond, selected from acrylate esters, acrylamides, methacrylate esters, methacrylamides, allyl compounds, vinyl ethers, vinyl esters, styrenes, crotonate esters and the like.

Specifically, there are for example, acrylate esters, for example, alkyl (number of carbon atoms of the alkyl group is preferably from 1 to 10) acrylate (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, tetrahydrofurfuryl acrylate, etc.), aryl acrylate (e.g., phenyl acrylate, etc.);

methacrylate esters, for example, alkyl (number of carbon atoms of the alkyl group is preferably from 1 to 10) methacrylate (e.g., methyl methacrylate, ethyl methacrylate, propyl methacrylate, isopropyl methacrylate, t-butyl methacrylate, amylmethacrylate, hexylmethacrylate, cyclohexylmethacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, etc.), aryl methacrylate (e.g., phenyl methacrylate, cresyl methacrylate, naphthyl methacrylate, etc.);

acrylamides, for example, acrylamide, N-alkyl acrylamide (as the alkyl groups, there are those of 1 to 10 carbons, e.g., methyl, ethyl, propyl, butyl, t-butyl, heptyl, octyl, cyclohexyl, benzyl, hydroxyethyl groups and the like.), N-aryl acrylamide (as the aryl groups, there are for example, phenyl, nitrophenyl, naphthyl, cyanophenyl, hydroxyphenyl, carboxyphenyl groups and the like.), N,N-dialkyl acrylamide (as the alkyl groups, there are those of 1 to 10 carbons, e.g., methyl, ethyl, butyl, isobutyl, ethylhexyl, cyclohexyl groups and the like), N,N-diaryl acrylamide (as the aryl groups, there are phenyl group and the like.), N-methyl-N-phenyl acrylamide, N-hydroxyethyl-N-methyl acrylamide, N-2-acetoamide ethyl-N-acetyl acrylamide, and the like;

methacrylamides, for example, methacrylamide, N-alkyl methacrylamide (as the alkyl groups, there are those of 1 to 10 carbons, e.g., methyl, ethyl, t-butyl, ethylhexyl, hydroxyethyl, cyclohexyl groups and the like), N-aryl methacrylamide (as the aryl groups, there are phenyl group and the like.), N,N-dialkyl methacrylamide (as the alkyl groups, there are methyl, ethyl, butyl, and the like.), N,N-diaryl methacrylamide (as the aryl groups, there are phenyl group and the like.), N-hydroxyethyl-N-methyl methacrylamide, N-methyl-N-phenyl methacrylamide, N-ethyl-N-phenyl methacrylamide, and the like; ally compounds, for example, allyl esters (e.g., allyl acetate, allyl caproate, allyl caprylate, allyl laurate, allyl palmitate, allyl stearate, allyl benzoate, allyl acetoacetate, allyl lactate, etc.);

vinyl ethers, for example, alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethyleneglycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ether (e.g., vinyl phenyl ether, vinyl tolyl ether, vinyl chlorophenyl ether, vinyl-2,4-dichlorophenyl ether, vinyl naphthyl ether, vinyl anthranil ether, etc.);

vinyl esters, for example, vinyl butylate, vinyl isobutylate, vinyl trimethylacetate, vinyl diethylacetate, vinyl borate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutylate, vinyl cyclohexyl carboxylate, vinyl benzoate, vinyl salicylate, vinyl chlorobenzoate, vinyl tetrachlorobenzoate, vinyl naphthoate, and the like;

styrenes, for example, styrene, alkyl styrene (e.g., methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene, etc.), alkoxy styrene (e.g., methoxy styrene, 4-methoxy-3-methyl styrene, dimethoxy styrene, etc.), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), carboxy styrene, vinyl naphthalene;

crotonate esters, for example, alkyl crotonate (e.g., butyl crotonate, hexyl crotonate, glycerine monocrotonate, etc.); itaconate dialkyls (e.g., dimethyl itaconate, diethyl itaconate, dibutyl itaconate, etc.); dialkyl esters of maleic acid or fumaric acid (e.g., dimethylmaleate, dibutyl fumarate, etc.), maleic acid anhydride, maleimide, acrylonitrile, methacrylonitrile, maleilonitrile, and the like. They could be generally the other addition polymerizable unsaturated compounds capable of being copolymerized.

The repeat structure units represented by the above specific examples may be used in each one type or in mixture with multiple types.

The above resin (A) can be synthesized by standard radical polymerization methods. A preferable molecular weight of the resin (A) of the invention having the above repeat structure units is from 1,000 to 200,000 in the weight average, and more preferably, it is used in the range of from 3,000 to 20,000. The molecular weight distribution (Mw/Mn) is from 1 to 10, and preferably those in the range of from 1 to 3, more preferably from 1 to 2 are used. The smaller the molecular weight distribution is, the resolution, resist shape and side walls of resist patterns are smoother, and roughness is more excellent.

The amount of resin (A) of the invention to be added is used in the range of generally from 50 to 99.5%, preferably from 80 to 99%, and more preferably from 90 to 98% by weight based on the total solid contents of the composition.

[2] Compound which Generate an Acid upon Irradiation with One of an Actinic Ray and a Radiation ((B) Component)

The photosensitive resin composition of the invention is characterized by containing a compound which generates an acid with relatively high acid strength and a compound which generates an acid with low acid strength by radiating active light or radioactive ray, particularly $F_2$ excimer laser light.

Specifically, as the compounds which generate the acid by radiating an actinic ray and a radiation the resist composition of the invention contains at least two compounds selected from (B1) a compound which generates aliphatic or aromatic sulfonic acid substituted with at least one fluorine atom upon irradiation with one of an actinic ray and a radiation, (B2) a compound which generates aliphatic or aromatic sulfonic acid containing no fluorine atom upon irradiation with one of an actinic ray and a radiation,
(B3) a compound which generates aliphatic or aromatic carboxylic acid substituted with at least one fluorine atom upon irradiation with one of an actinic ray and a radiation, and
(B4) a compound which generates aliphatic or aromatic carboxylic acid containing no fluorine atom upon irradiation with one of an actinic ray and a radiation.

That is, when (B1) component is used as the compound which generates the acid with high acid strength, (B2) to (B4) components can be used as the compound which generates the acid with low acid strength.

When (B2) component is used as the compound which generates the acid with high acid strength, (B3) to (B4) components can be used as the compound which generates the acid with low acid strength.

When (B3) component is used as the compound which generates the acid with high acid strength, (B4) components can be used as the compound which generates the acid with low acid strength.

Two or more types can be combined for each component.

It become possible to control a deprotection reaction of acid degradable groups of the resin proximal to an interface of radiated portion/non-radiated portion (low energy radiated area) of an actinic ray and a radiation by generating two types of acids with different acid strength by the radiation of an actinic ray and a radiation. Consequently, contrasts of image formation are enhanced. As a result, relief images which are more rectangular and excellent in line edge roughness can be obtained.

The (B1) to (B4) components can be selected from those generally used as the compounds (photoacid generators) which decompose by the radiation of an actinic ray or a radiation to generate the acid.

That is, the compounds and the mixture thereof can be approximately selected and used, which generate the acid by photoinitiators of photo cation polymerization, photoinitiators of photo radical polymerization, photo achromatizers of pigments, photo discoloring agents, or light known in the art used for microresists and the like (ultraviolet ray of 400 to 200 nm, far ultraviolet ray, in particular preferably g-ray, h-ray, i-ray, KrF excimer laser light), ArF excimer laser light, $F_2$ excimer laser light, electron ray, X-ray, molecular beams or ion beams.

Such compounds can include, for example, diazonium salts described in S. I. Schlesinger, Photogr. Sci, Eng., 18:387, 1974; T. S. Bal et al., Polymer, 21:423, 1980; ammonium salts described in U.S. Pat. Nos. 4,069,055, 4,069,056 and Re Pat. No. 27,992, and JP-A-3-140140, phosphonium salts described in D. C. Necker, et al., Macromolecules, 17:2468, 1984; C. S. Wen et al., Teh. Proc. Conf. Rad. Curing ASIA, p 478, Tokyo, October 1955; U.S. Pat. Nos. 4,069,055 and 4,069,056, iodonium salts described in J. V. Crivello et al., Macromolecules, 10(6):1307, 1977; Chem. & Eng. News, p 31, Nov. 28, 1988; European Patents Nos. 104,143; 339,049; and 410,201, JP-A-2-150848 and 2-296514, sulfonium salts described in J. V. Crivello et al., Polymer J., 17:73, 1985; J. V. Crivello et al., Org. Chem., 43:3055, 1978; W. R. Watt et l., J. Polymer Sci., Polymer Chem. Ed., 22:1789, 1984; J. V. Crivello et al., Polymer Bull., 14:279, 1985; J. V. Crivello et al., Macromolecules, 14(5):1141, 1981; J. V. Crivello et al., J. Polymer Sci., Polymer Chem. Ed., 17:2877, 1979; EP Nos. 370,693; 161,811; 410,201; 339,049; 233,567; 297,443;297,442, U.S. Pat. Nos. 4,933,377; 3,902,114; 4,760,013; 4,734,444; 2,833,827; GP-2,904,626; 3,604,580; and 6,604,581, selenium salts described in J. V. Crivello et al., Macromolecules, 10(6) :1307, 1977; J. V. Crivello et al., J. Polymer Sci., Polymer Chem. Ed., 17:1047, 1979, onium salts such as arsonium salts described in C. S. Wen et al., Teh. Proc. Conf. Rad. Curing ASIA, p 478, Tokyo, October, 1988, organic halogen compounds described in U.S. Pat. No. 3,905,815; JP-B-46-4605; JP-A-48-36281; 55-32070; 60-239736; 61-169835; 61-169837; 62-58241, 62-212401, 63-70243, 63-298339, organic metal/halogen compounds described in K. Meier et al., J. Rad. Curing, 13(4) :26, 1986; T. P. Gill et al., Inorg. Chem., 19:3007, 1980; D. Astruc, Acc. Chem. Res., 19(12):377, 1986; and JP-A-2-161445, photoacid generators having o-nitrobenzyl type protecting groups described in S. Hayase et al., J. Polymer Sci., 25:753, 1987; E. Reichmanis et al., J. Polymer Sci., Polymer Chem. Ed., 23:1, 1985; Q. Q. Zhueral, J. Photochem., 36:85, 39:317, 1987; B. Amit et al., Tetrahedron Lett., 24:2205, 1973; D. H. R. Barton et al., J. Chem. Soc., 3571, 1965; P. M. Collins et al., J. Chem. Soc., Perkin I, 1695, 1975; M. Rudinstein et al., Tetrahedron Lett., 17:1445, 1975; J. W. Walker et al., J. Am. Chem. Soc., 110:7170, 1988; S. C. Busman et al., Imaging Technol., 11(4):191, 1985; H. M. Houlihan et al., Macromolecules, 21:2001, 1988; P. M. Collins et al., J. Chem. Soc., Chem. Commun., 532, 1972; S. Hayase et al., Macromolecules, 18:1799, 1985; E. Reichmanis et al., J. Electrochem. Soc., Solid State Sci. Technol., 130(6); F. M. Houlihan et al., Macromolecules, 21:2001, 1988; EP-0290750, 046,083 156,535, 271,851, 388,343; U.S. Pat. Nos. 3,901,710, 4,181,531; JP-A-60-198538 and 53-133022, the compounds which photolyze to generate sulfonic acid, where iminosulfonate and the like are representatives, described in M. Tunooka et al., Polymer Preprints Japan, 35(8); G. Berner et al., J. Rad. Curing, 13(4), W. J. Mijs et al., Coating Technol., 55(697), 45, 1983; Akzo, H. Adachi et al., Polymer Preprints Japan, 37(3); EP-0199, 672, 84515, 044,115, 618,564, 0101,122; U.S. Pat. Nos. 4,371, 605 and 4,431,774; JP-A-64-18143, 2-245756 and 3-140109, and disulfone compounds and the like described in JP-A-61-166544.

The acids generated by radiating an actinic ray or a radiation to the (B1) to (B4) components are preferably organic acids, and the (B1) to (B4) components are preferably onium salts.

The (B1) to (B4) components are described below in more detail.

(B1) The compounds which generate fluorine containing sulfonic acid by the radiation of an actinic ray or a radiation can include, for example, iodonium salts represented by the following general formula (PAG3) or sulfonium salts represented by the general formula (PAG4).

Wherein $Ar^1$ and $Ar^2$ each independently represent substituted or unsubstituted aryl groups. $R^{203}$, $R^{204}$ and $R^{205}$ each independently represent substituted or unsubstituted alkyl or aryl groups.

$Z^-$ denotes a sulfonate anion having at least one fluorine atom.

Also two of $R^{203}$, $R^{204}$ and $R^{205}$, and $Ar^1$ and $Ar^2$ may join through each single bond or substituent.

The aryl groups as $Ar^1$, $Ar^2$, $R^{203}$, $R^{204}$ and $R^{205}$ are preferably the aryl groups of 6 to 14 carbons, and the alkyl groups are preferably the alkyl groups of 1 to 8 carbons.

Preferable substituents are alkoxy groups of 1 to 8 carbons, alkyl groups of 1 to 8 carbons, alkoxycarbonyl groups of 2 to 9 carbons, alkyl carbonyl amino groups of 2 to 9 carbons, nitro, carboxyl, hydroxyl groups, halogen atoms and phenylthio groups for the aryl groups, and can include alkoxy groups of 1 to 8 carbons, aryl groups of 5 to 14 carbons, aryl carbonyl groups of 6 to 15 carbons, carboxyl groups and halogen atoms for the alkyl groups.

Sulfonate anions of $Z^-$ can include preferably aliphatic hydrocarbons of 1 to 20 carbons and aromatic hydrocarbons of 5 to 20 carbons having at least one fluorine atom. These may have substituents, and the substituents can include, for example, alkoxy groups of 1 to 10 carbons which may be substituted with fluorine, alkoxycarbonyl groups of 2 to 11 carbons which may be substituted with fluorine, phenylamino, phenylcarbonyl groups, halogen atoms and hydroxyl groups. For the aromatic hydrocarbons, alkyl groups of 1 to 15 carbons can be further included.

For aliphatic sulfonate anions, the anion having the fluorine atom on a carbon of the sulfonic acid is high in acid strength. Also, perfluoro aliphatic sulfonic acid is higher in acid strength.

Specific examples include below, but are not limited thereto.

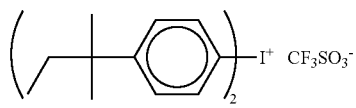

(VI-1)

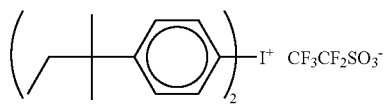

(VI-2)

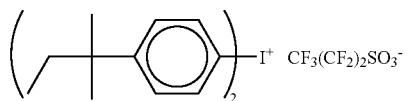

(VI-3)

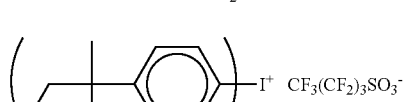

(VI-4)

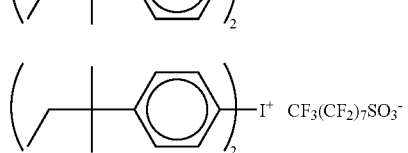

(VI-5)

-continued

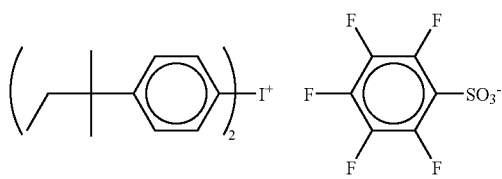

(VI-6)

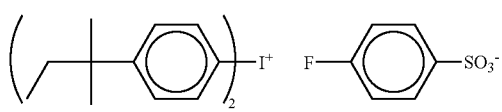

(VI-7)

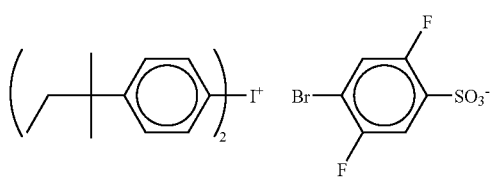

(VI-8)

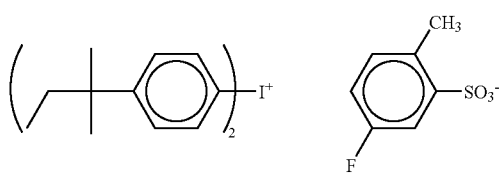

(VI-9)

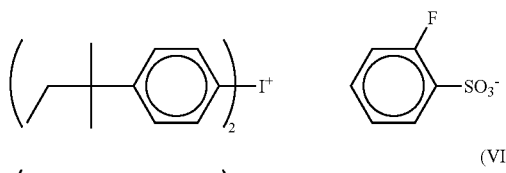

(VI-10)

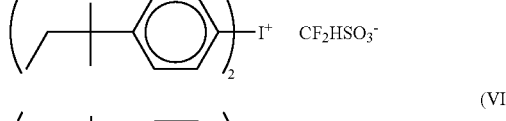

(VI-11)

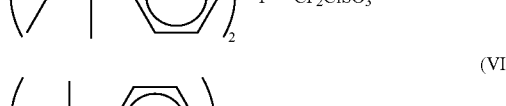

(VI-12)

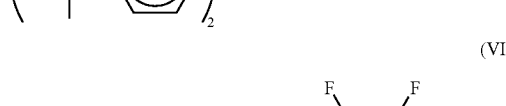

(VI-13)

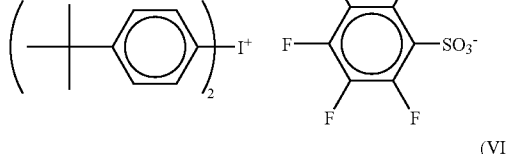

(VI-14)

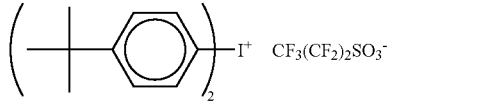

(VI-15)

-continued
(VI-16) 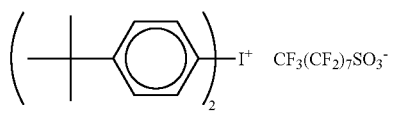
(VI-17) 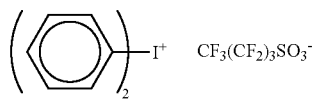
(VI-18) 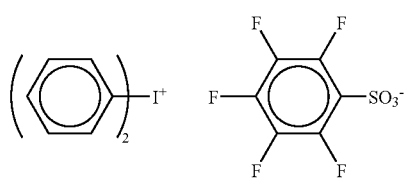
(VI-19) 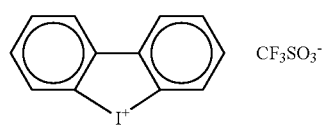
(VI-20) 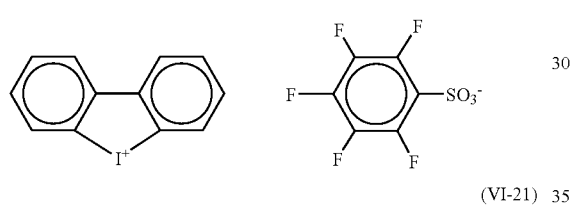
(VI-21) 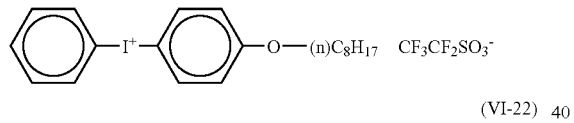
(VI-22) 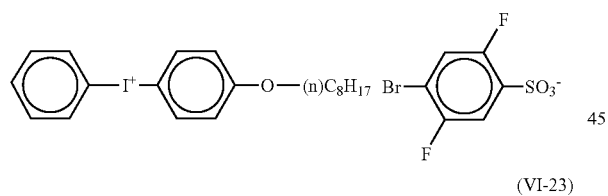
(VI-23) 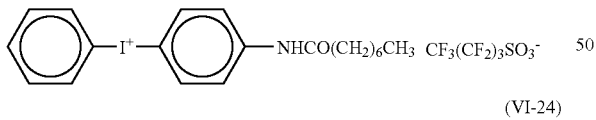
(VI-24) 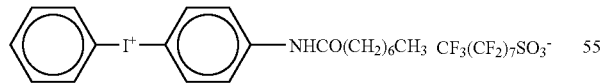
(VI-25) 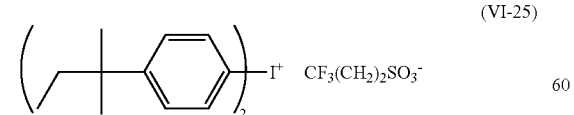
(VI-26) 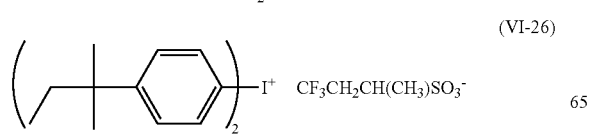
-continued
(VI-27) 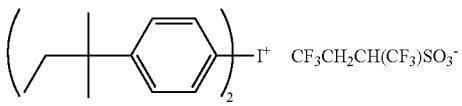
(VI-28) 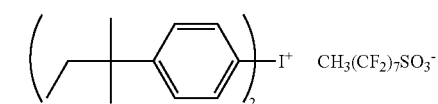
(VI-29) 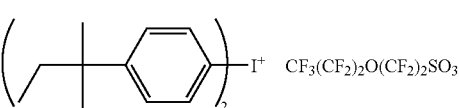
(VI-30) 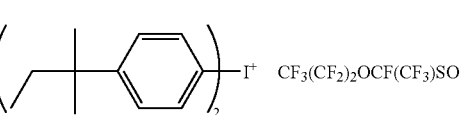
(VI-31) 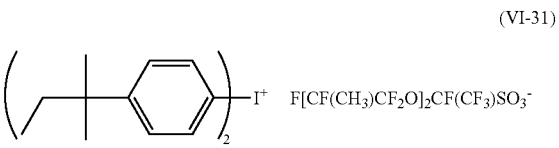
(VI-32) 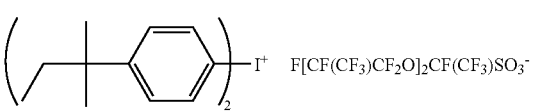
(VII-1) 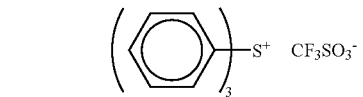
(VII-2) 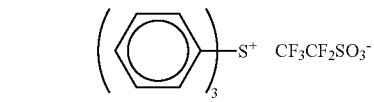
(VII-3) 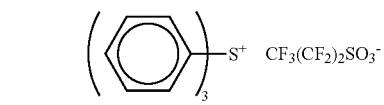
(VII-4) 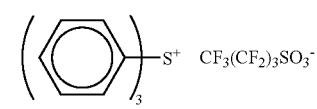
(VII-5) 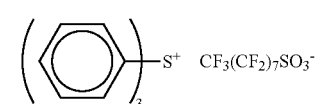
(VII-6) 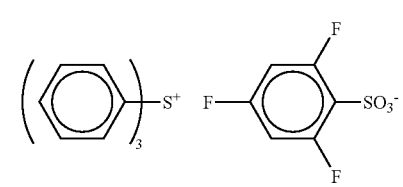
(VII-7) 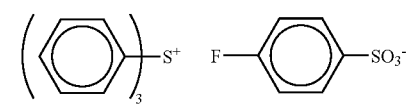

-continued
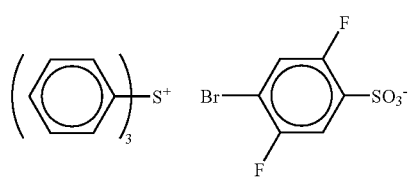 (VII-8)
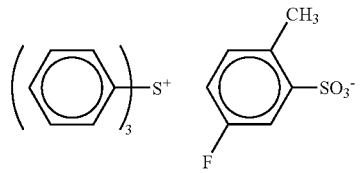 (VII-9)
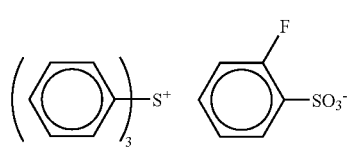 (VII-10)
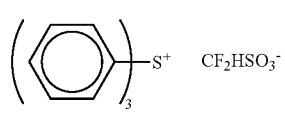 (VII-11)
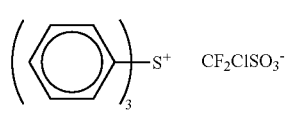 (VII-12)
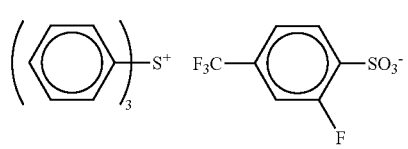 (VII-13)
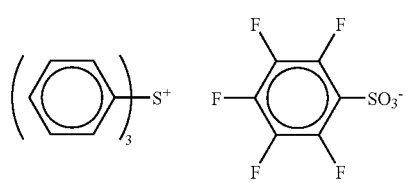 (VII-14)
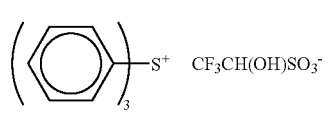 (VII-15)
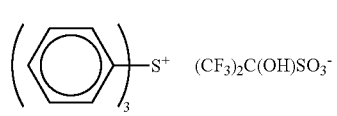 (VII-16)
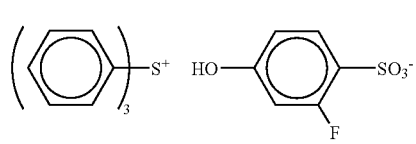 (VII-17)
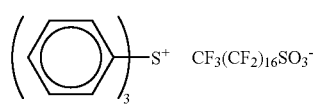 (VII-18)
-continued
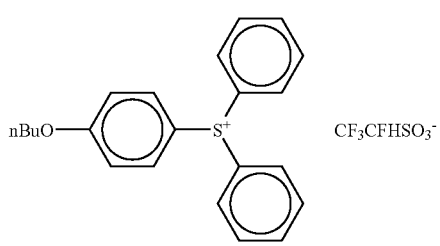 (VII-19)
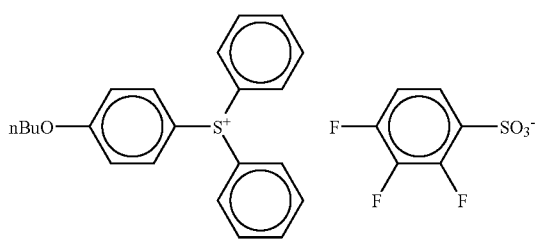 (VII-20)
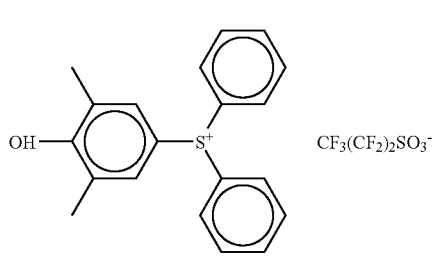 (VII-21)
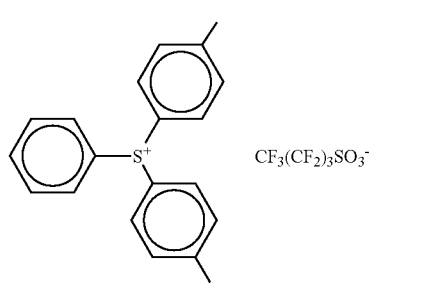 (VII-22)
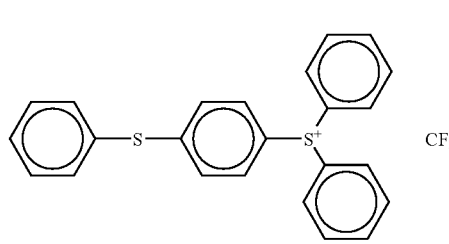 (VII-23)
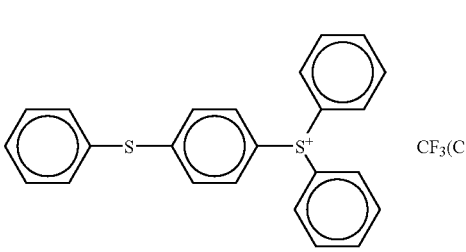 (VII-24)

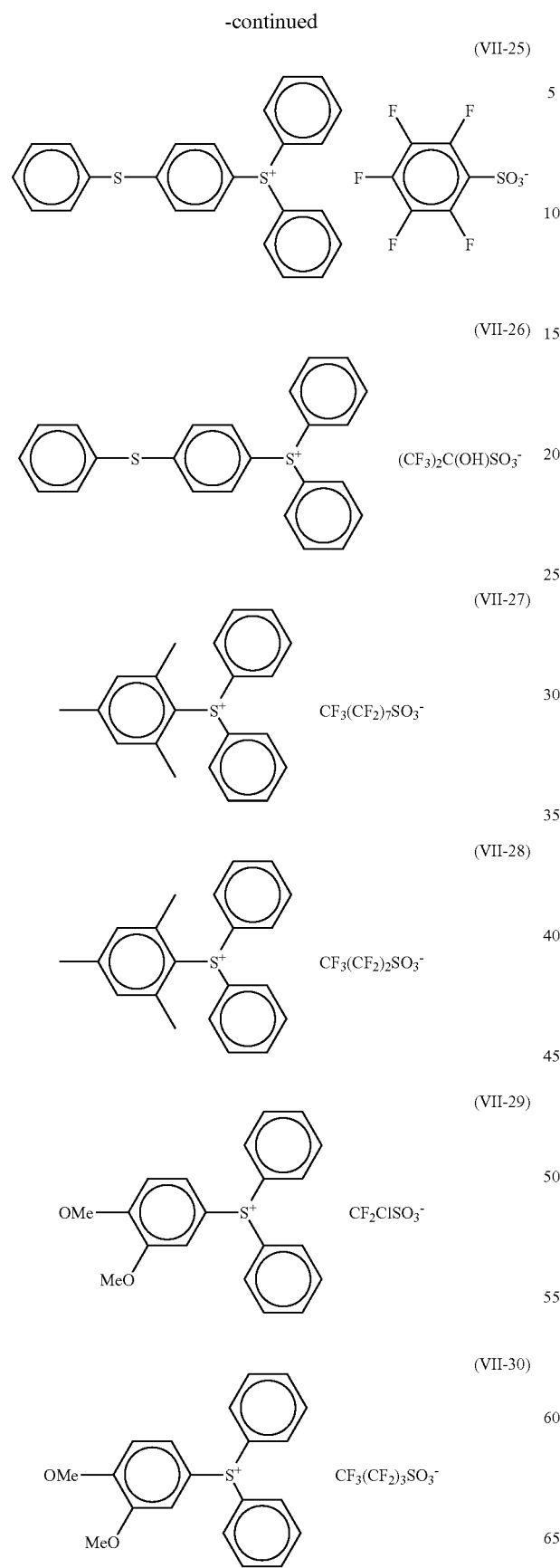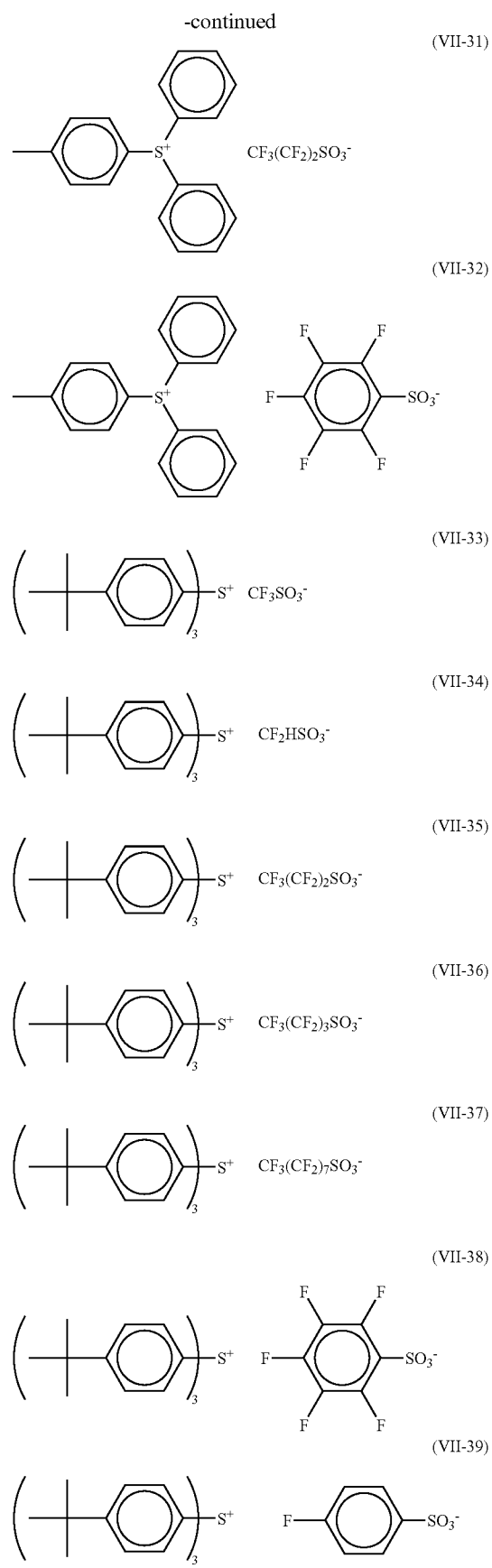

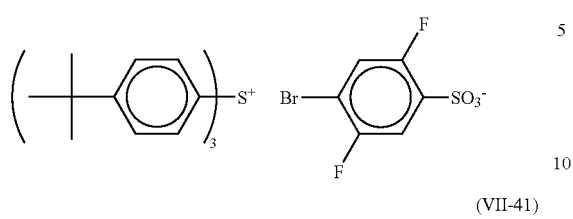
(VII-40)
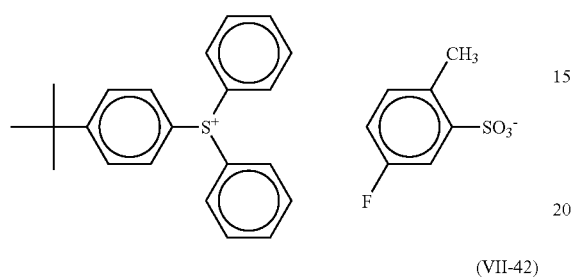
(VII-41)
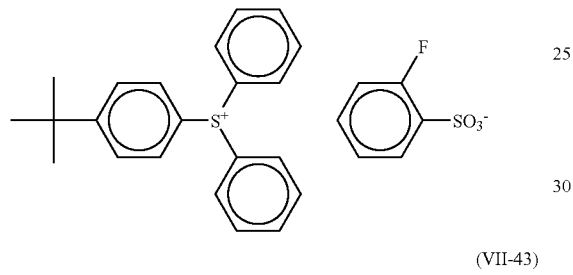
(VII-42)
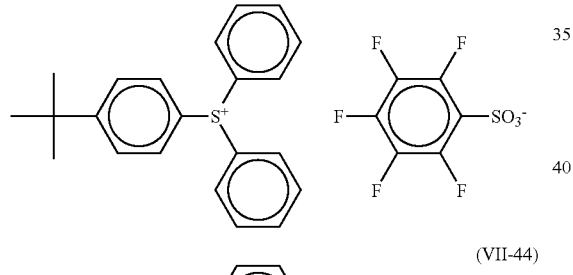
(VII-43)
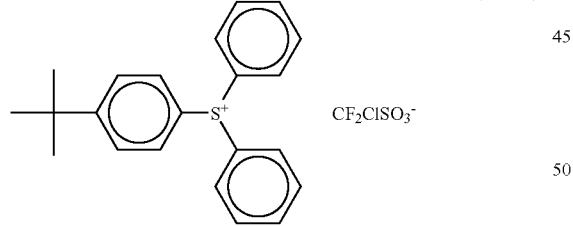
(VII-44)
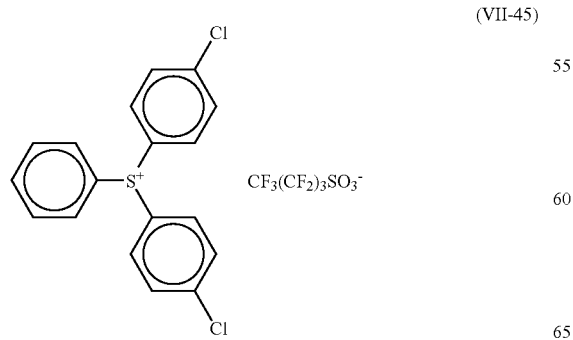
(VII-45)
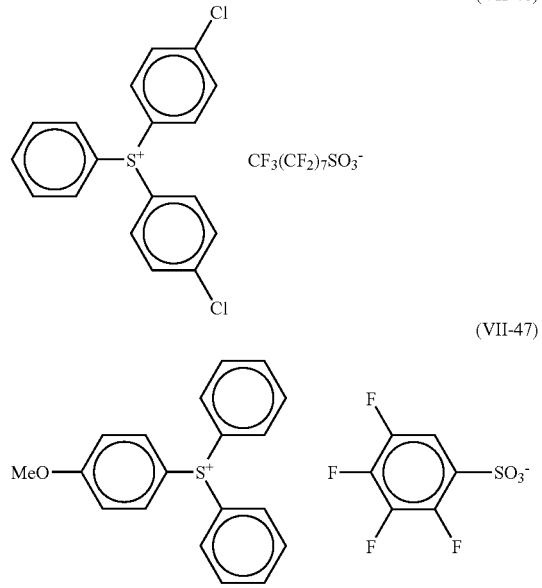
(VII-46)
(VII-47)
(VII-48)
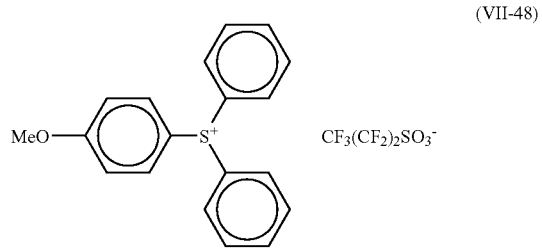
(VII-49)
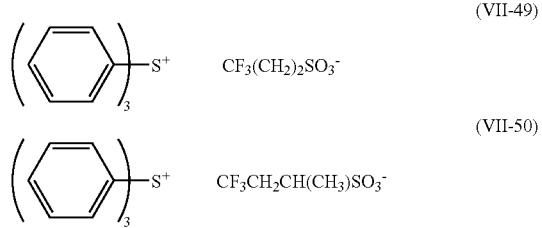
(VII-50)
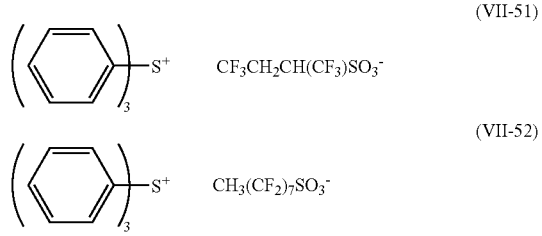
(VII-51)
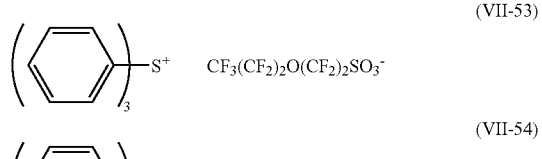
(VII-52)
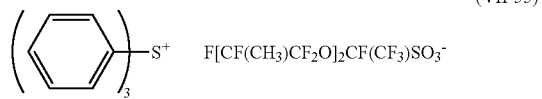
(VII-53)
(VII-54)
(VII-55)

(VII-56)

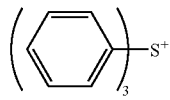 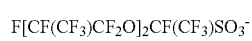

(B2) The compounds which generate sulfonic acid containing no fluorine by the radiation of an actinic ray or a radiation can include, for example, iodonium salts and sulfonium salts where Z⁻ is sulfonate anion containing no fluorine in the previous general formulae (PAG3) and (PAG4).

Specific examples include the compounds shown below, but are not limited thereto.

(PAG3-1)

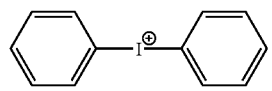

(PAG3-2)

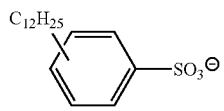

(PAG3-5)

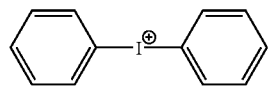

(PAG3-7)

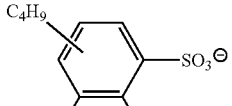

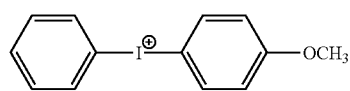

(PAG3-9)

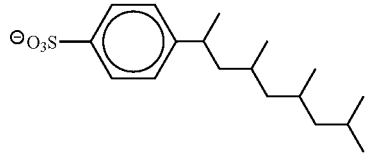

(PAG3-10)

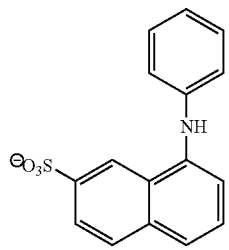

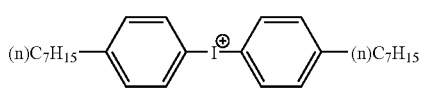

(PAG3-11)

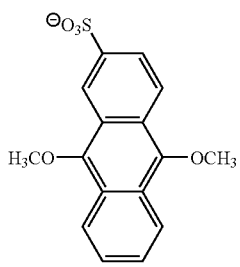

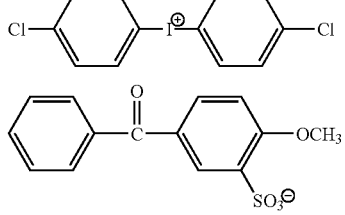

(PAG3-13)

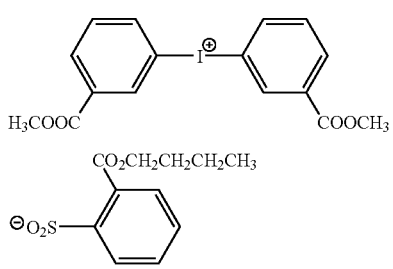

(PAG3-14)

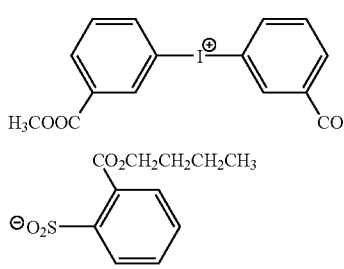

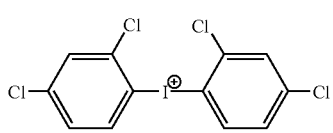

(PAG3-15)

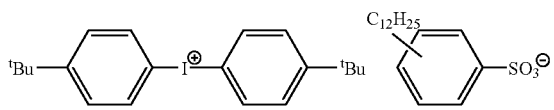

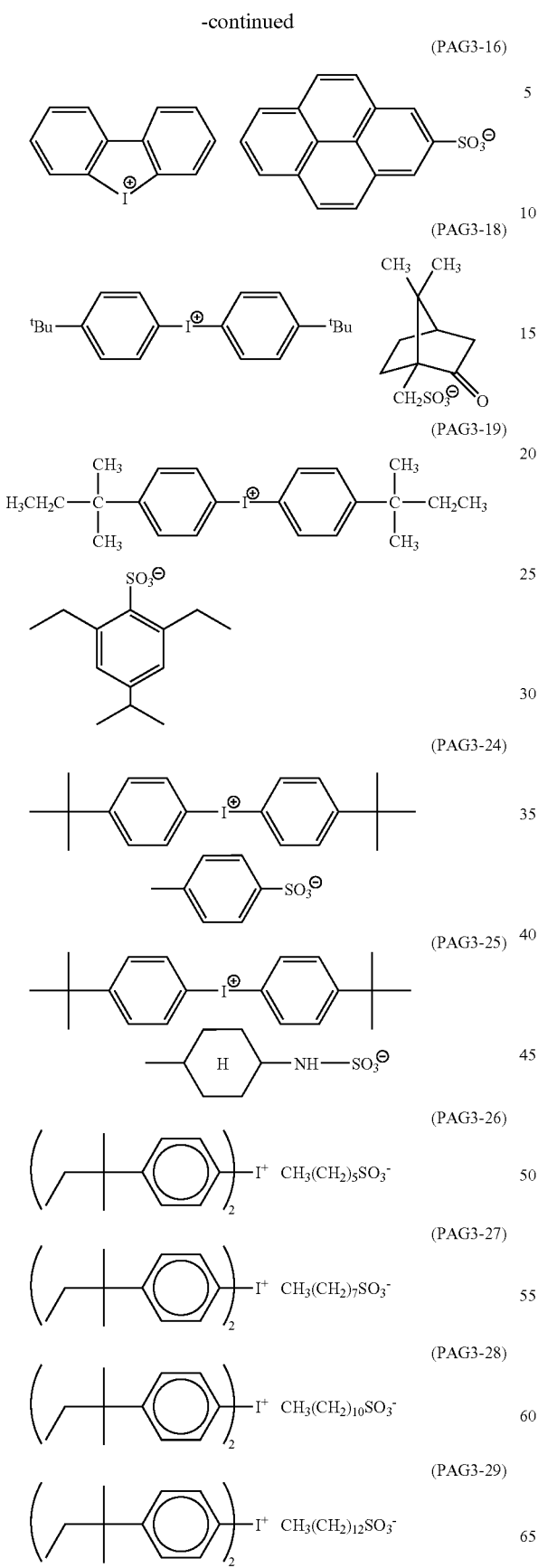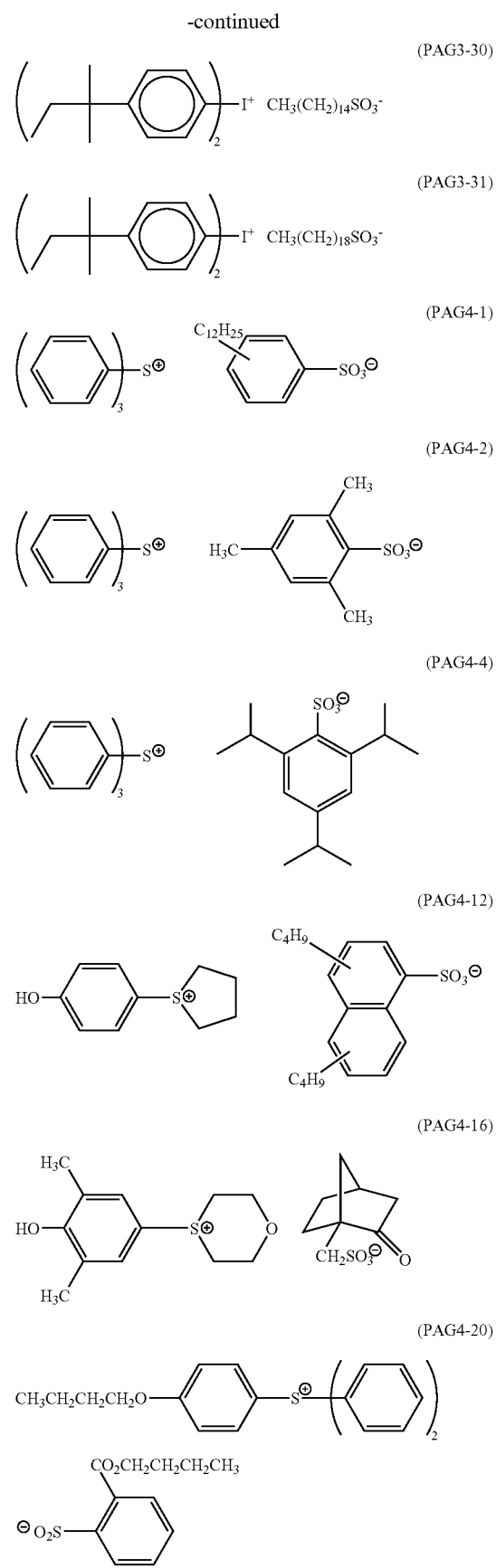

-continued

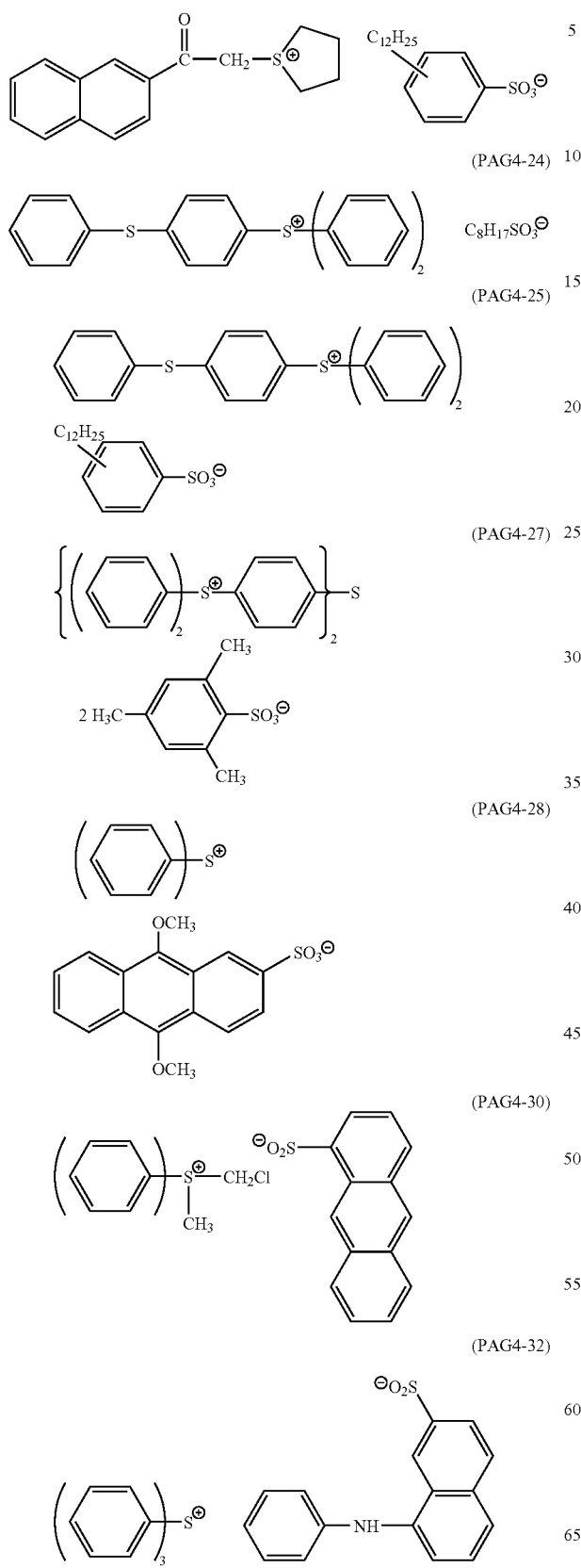

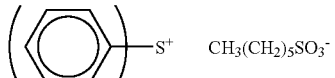
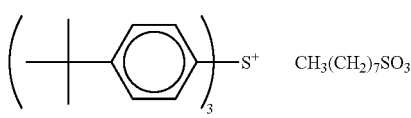
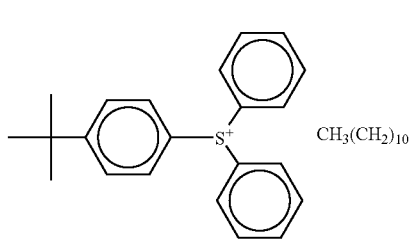
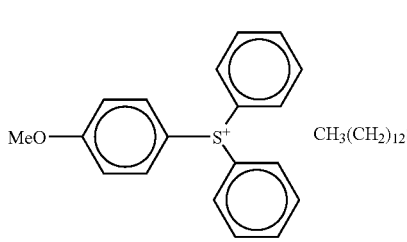
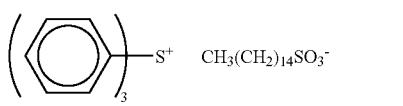
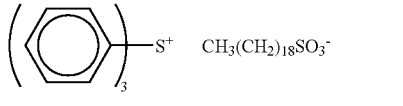
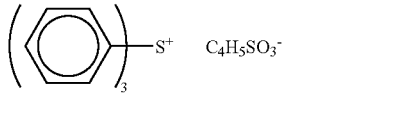

Also, it is possible to include disulfone derivatives represented by the following general formula (PAG5) or iminosulfonate derivatives represented by the general formula (PAG6).

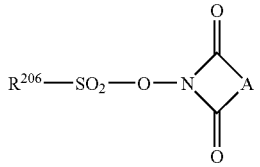

Wherein $Ar^3$ and $Ar^4$ denote each independently substituted or unsubstituted aryl groups. $R^{206}$ denotes a substituted or unsubstituted alkyl or aryl group. A denotes a substituted or unsubstituted alkylene, alkenylene or arylene group.

Specific examples include the compounds shown below, but are not limited thereto.

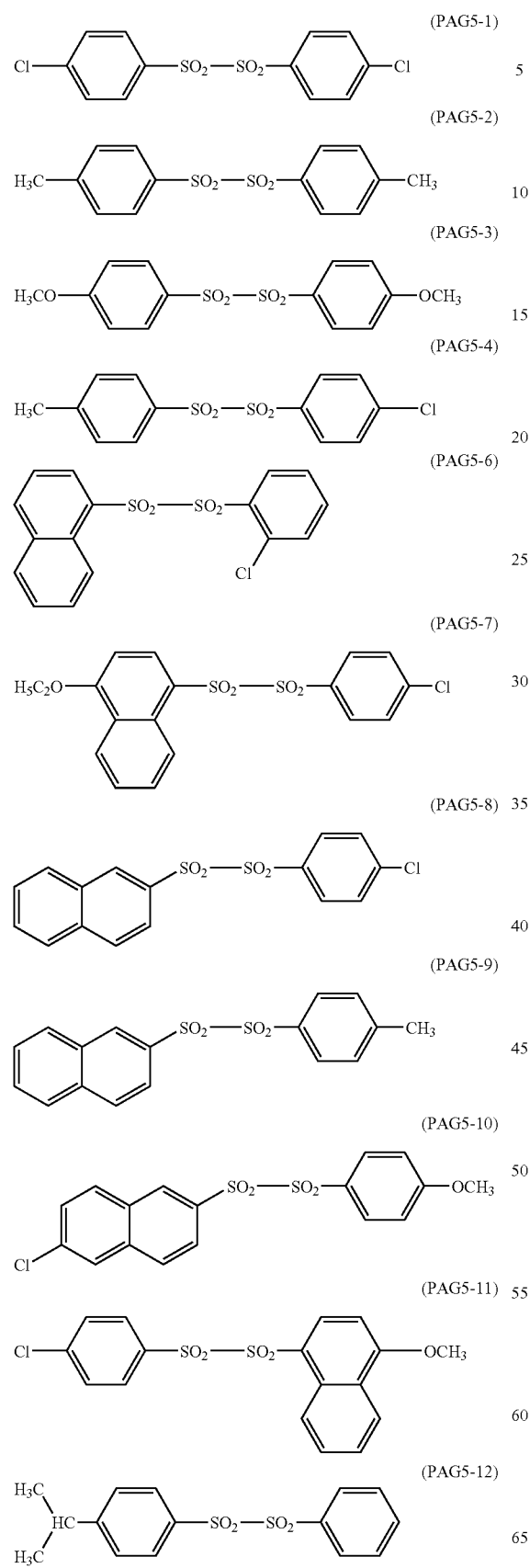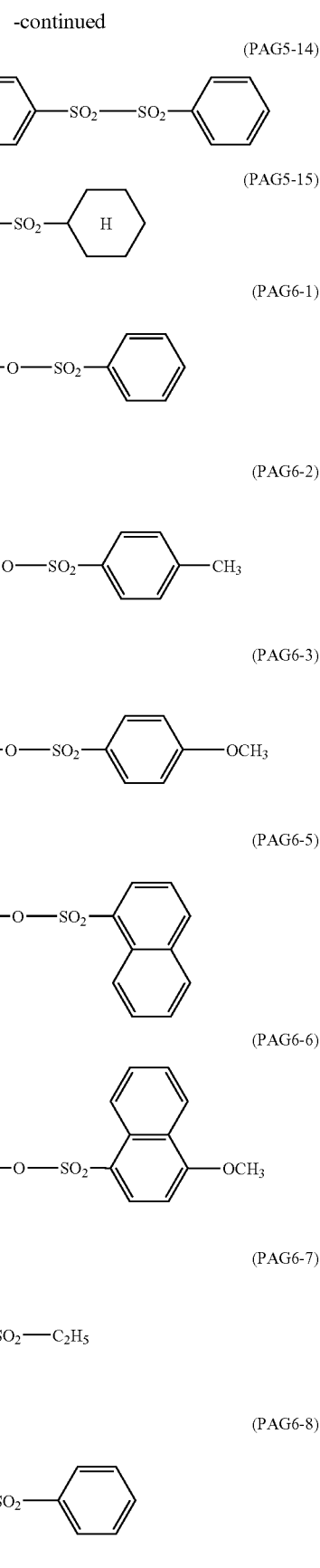

-continued (PAG6-9)
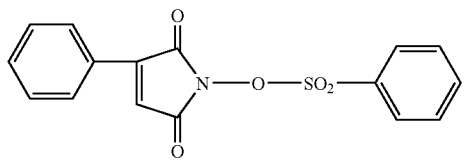

(PAG6-10)
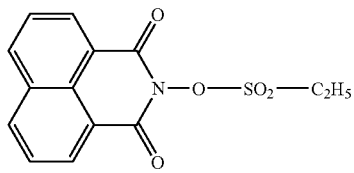

(PAG6-11)
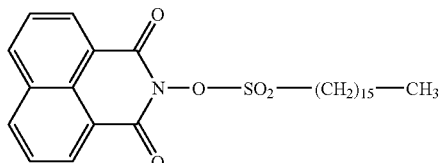

(PAG6-12)
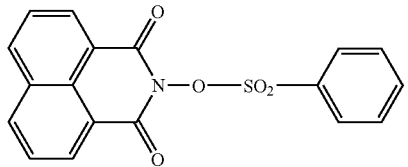

(PAG6-17)
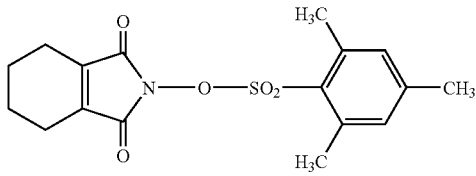

(PAG6-20)
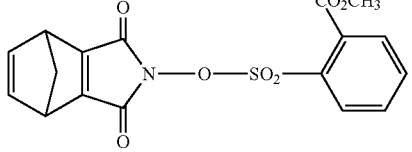

(PAG6-22)
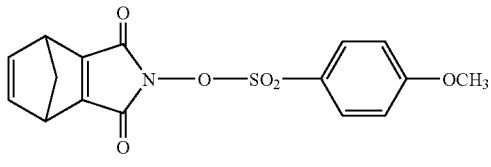

Also, it is possible to include diazosulfone derivatives represented by the following general formula (PAG7).

(PAG7)
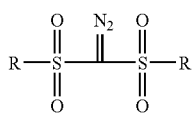

Wherein, R represents a linear, branched or cyclic alkyl group, or an aryl group which may be substituted.

Specific examples include the compounds shown below, but are not limited thereto.

(PAG7-1)
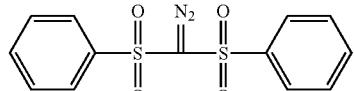

(PAG7-2)
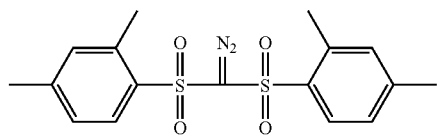

(PAG7-3)
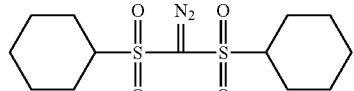

(PAG7-4)
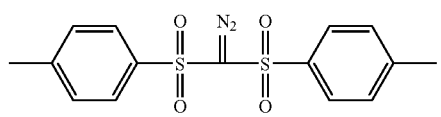

(PAG7-5)
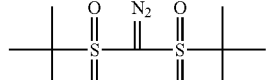

The compounds illustrated in the above (B1) and (B2) can be synthesized by reacting an aromatic compound using periodate and salt-exchanging the resultant iodonium salt to corresponding sulfonic acid.

Also, they can be synthesized by reacting substituted or non-substituted phenylsulfoxide with an aryl Grignard reagent such as aryl magnesium bromide, and salt-exchanging the resultant triaryl sulfonium halide to corresponding sulfonic acid. Also, they can be synthesized by the method where substituted or non-substituted phenylsulfoxide and the corresponding aromatic compound are condensed using an acid catalyst such as methane sulfonate/phosphorus pentoxide or aluminium chloride, and the salt is exchanged, and the method where diaryl iodonium salt and diarylsulfide are condensed using the catalyst such as copper acetate, and the salt is exchanged.

The salt exchange can be carried out by the method where once leading to a halide salt, which is subsequently converted to sulfonic acid salt using a silver reagent such as silver oxide, or also by using an ion exchange resin. For sulfonic acid or sulfonic acid salt used for the salt exchange, commercially available ones can be used, or they can be obtained by hydrolysis of commercially available sulfonate halide.

(B3) Illustrated are the compounds which generate fluorine containing carboxylic acid by the radiation of the active light or the radioactive ray.

Aliphatic carboxylic acids substituted with fluorine include fluorine substitution products of the aliphatic carboxylic acids such as acetic acid, propionic acid, n-butyric acid, isobutyric acid, valeric acid, trimethylacetate, caproic acid, heptoic acid, caprylic acid, lauric acid, myristic acid, palmitic acid, stearic acid, undecanoic acid, dodecanoic acid, and tridecanoic acid. These may have hydroxyl, alkoxy groups, and halogen atoms as the substituents. Also, those including linking groups such as oxygen, sulfur atoms, carbonyl, carboxyl, sulfonyl groups and the like in their aliphatic chains are preferable.

Preferable fluorine-substituted aliphatic carboxylic acids can include those represented by the following general formula:

L—$(CH_2)p(CF_2)q(CH_2)r$—COOH.

In the general formula, L represents a hydrogen or fluorine atom, p and r each independently represent an integer of 1 to 15, and q represents an integer of 1 to 15. The hydrogen or fluorine atoms of the alkyl chain in this general formula may be substituted with alkyl groups (preferably of 1 to 5 carbons) which may be substituted with fluorine atoms, alkoxy groups (preferably of 1 to 5 carbons) which may be substituted with fluorine atoms, or a hydroxyl group.

It is preferable that the above fluorine-substituted aliphatic carboxylic acids are preferably fluorine substitution products of saturated aliphatic carboxylic acids of 2 to 20 carbons, and more preferably from 4 to 20 carbons. Being 4 or more carbons reduces dispersion of the generated carboxylic acid degradability, and can further repress changes of line width due to the elapsed time from the exposure to post-heating. Among others, preferred are fluorine substitution products of linear or branched saturated aliphatic carboxylic acid of 4 to 18 carbons.

Also, the above fluorine-substituted aromatic carboxylic acids are preferably fluorine-substitution products of aromatic carboxylic acids where the carbons are from 7 to 20, more preferably from 7 to 15, and still preferably from 7 to 11. Specifically, they include fluorine-substitution products of aromatic carboxylic acids such as benzoic acid, substituted benzoic acid, naphthoic acid, substituted naphthoic acid, anthracene carboxylic acid, substituted anthracene carboxylic acid (here, the substituents include alkyl, alkoxy, hydroxyl groups, halogen atoms, aryl, acyl, acyloxy, nitro, alkylthio, and arylthio groups). Among others, fluorine-substitution products of benzoic acid and substituted benzoic acid are preferable.

These aliphatic or aromatic carboxylic acids substituted with fluorine are those where one or more hydrogen atoms present on a skeleton other than the carboxylic group are substituted with fluorine atoms, and in particular are preferably the aliphatic or aromatic carboxylic acids where all hydrogen atoms present on skeletons other than the carboxylic groups are substituted with fluorine atoms (perfluoro saturated aliphatic carboxylic acids or perfluoro aromatic carboxylic acids). This makes the sensitivity more excellent.

For aliphatic carboxylate anion, in particular, the anion having the fluorine atom on the a carbon of the carboxylic acid is high in acid strength. Also, the perfluoro aliphatic carboxylic acid is higher in acid strength.

Preferably included are onium salt compounds (sulfonium salts, iodonium salts etc.) having anion of the above aliphatic or aromatic carboxylic acid substituted with fluorine atoms as a counter ion, imidocarboxylate compounds having carboxylate ester groups or nitrobenzylester compounds.

More preferably the compounds represented by the following general formulae (I) to (III) are included. This makes the sensitivity, resolution and exposure margin more excellent. By radiating an actinic ray or a radiation this compound generates the saturated aliphatic or aromatic carboxylic acid substituted with at least one fluorine atom corresponding to $X^-$ of the general formulae (I) to (III) to work as the photoacid generator.

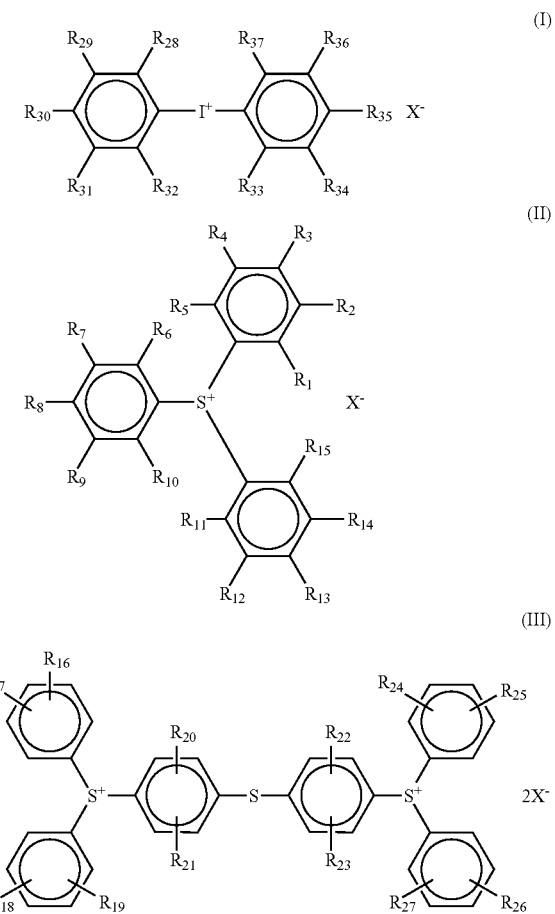

(In the above formulae, $R_1$ to $R_{37}$ each independently represent hydrogen atoms, linear, branched or cyclic alkyl groups, linear, branched or cyclic alkoxy groups, hydroxy groups, halogen atoms, or —S—$R_{38}$. Here, $R_{38}$ represents a linear, branched or cyclic alkyl or aryl group. $X^-$ is anion of aliphatic or aromatic carboxylic acid substituted with at least one fluorine atom.)

$X^-$ is preferably the anion of perfluoro aliphatic carboxylic acid or perfluoro aromatic carboxylic acid, and particularly preferably the anion of fluorine-substituted alkyl carboxylic acid of 4 or more carbons.

The linear or branched alkyl groups of $R_1$ to $R_{38}$ in the general formulae (I) to (III) include those of 1 to 4 carbons such as methyl, ethyl, propyl, n-butyl, sec-butyl, and t-butyl groups which may have substituents. The cyclic alkyl groups include those of 3 to 8 carbons such as cyclopropyl, cyclopentyl and cyclohexyl groups which may have substituents.

The alkoxy groups of $R_1$ to $R_{37}$ include those of 1 to 4 carbons such as methoxy, ethoxy, hydroxyethoxy, propoxy, n-butoxy, isobutoxy, sec-butoxy and t-butoxy groups.

The halogen atoms of $R_1$ to $R_{37}$ can include fluorine, chlorine, bromine and iodine atoms.

The aryl groups of $R_{38}$ include those of 6 to 14 carbons such as phenyl, tolyl, methoxyphenyl and naphthyl groups. The aryl group may have substituents.

These substituents include preferably alkoxy groups of 1 to 4 carbons, halogen atoms (fluorine, chlorine and iodine atoms), aryl groups of 6 to 10 carbons, alkenyl groups of 2 to 6 carbons, cyano, hydroxy, carboxy, alkoxycarbonyl nitro groups and the like.

The iodonium or sulfonium compound represented by the general formulae (I) to (III) used for the invention has the anion of saturated aliphatic or aromatic carboxyl acid substituted with at least one fluorine atom as its counter ion, X⁻. These anions are the anions (—COO⁻) by dissociating a hydrogen atom from the carboxylic acid (—COOH).

Specific examples are shown below, but the invention is not limited thereto.

Specific examples of the photoacid generators represented by the general formula (I): (I-1f) to (I-36f):

(I-1f)
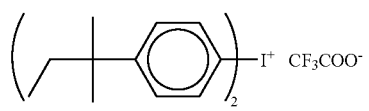

(I-2f)
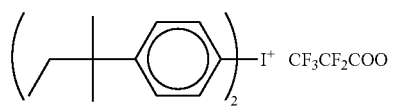

(I-3f)
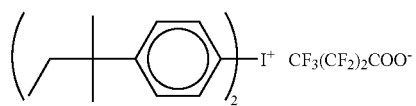

(I-4f)
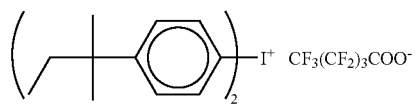

(I-5f)
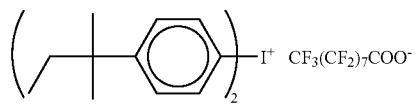

(I-6f)
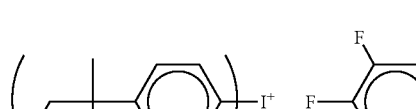

(I-7f)
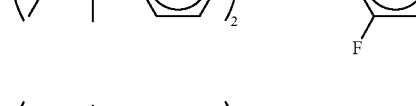

(I-8f)
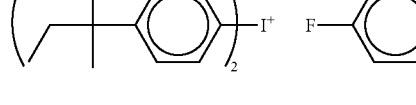

(I-9f)
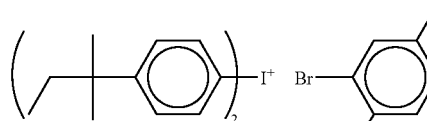

-continued (I-10f)
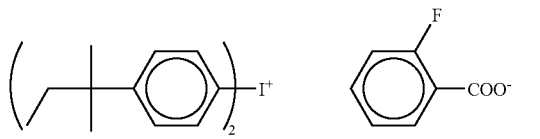

(I-11f)
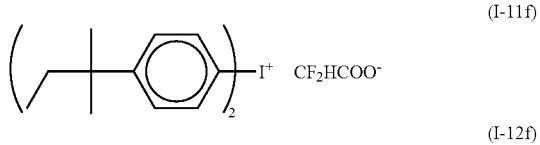

(I-12f)
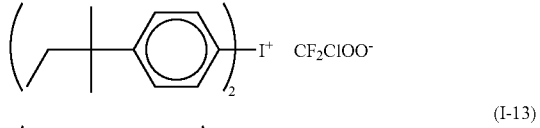

(I-13)
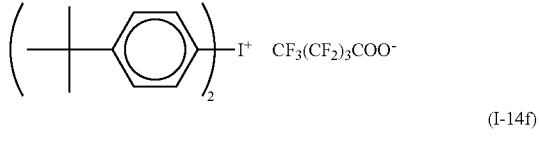

(I-14f)
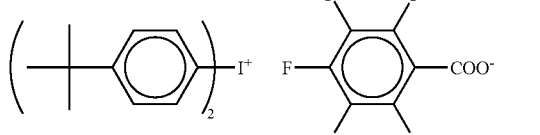

(I-15f)
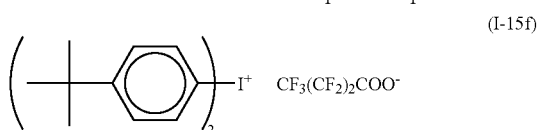

(I-16f)
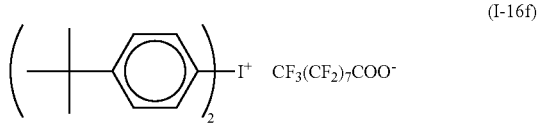

(I-17f)
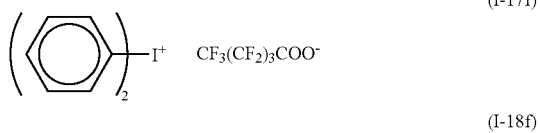

(I-18f)
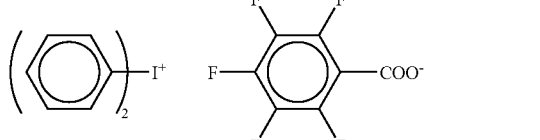

(I-19f)
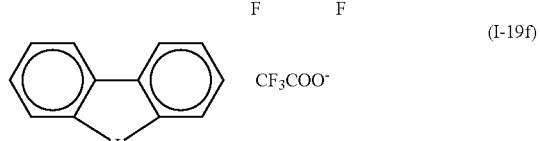

(I-20f)
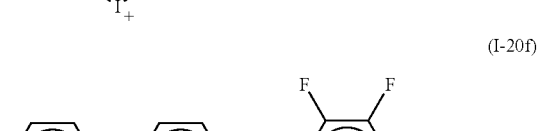

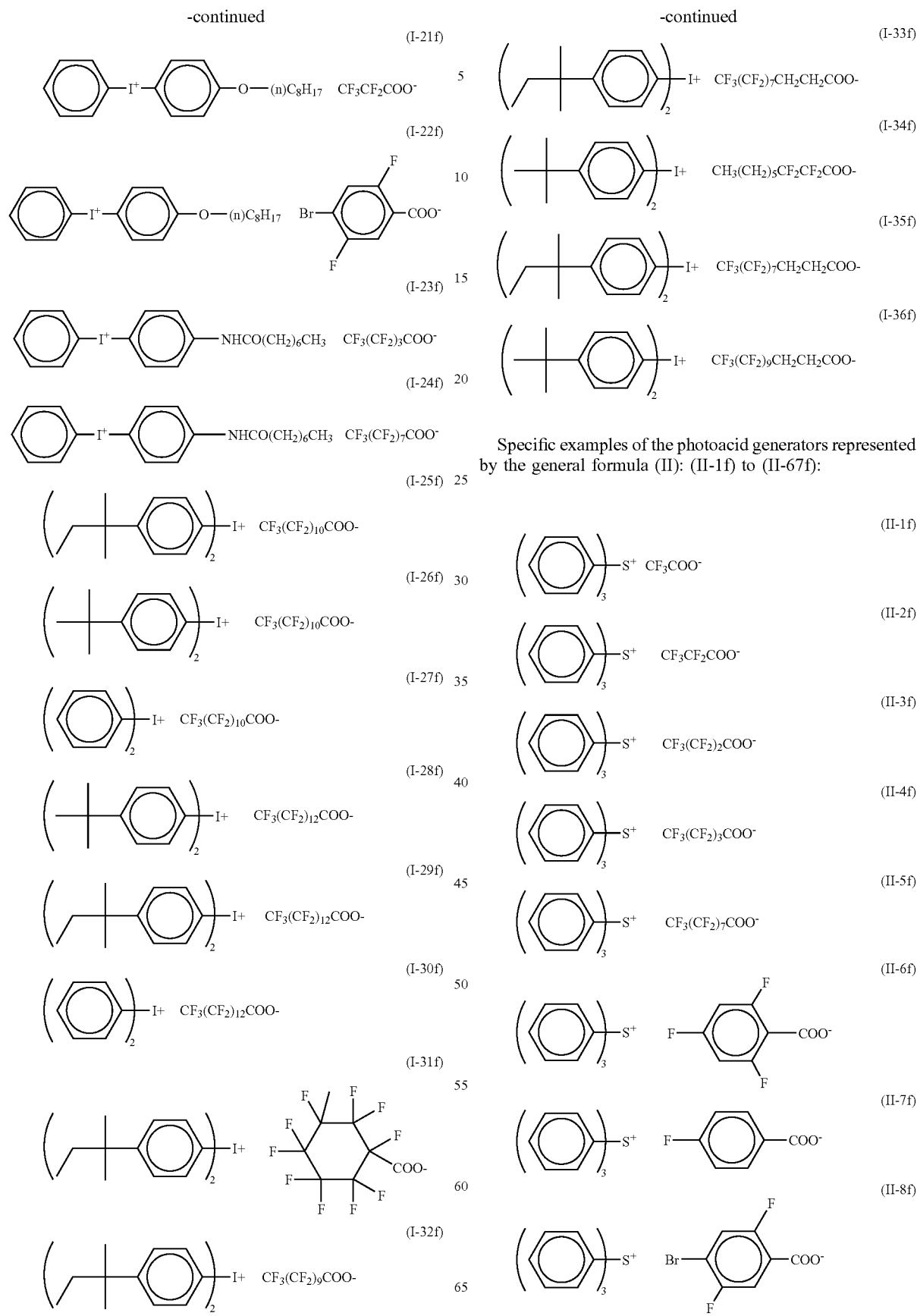
Specific examples of the photoacid generators represented by the general formula (II): (II-1f) to (II-67f):

-continued
(II-9f)
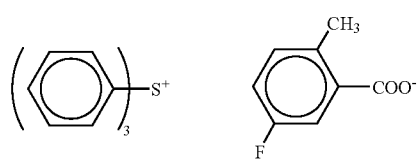
(II-10f)
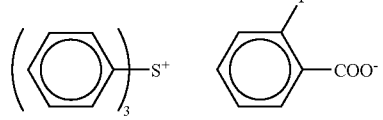
(II-11f)
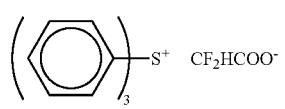
(II-12f)
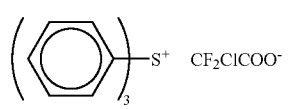
(II-13f)
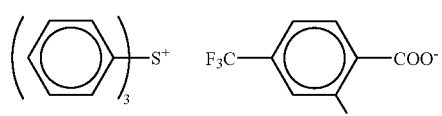
(II-14f)
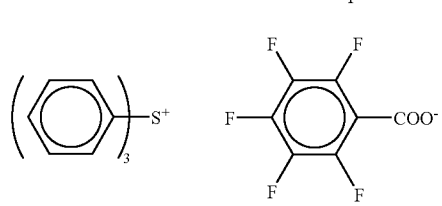
(II-15f)
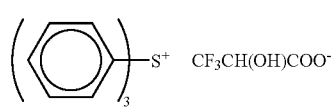
(II-16f)
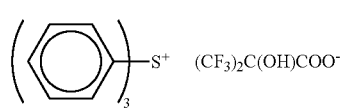
(II-17f)
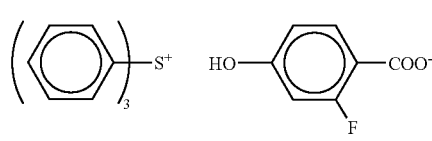
(II-18f)
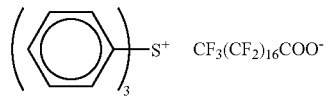
(II-19f)
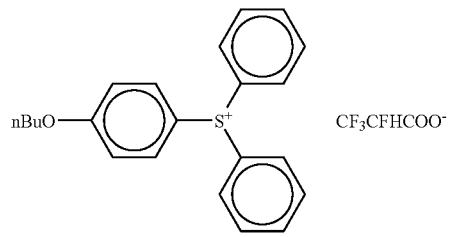
-continued
(II-20f)
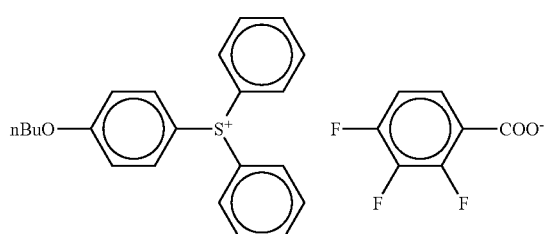
(II-21f)
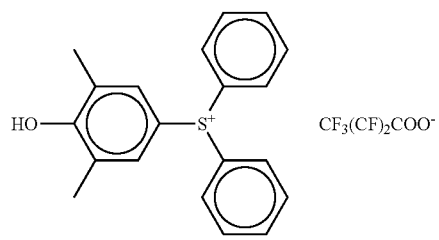
(II-22f)
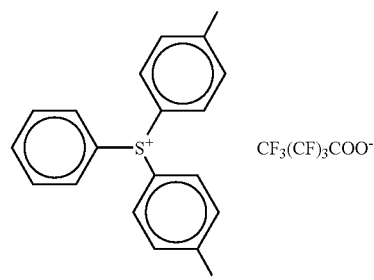
(II-23f)
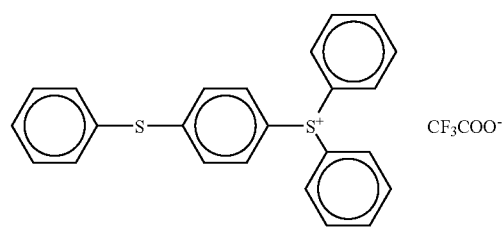
(II-24f)
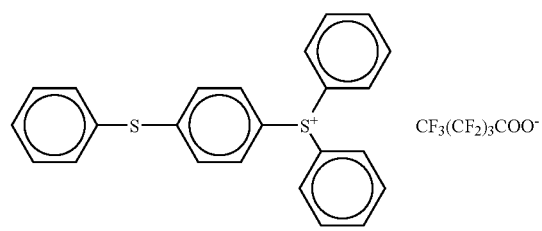
(II-25f)
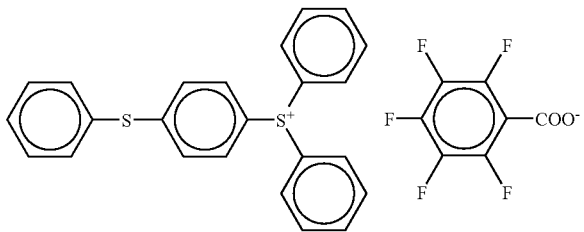

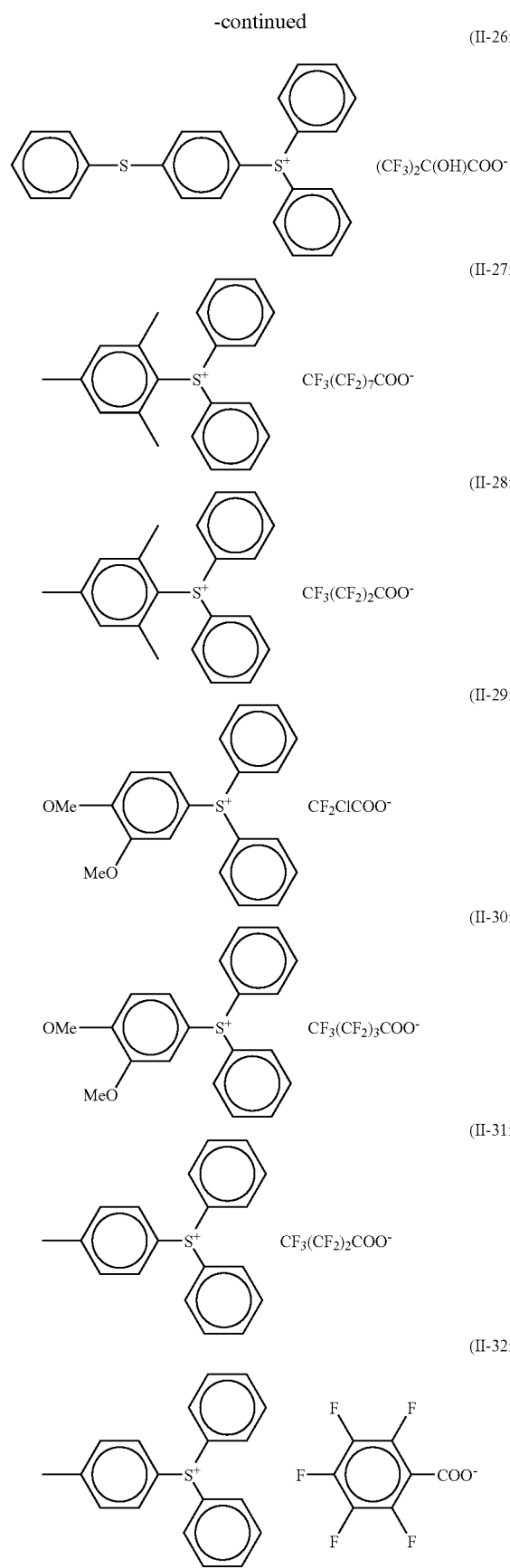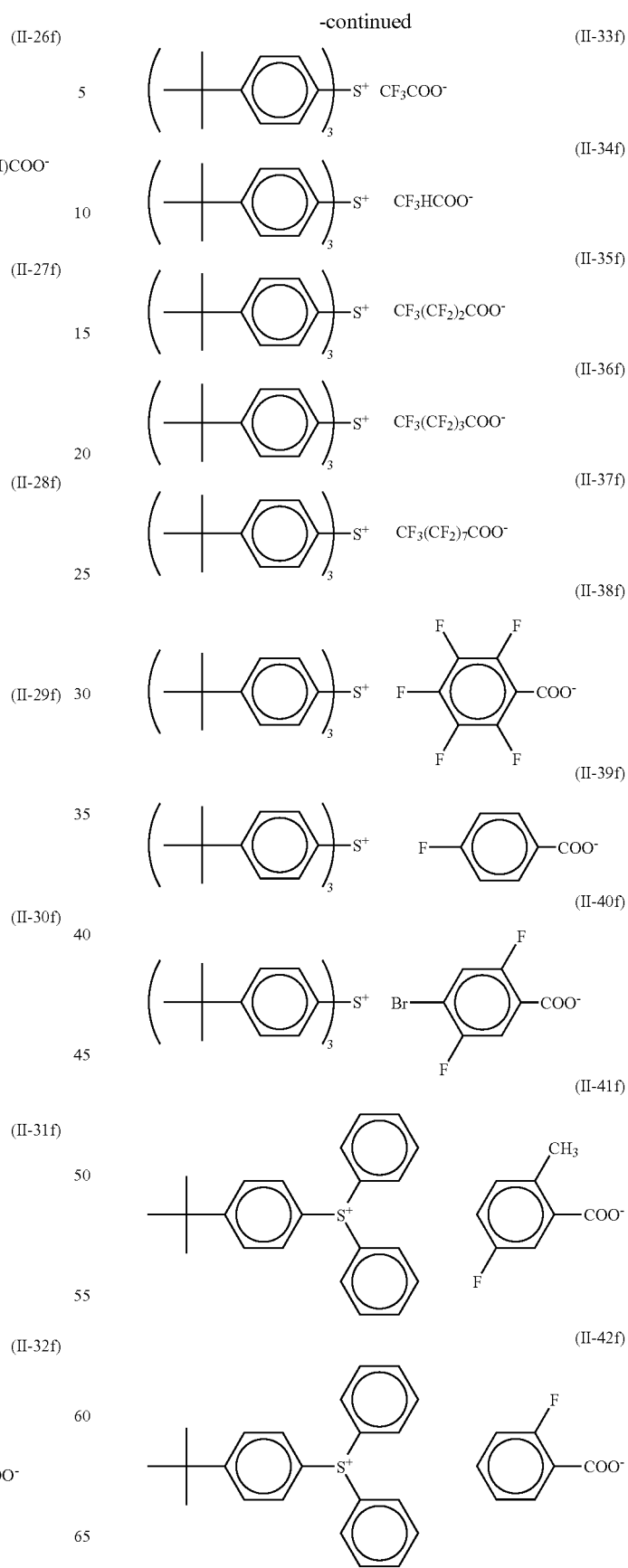

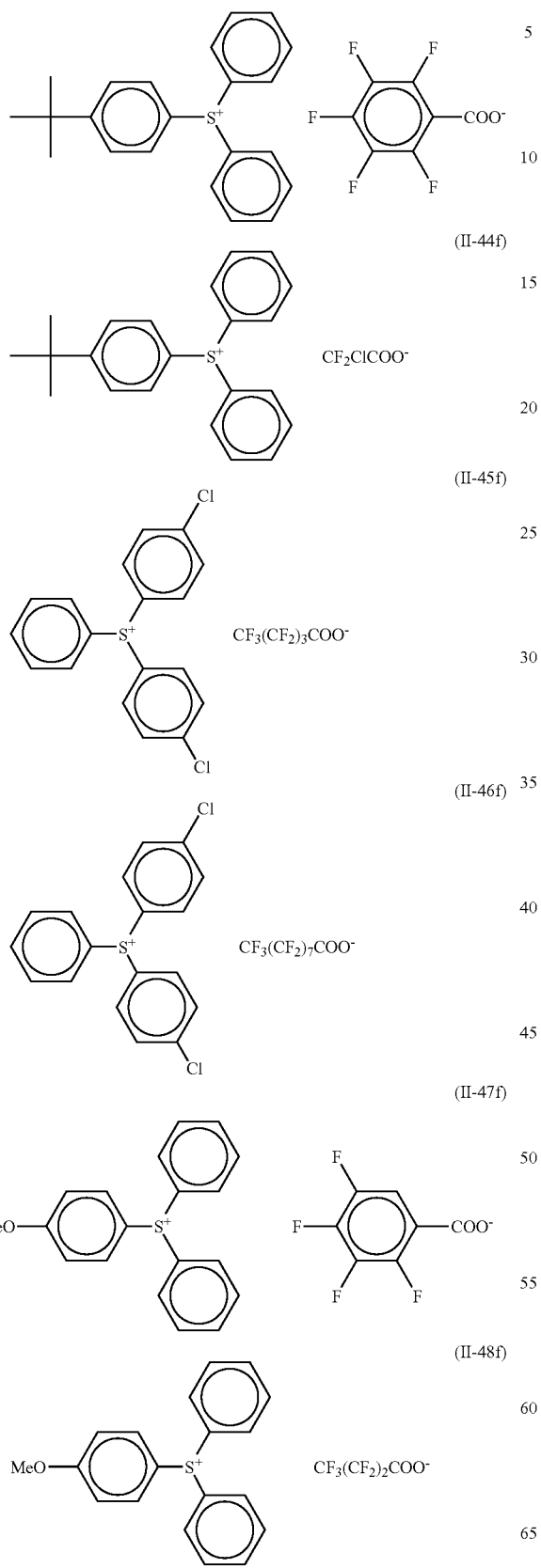
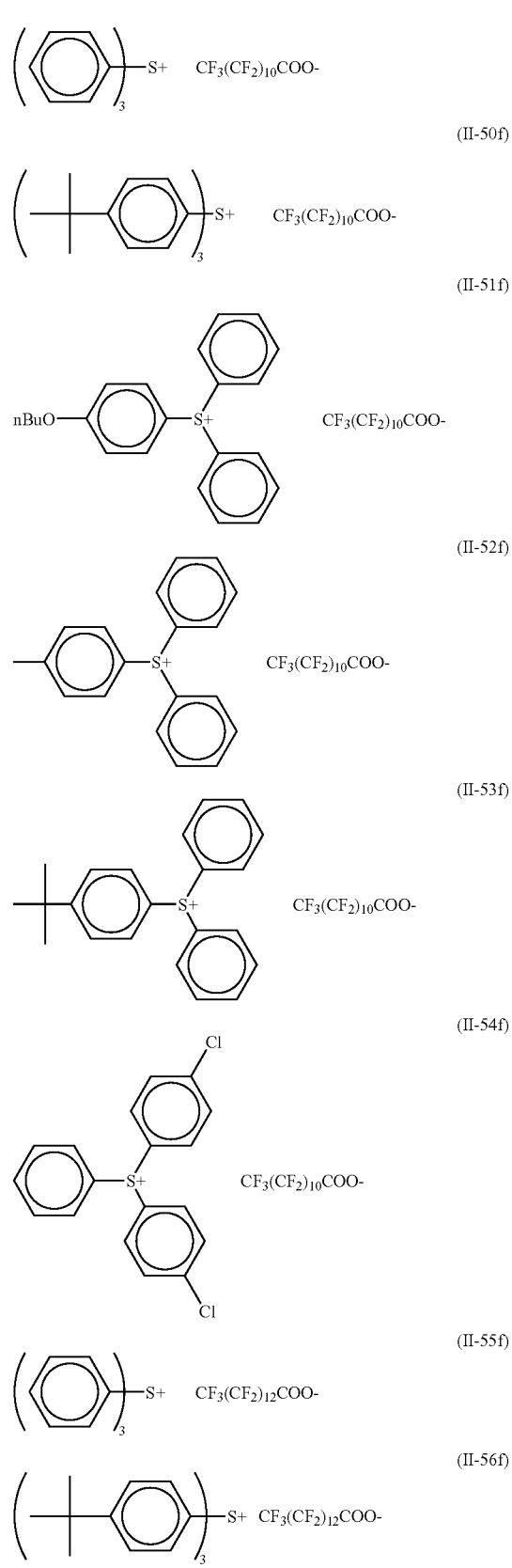

-continued
(II-57f)
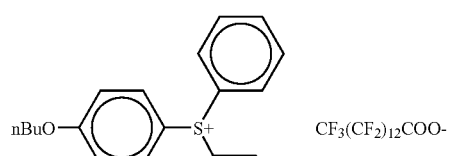
(II-58f)
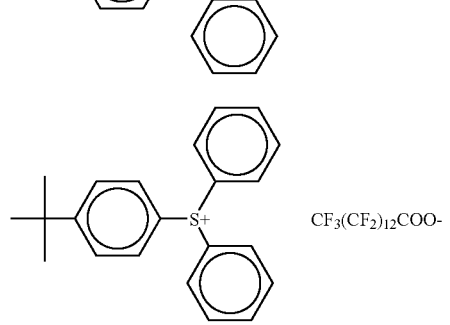
(II-59f)
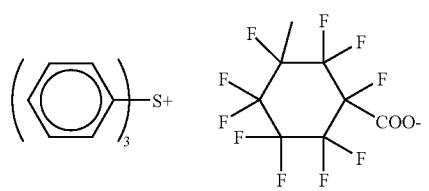
(II-60f)
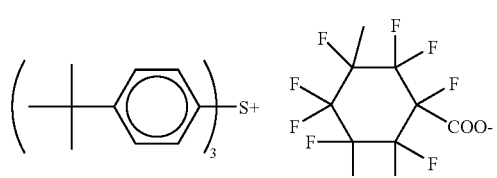
(II-61f)
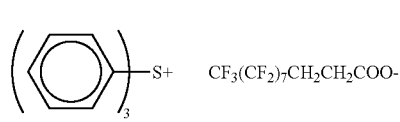
(II-62f)
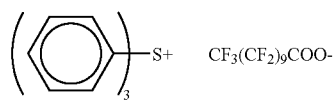
(II-63f)
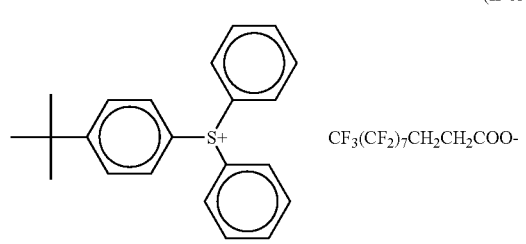
(II-64f)
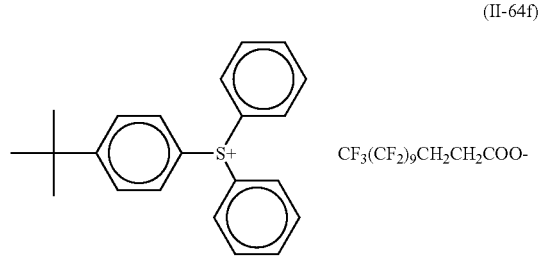
-continued
(II-65f)
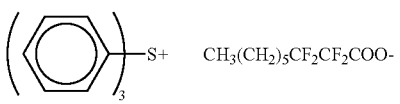
(II-66f)
(II-67f)
Specific examples of the photoacid generators represented by the general formula (III): (III-1f) to (III-4f):
(III-1f)
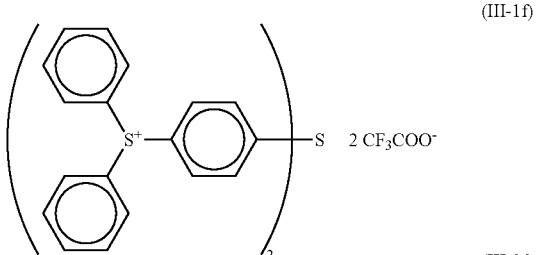
(III-2f)
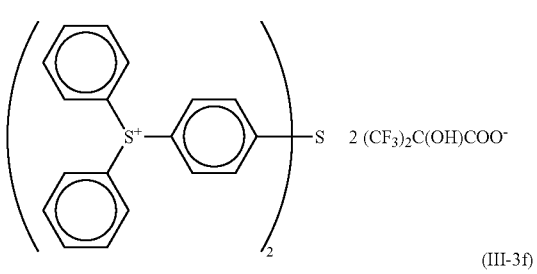
(III-3f)
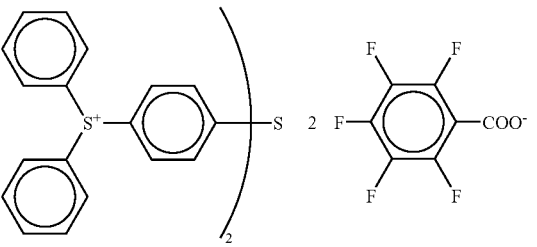
(III-4f)
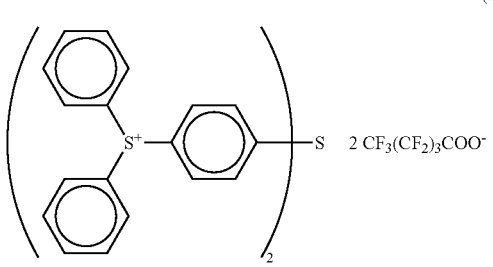

Specific examples of the other photoacid generators (IV-1f) to (V-4f)

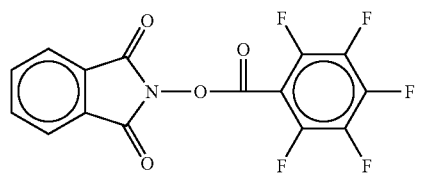 (IV-1f)

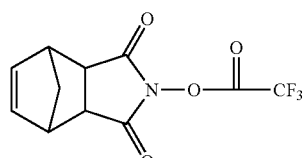 (IV-2f)

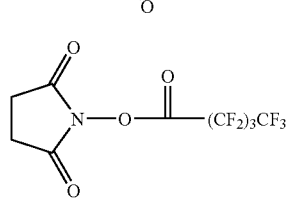 (IV-3f)

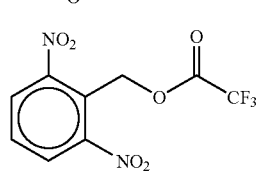 (V-1f)

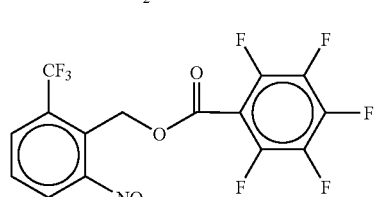 (V-2f)

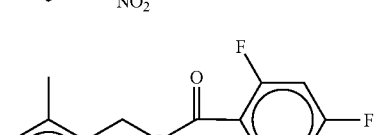 (V-3f)

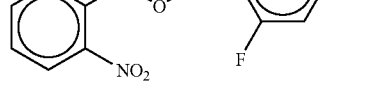 (V-4f)

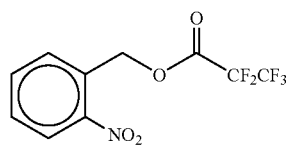

The compound represented by the above general formula can be synthesized by reacting an aromatic compound using periodate and salt-exchanging the resultant iodonium salt to corresponding sulfonic acid.

The compounds represented by the general formulae (II) or (III) can be synthesized, for example, by reacting substituted or non-substituted phenylsulfoxide with an aryl Grignard reagent such as aryl magnesium bromide, and salt-exchanging the resultant triaryl sulfonium halide to corresponding sulfonic acid. Also, they can be synthesized by the method where substituted or non-substituted phenylsulfoxide and the corresponding aromatic compound are condensed using an acid catalyst such as methane sulfonate/phosphorus pentoxide or aluminium chloride, and the salt is exchanged, and the method where diaryl iodonium salt and diarylsulfide are condensed using the catalyst such as copper acetate, and the salt is exchanged.

The salt exchange can be carried out by the method where once leading to a halide salt, which is subsequently converted to sulfonic acid salt using a silver reagent such as silver oxide, or also by using an ion exchange resin. For sulfonic acid or sulfonic acid salt used for the salt exchange, commercially available ones can be used, or they can be obtained by hydrolysis of commercially available sulfonate halide.

For fluorine-substituted carboxylic acid as the anion moiety, it is also preferred to use those derived from fluoro aliphatic compounds produced by a telomerization method (also referred to as a telomer method) or an oligomerization method(also referred to as an oligomer method). The methods for producing these fluoro aliphatic compounds are described, for example, in "Syntheses and functions of fluorine compounds" (Fussokagoubutsu no Gousei to Kinou) (Ed., N. Ishikawa, published by K.K. CMC, 1987), pages 117 to 118, and "Chemistry of Organic Fluorine Compounds II" (Monograph 187, Ed by M. Hudicky and A. E. Pavlath, American Chemical Society, 1995), pages 747 to 752. The telomerization method is the method where using alkyl halide such as iodide where a chain transfer constant is large as a telogen, radical polymerization of fluorine-containing vinyl compound such as tetrafluoroethylene is carried out to synthesize a telomer (the example is shown in Scheme 1). In the synthesis by the telomer method, a mixture of multiple compounds of which carbon chain lengths are different is obtained, but the mixture may be used as it is, or may be purified to use.

(B4) The compounds which generate carboxylic acid containing no fluorine by the radiation of an actinic ray or a radiation can include, for example, the compounds represented by the following general formulae (AI) to (AV), but are not limited thereto.

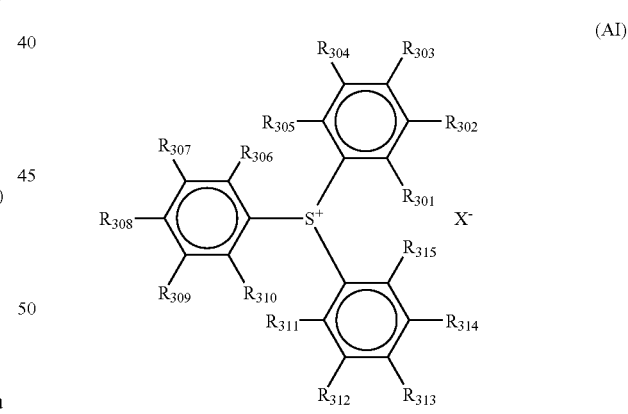 (AI)

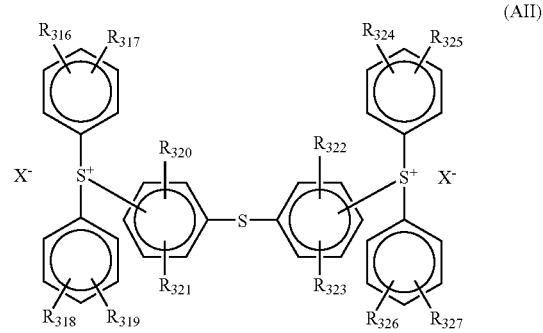 (AII)

-continued

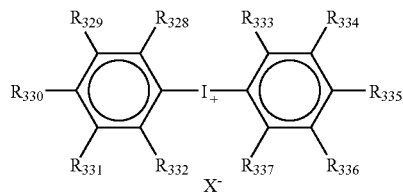
(AIII)

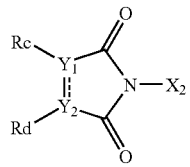
(AIV)

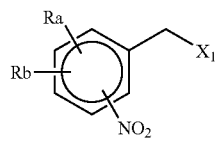
(AV)

the above formulae, $R_{301}$ to $R_{337}$ each independently represent hydrogen atoms, linear, branched or cyclic alkyl groups, linear, branched or cyclic alkoxy groups, hydroxy groups, halogen atoms, or —S—$R_0$ groups. $R_0$ represents a linear, branched or cyclic alkyl or aryl group.

Ra and Rb each independently represent hydrogen atoms, nitro groups, halogen atoms, alkyl or alkoxy groups which may have substituents. Rc and Rd each independently represent halogen atoms, alkyl or aryl groups which may have substituents. Rc and Rd may join to form an aromatic ring, or monocyclic or polycyclic, cyclic hydrocarbon (oxygen and nitrogen atoms may be included in these rings). $Y_1$ and $Y_2$ represent carbon atoms, and $Y_1$—$Y_2$ bond may be a single bond or double bond. The above X⁻ represents one where the carboxylate compound represented by the following formula has become the anion. $X_1$ and $X_2$ each independently represent those where the carboxylate compound represented by the following formula has become the ester group at the carboxyl group moiety.

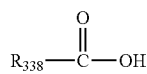
(C1)

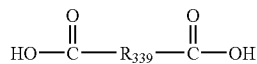
(C2)

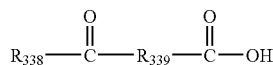
(C3)

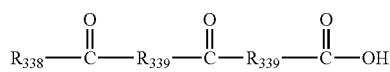
(C4)

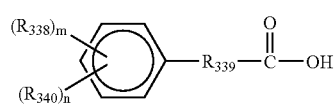
(C5)

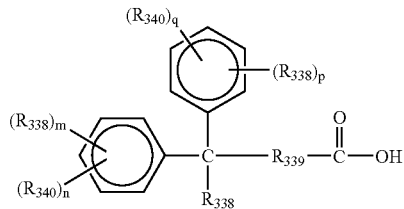
(C6)

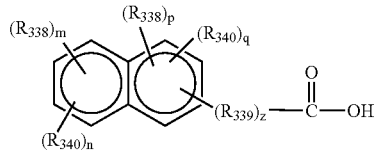
(C7)

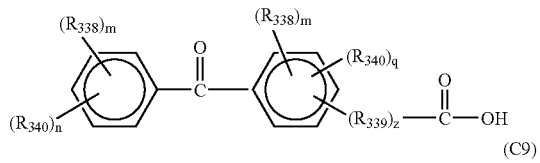
(C8)

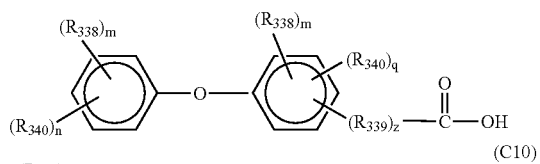
(C9)

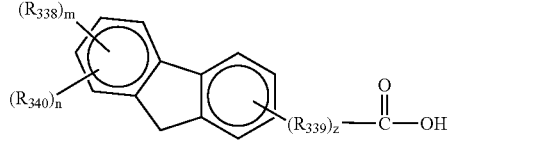
(C10)

In the above formulae, $R_{338}$ denotes a linear, branched or cyclic alkyl group of 1 to 30 carbons (here, the alkyl group may include oxygen and nitrogen atoms in its chain), a linear, branched or cyclic alkenyl group of 1 to 20 carbons, a linear, branched or cyclic alkynyl group of 1 to 20 carbons, a linear, branched or cyclic alkoxyl group of 1 to 20 carbons, a group where at least a part of hydrogen atoms in said alkyl group is substituted with halogen atoms and/or hydroxyl groups, a group where at least a part of hydrogen atoms in said alkenyl group is substituted with halogen atoms and/or hydroxyl groups, or a substituted or unsubstituted aryl group of 6 to 20 carbons. Here, the substituents of the aryl group can include alkyl, nitro, hydroxyl, alkoxy, acyl, alkoxycarbonyl groups and halogen atoms.

$R_{339}$ denotes a single bond, or a linear, branched or cyclic alkylene group of 1 to 20 carbons (here, the alkylene group may include oxygen and nitrogen atoms in its chain), a linear, branched or cyclic alkenylene group of 1 to 20 carbons, a group where at least a part of hydrogen atoms in said alkylene group is substituted with halogen atoms and/or hydroxyl groups, a group where at least a part of hydrogen atoms in said alkenylene group is substituted with halogen atoms, or an alkoxyalkylene group of 2 to 20 carbons. $R_{338}$ and $R_{339}$ which are present in plurality may be the same or different.

$R_{340}$ denotes a hydroxyl group or a halogen atom, and $R_{340}$ which are present in plurality may be the same or different one another. The symbols, m, n and q are each independently integers of 0 to 3, and m+n≦5, p+q≦5, and z is 0 or 1.

The linear or branched alkyl groups in $R_{301}$ to $R_{337}$, Ra, Rb, Rc, Rd and $R_0$ in the above general formulae (AI) to (AV) include those of 1 to 4 carbons such as methyl, ethyl, propyl, n-butyl, sec-butyl and t-butyl groups which may have substituents. The cyclic alkyl groups include those of 3 to 8 carbons such as cyclopropyl, cyclopentyl and cyclohexyl groups which may have substituents.

The alkoxy groups of $R_{301}$ to $R_{337}$, Ra and Rb include those of 1 to 4 carbons such as methoxy, ethoxy, hydroxyethoxy, propoxy, n-butoxy, isobutoxy, sec-butoxy and t-butoxy groups.

The halogen atoms of $R_{301}$ to $R_{337}$ can include fluorine, chlorine, bromine and iodine atoms.

The aryl groups of $R_0$, Rc and Rd include those of 6 to 14 carbons which may have substituents, such as phenyl, tolyl, methoxyphenyl and naphthyl groups.

These substituents include preferably alkoxy groups of 1 to 4 carbons, halogen atoms (fluorine, chlorine and iodine atoms), aryl groups of 6 to 10 carbons, alkenyl groups of 2 to 6 carbons, cyano, hydroxy, carboxy, alkoxycarbonyl nitro groups and the like.

The aromatic cyclic, monocyclic or polycyclic, cyclic hydrocarbon which Rc and Rd join to form includes benzene, naphthalene, cyclohexane, norbornene, oxabicyclo structures and the like.

The sulfonium or iodonium compound represented by the general formulae (AI) to (AIII) used for the invention encompasses at least one type of compound where the carboxyl group (—COOH) has become the anion (—COO—) among the carboxylate compounds represented by the above formulae (C1) to (C10), as its counter anion X⁻.

The compound represented by the general formulae (AIV) to (AV) used for the invention encompasses a substituent of at least one type of compound where the carboxyl group (—COOH) has become the ester group (—COO—) among the carboxylate compounds represented by the above formulae (C1) to (C10), as the substituents $X_1$ and $X_2$.

The linear, branched or cyclic alkyl groups of 1 to 30 carbons (here, the alkyl group may encompass oxygen and nitrogen atoms in its chain) in $R_{338}$ include methyl, ethyl, propyl, butyl, pentyl, hexyl, cyclohexyl, dodecyl, 1-ethoxyethyl, adamanthyl and the like.

The linear, branched or cyclic alkenyl groups of 1 to 20 carbons include ethenyl, propenyl, isopropenyl, cyclohexene and the like.

The linear, branched or cyclic alkynyl groups of 1 to 20 carbons include acetylene, propenylene and the like.

The linear, branched or cyclic alkoxy groups of 1 to 20 carbons include methoxy, ethoxy, propyloxy, butoxy, cyclohexyloxy, isobutoxy, dodecyloxy and the like.

The substituted or unsubstituted aryl groups of 6 to 20 carbons include phenyl, naphthyl, anthranil and the like.

The substituents of the aryl group include alkyl, nitro, hydroxyl, alkoxy, acyl, alkoxycarbonyl groups and halogen atoms.

The linear, branched or cyclic alkylene groups of 1 to 20 carbons (here, the alkylene group may encompass oxygen and nitrogen atoms in its chain) in $R_{339}$ include methylene, ethylene, propylene, butylene, isobutylene, ethoxyethylene, cyclohexylene and the like.

The linear, branched or cyclic alkenylene groups of 1 to 20 carbons include vinylene, allylene and the like.

Specific examples are shown, but the invention is not limited thereto.

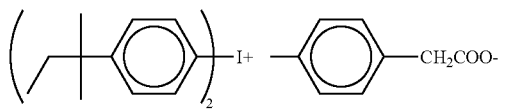

(I-1)

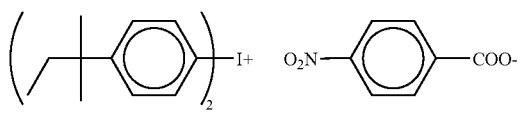

(I-2)

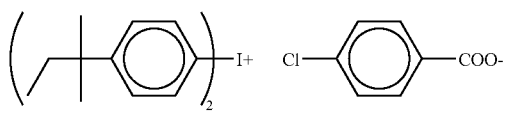

(I-3)

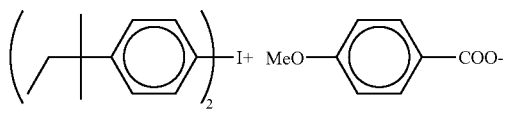

(I-4)

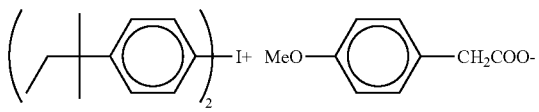

(I-5)

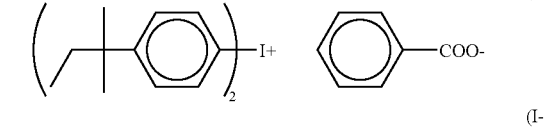

(I-6)

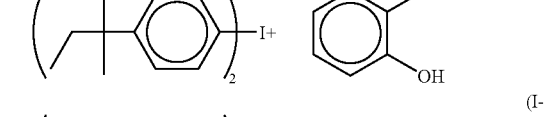

(I-7)

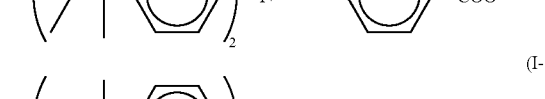

(I-8)

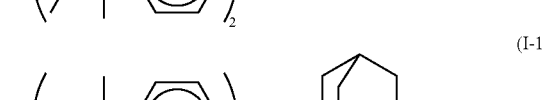

(I-9)

(I-10)

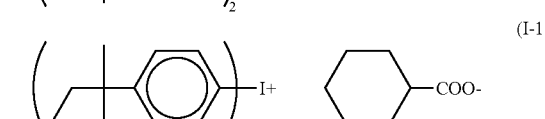

(I-11)

(I-12)

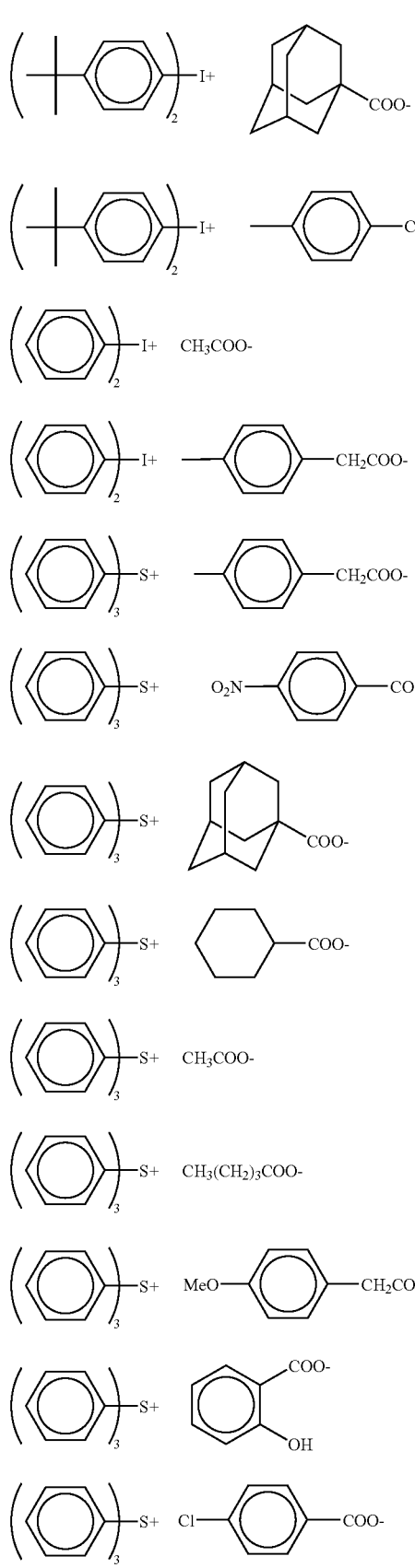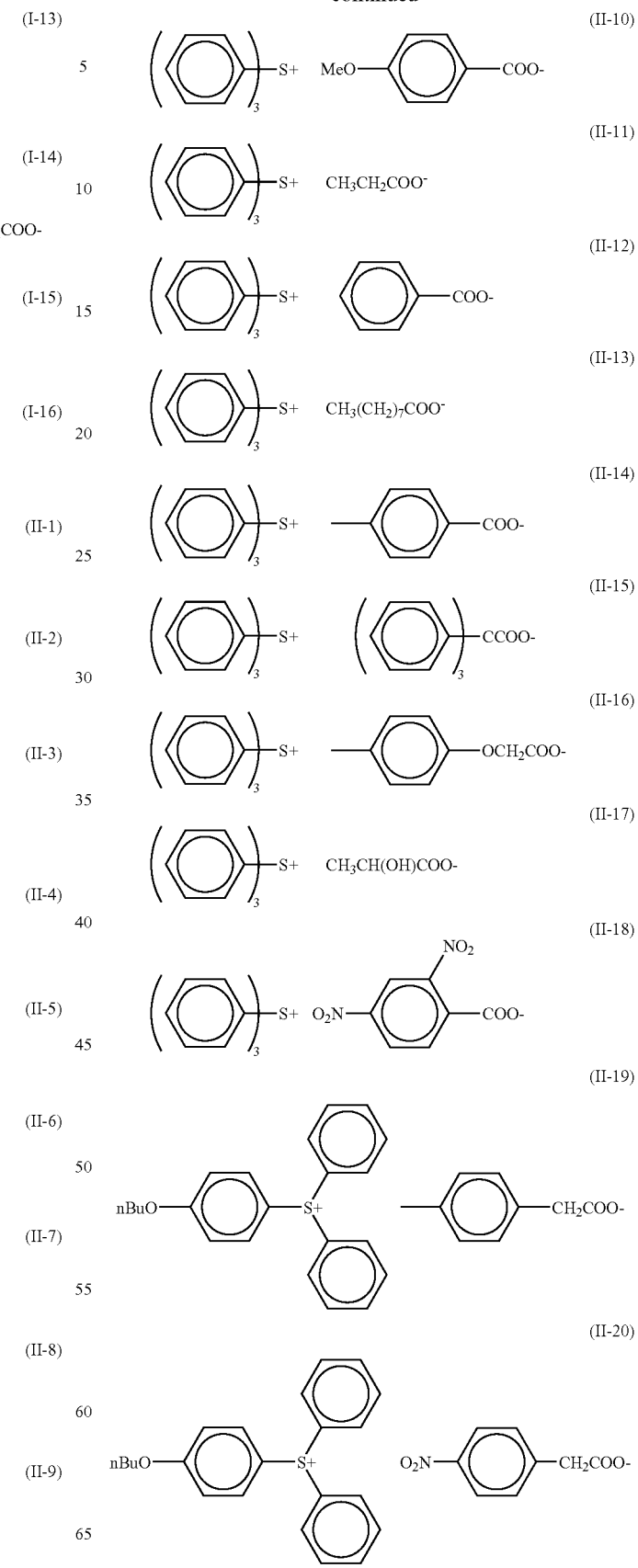

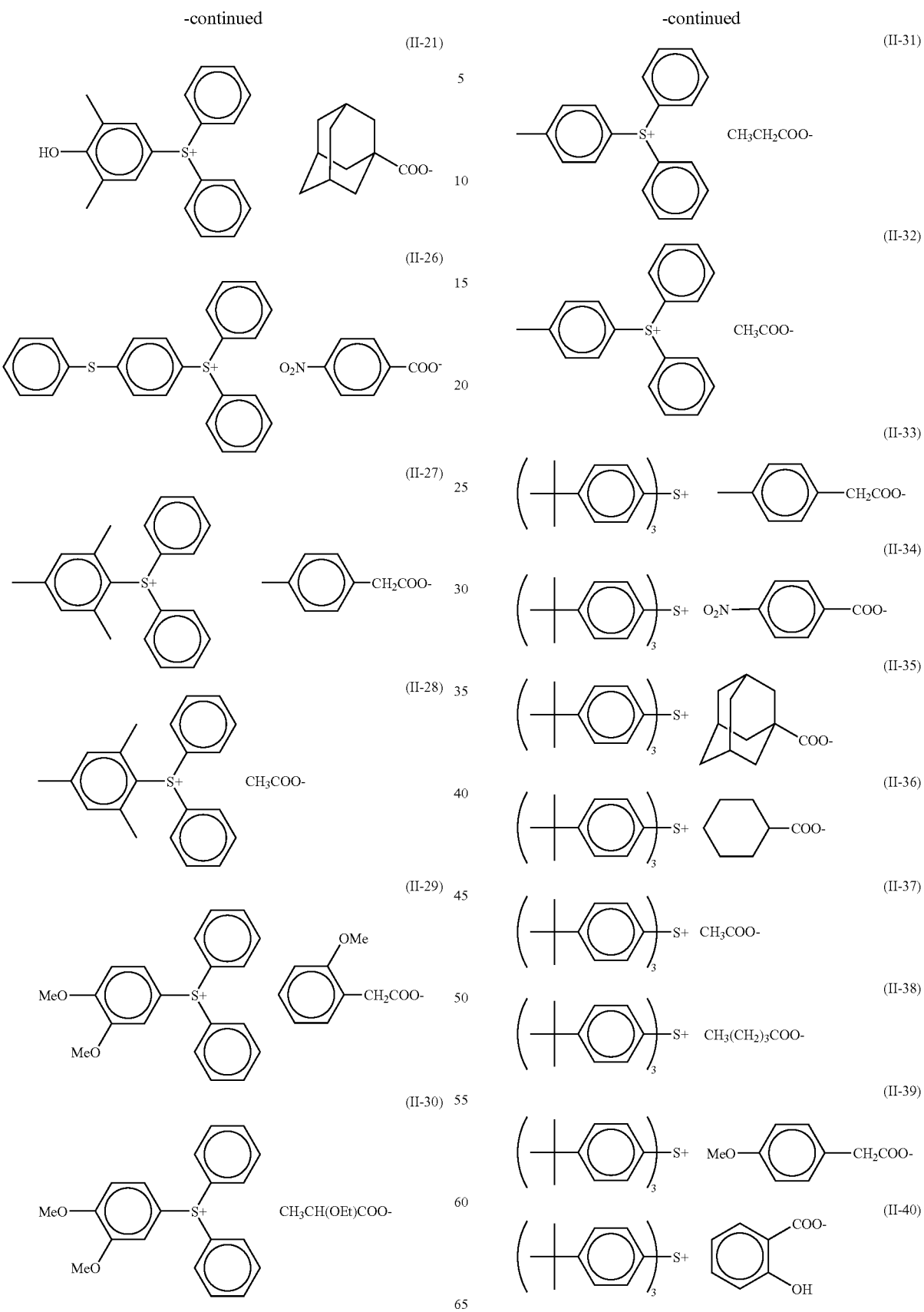

-continued
(II-41)
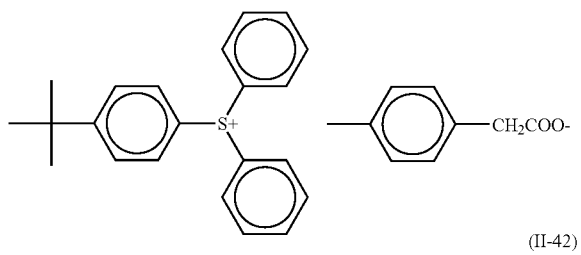
(II-42)
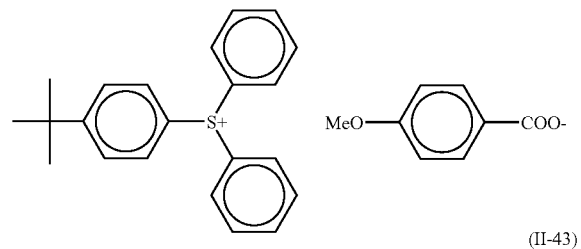
(II-43)
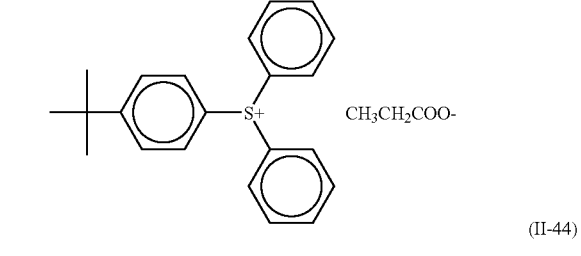
(II-44)
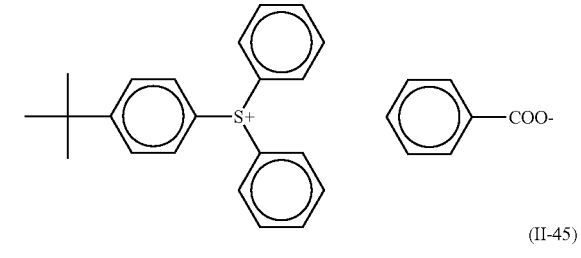
(II-45)
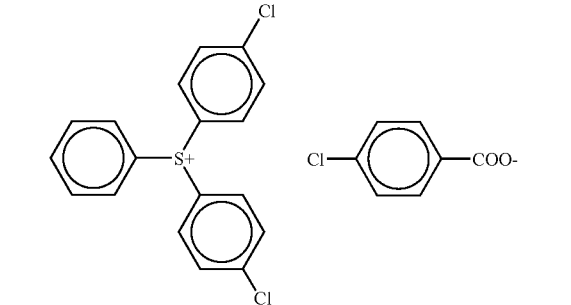
(II-46)
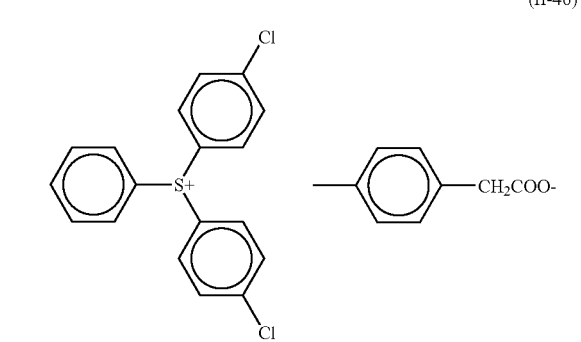
-continued
(VII-47)
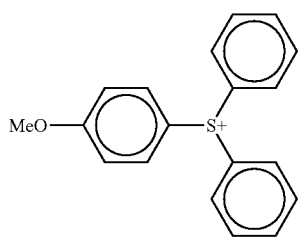
(II-48)
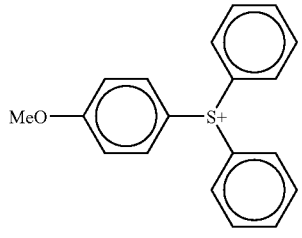
(III-1)
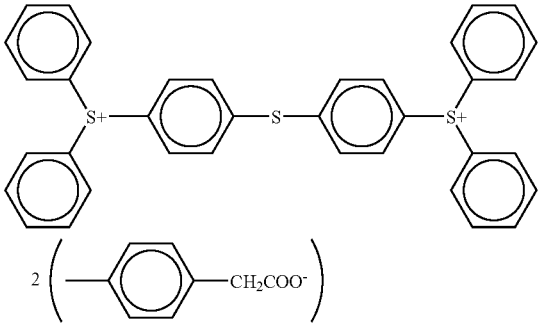
(III-2)
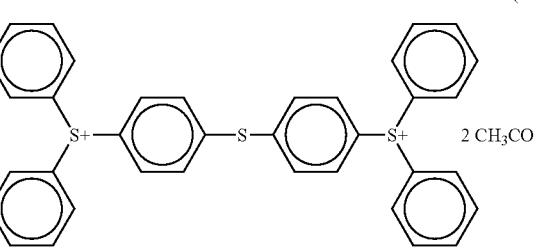
(IV-1)
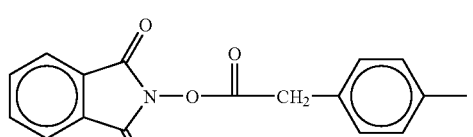
(IV-2)
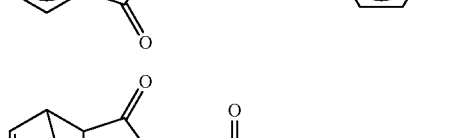
(IV-3)
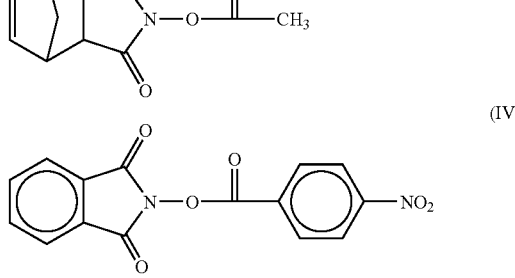

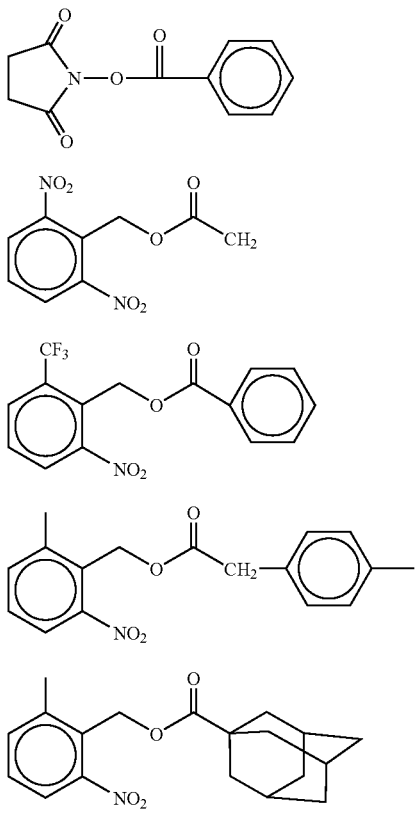

The above photoacid generators, i.e., the compounds represented by the general formulae (AI), (AII) and A(III) can be synthesized by using the method described in U.S. Pat. No. 3,734,928, and the methods described in Macromolecules, 10:1307, 1977; Journal of Organic Chemistry, 55:4222, 1990; and J. Radiat. Curing, 5(1):2, 1978, and by further exchanging the counter anions. The compounds represented by the general formulae (AIV) and (AV) are obtained by reacting N-hydroxyimide compound and carboxylate chloride under a basic condition, or by reacting nitrobenzyl alcohol and carboxylate chloride under the basic condition.

A weight ratio of the added amount of the photoacid generator (B-1) which generates the acid with relatively high acid strength to that of the photoacid generator (B-2) which generates the acid with low acid strength is typically from 1/1 to 50/1, preferably from 1/1 to 10/1, and particularly preferably from 2/1 to 5/1.

The sum amount of two types of photoacid generators is typically from 0.5 to 20%, preferably from 0.75 to 15%, and more preferably from 1 to 10% by weight based on the total solid contents of the composition.

[3] Surfactants

It is preferable that the composition of the invention contains surfactants, particularly fluorine or silicon surfactants. That is, it is particularly preferable that the composition of the invention contains any one of, or two or more of the fluorine surfactant, the silicon surfactant and surfactants containing both fluorine and silicon atoms. These fluorine and/or silicon surfactants have effects on repression of developing defects and improvement of applicability.

These surfactants can include, for example, the surfactants described in JP-A-62-36663, 61-226746, 61-226745, 62-170950, 63-34540, 7-230165, 8-62834, 9-54432, 9-5988; U.S. Pat. Nos. 5,405,720, 5,360,692, 5,529,881, 5,296,330, 5,436,098, 5,576,143, 5,296,143, 5,294,511 and 5,824,451, and the following commercially available surfactants can be used as it is.

Such commercially available surfactants can include, for example, fluorine surfactants or silicon surfactants such as EFTOP EF301, EF303, EF352 (supplied from Shinakita Kasei, KK), Fluorad FC430, 431 (supplied from Sumitomo 3M Ltd.), Megafac F171, F173, F176, F189, R08 (supplied from Dainippon Ink And Chemicals, Incorporated), Asahi Guard AG710, Surflon S-382, SC101, 102, 103, 104, 105, 106 (supplied from Asahi Glass Co., Ltd.), and Troysol (supplied from Troy Chemical Industries Inc.) Also, polysiloxane polymer KP-341 (supplied from Shin-Etsu Chemical Co., Ltd.) can be used as the silicon surfactant.

The formulated amount of the surfactants is typically from 0.001 to 2%, and preferably from 0.01 to 1% by weight based on the solid contents in the composition of the invention. These surfactants may be added alone, or can be added in combination with some surfactants.

[4] Acid Diffusion Inhibitor

It is preferable that an acid diffusion inhibitor is added to the composition of the invention for the purpose of restraining performance variation due to the elapsed time till heat treatment after the radiation of an actinic ray or a radiation (T-top shape formation of patterns, sensitivity variation, pattern line width variation, etc.), performance variation due to the elapsed time after the application, and further excessive diffusion of the acid at the heat treatment after the radiation of an actinic ray or a radiation (deterioration of resolution). The acid diffusion inhibitor is an organic basic compound, for example the organic basic compound containing basic nitrogen, and the compound where pKa value of its conjugate acid is 4 or more is preferably used.

Specifically, the structures of the following formulae (A) to (E) can be included.

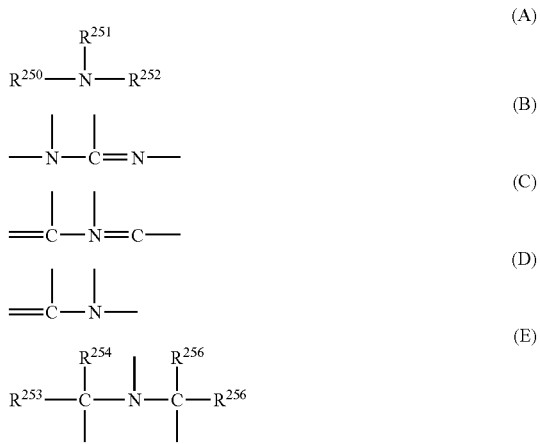

Here, $R^{250}$, $R^{251}$ and $R^{252}$ may be the same or different, and represent hydrogen atoms, alkyl groups of 1 to 6 carbons, aminoalkyl groups of 1 to 6 carbons, hydroxyalkyl groups of 1 to 6 carbons, or substituted or unsubstituted aryl groups of 6 to 20 carbons, and here, $R^{251}$ and $R^{252}$ may join to form a ring.

$R^{253}$, $R^{254}$, $R^{255}$ and $R^{256}$ may be the same or different, and represent alkyl groups of 1 to 6 carbons.

More preferable compounds are the nitrogen-containing basic compounds having two or more nitrogen atoms with different chemical environments in one molecule, and particularly preferably the compounds encompassing both ring structures containing the substituted or unsubstituted amino group and nitrogen atoms, or the compounds having alkylamino groups.

Preferable specific examples include substituted or unsubstituted guanidine, substituted or unsubstituted aminopyridine, substituted or unsubstituted aminoalkyl pyridine, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkyl morpholine. Preferable substituents are amino, aminoalkyl, alkylamino, aminoaryl, arylamino, alkyl, alkoxy, acyl, acyloxy, aryl, aryloxy, nitro, hydroxyl and cyano groups.

Particularly preferable compounds include guanidine, 1,1-dimethyl guanidine, 1,1,3,3-tetramethyl guanidine, imidazole, 2-methyl imidazole, 4-methyl imidazole, N-methyl imidazole, 2-phenyl imidazole, 4,5-diphenyl imidazole, 2,4,5-triphenyl imidazole, 2-aminopyridine, 3-aminopyridine, 4-aminopyridine, 2-domethyl aminopyridine, 4-dimethyl aminopyridine, 2-diethyl aminopyridine, 2-(aminomethyl) pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 5-aminopyrrolidine, piperazine, N-(2-aminoethyl) piperazine, N-(2-aminoethyl) piperidine, 4-amino-2,2,6,6-tetramethyl piperidine, 4-pyperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl) morpholine and the like, but are not limited thereto.

These nitrogen-containing basic compounds are used alone or in combination with two or more.

The use ratio of the acid generators and the organic basic compound in the composition is preferably [acid generators]/[organic basic compound] (molar ratio)=2.5 to 300. When the molar ratio is less than 2.5, the sensitivity becomes low and a resolving power is reduced in some cases. Also when it is more than 300, a gain of the resist pattern becomes large in the elapsed till the heat treatment time after the exposure and the resolving power is reduced in some cases. The [acid generators]/[organic basic compound] (molar ratio) is preferably from 5.0 to 200, and more preferably from 7.0 to 150.

[5] Other Components Used for the Composition of the Invention (1) Solvents (C)

The composition of the invention is applied on supports by dissolving in solvents which dissolves the above respective components. As the solvents used here, preferred are ethylene dichloride, cyclohexane, cyclopentane, 2-heptane, γ-butyrolactone, methylethylketone, ethyleneglycolmonomethyl ether, ethyleneglycol monoethyl ether, 2-methoxyethyl acetate, ethyleneglycol monoethyl ether acetate, propyleneglycol monomethyl ether, propyleneglycol monoethyl ether, propyleneglycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethyl formamide, dimethyl sulfoxide, N-methyl pyrrolidone, tetrahydrofuran and the like, and these solvents are used alone or in mixture.

In a step of the pattern formation on a resist film in fabrication of precise integrated circuit devices, the good resist pattern can be formed by applying the composition of the invention on the substrate (e.g., transparent substrates such as silicon/silicon dioxide coatings, glass substrates and ITO substrates), then performing the radiation using an active light or radioactive ray lithography apparatus, followed by heating, developing, rinsing and drying.

As the developing solutions of the composition of the invention, it is possible to use aqueous solutions of alkalis such as inorganic alkalis such as sodium hydroxide, potassium hydroxide, sodium carbonate, sodium silicate, sodium metasilicate and an aqueous solution of ammonia, primary amines such as ethylamine and n-propylamine, secondary amines such as diethylamine and di-n-butylamine, tertiary amines such as triethylamine and methyldiethylamine, alcohol amines such as dimethyl ethanol amine and triethanol amine, quaternary ammonium salts such as tetramethyl ammonium hydroxide, tetraethyl ammonium hydroxide and choline, and cyclic amines such as pyrrole and piperidine. Furthermore, appropriate amounts of alcohols such as isopropyl alcohol and nonionic surfactants can be added to the above aqueous solutions of the alkalis to use.

Among these developing solutions, preferable are quaternary ammonium salts, and more preferable are tetramethyl ammonium hydroxide and choline.

EXAMPLES

The present invention is more particularly illustrated below by examples, but thereby the contents of the invention are not limited.

1. Synthesis Example 1 (Synthesis of Resin (1-2))

In a 100 ml flask with three necks equipped a reflux tube and a nitrogen inlet tube, 4-(2-hydroxyhexafluoroisopropyl) styrene (supplied from Central Glass Co., LTD.), 4-(1-methoxyethoxy) styrene (supplied from Tosoh), and 1-adamantane-1-methyl-ethylmethacrylate (supplied from Daicel Chemical Industries Ltd.) were taken at a molar ratio of 50/40/10, respectively, and subsequently tetrahydrofuran was added to prepare total 30 g of reaction solution with a monomer concentration of 30% by weight. That was stirred and heated up to 65° C. under a nitrogen flow. Azo polymerization initiator V-65 (supplied from Wako Pure Chemical Industries Ltd.) was added at 5.0% by mole based on the sum of moles of said three monomers, and the mixture was reacted for 8 hours with stirring under-nitrogen flow. Hexane (200 ml) was added to the resultant reaction solution, and produced polymer was precipitated from the solution to isolate and purify the unreacted monomers. The composition of the polymer estimated from $C^{13}$MNR was 51/39/10.

The resultant polymer was analyzed by GPC (in THF solvent, standard polystyrene conversion), and consequently the weight average molecular weight was 8,400, a dispersity was 2.20, and a percentage of fractions with molecular weighs of 1000 or less encompassed in the polymer was 15% by weight.

Similarly, the resins of the invention shown in Table 1 were synthesized.

TABLE 1

| Resin | Composition (structure unit and molar ratio) | Molecular weight |
|---|---|---|
| (1-1) | (II-1)/(A-1)/(B-6) = 48/30/22 | 9,200 |
| (1-2) | (II-1)/(A-2)/(B-8) = 51/39/10 | 8,400 |
| (1-3) | (II-1)/(A-3')/(B-10) = 49/42/9 | 8,600 |
| (1-4) | (II-1)/(A-10)/(B-1) = 64/26/10 | 9,200 |
| (1-5) | (II-1)/(A-19)/(B-2) = 64/24/12 | 8,900 |
| (1-6) | (II-1)/(A-34)/(B-1') = 60/32/8 | 8,400 |
| (1-7) | (II-1)/(A-35)/(B-1') = 51/19/30 | 10,100 |
| (1-8) | (II-1)/(A-36)/(B-4) = 40/48/12 | 9,200 |
| (1-9) | (II-2)/(A-19)/(B-9) = 53/36/11 | 9,100 |
| (1-10) | (II-1')/(A-20)/(B-10) = 16/50/39 | 7,800 |
| (1-11) | (II-1")/(A-26)/(B-13) = 81/13/6 | 12,100 |
| (1-12) | (II-3)/(A-26)/(B-14) = 49/31/20 | 14,200 |
| (1-13) | (II-4)/(A-26)/(B-1) = 52/38/10 | 16,600 |
| (1-14) | (II-1)/(A-25)/(B-1) = 49/36/15 | 9,200 |
| (1-15) | (II-1)/(A-24)/(B-1') = 70/11/19 | 8,400 |
| (1-16) | (II-1)/(A-20')/(B-7) = 28/12/60 | 8,600 |
| (1-17) | (II-1)/(A-27)/(B-8) = 22/63/15 | 9,200 |
| (1-18) | (II-1)/(A-25)/(B-12') = 49/31/20 | 8,900 |
| (1-19) | (II-1)/(A-19)/(B-1)/(VII-2) = 64/16/10/10 | 9,000 |
| (1-20) | (II-1)/(A-19)/(B-1')/(F-1) = 49/21/20/10 | 9,500 |
| (1-21) | (II-1)/(A-19)/(B-1)/(C-1) = 48/36/11/5 | 10,200 |
| (1-22) | (II-1)/(A-19)/(B-2)/(F-7) = 16/39/39/11 | 14,200 |
| (1-23) | (II-1)/(A-19)/(B-1)/(F-19) = 51/48/16/15 | 16,600 |
| (1-24) | (II-1)/(A-25)/(B-4)/(VII-2) = 61/13/6/20 | 9,200 |
| (1-25) | (II-1)/(A-20')/(B-12")/(F-2) = 49/33/8/10 | 8,400 |
| (1-26) | (II-1)/(A-38)/(B-10)/(C-3) = 46/10/14/30 | 7,200 |
| (1-27) | (II-3)/(A-28)/(B-8)/(F-7) = 49/36/15/10 | 9,200 |
| (1-28) | (II-4)/(A-25)/(B-12')/(F-24) = 48/33/8/11 | 8,300 |
| (1-29) | (F-19)/(F-20) = 50/50 | 8,900 |
| (1-30) | (F-39)/(B-2) = 60/40 | 10,500 |

Synthesis of Triphenyl Sulfonium Nonafluorobutane Sulfonate (VII-4)

Triphenylsulfonium iodide (20 g) was dissolved in 500 ml of methanol, and 12.5 g of silver oxide was added thereto followed by stirring at room temperature for 4 hours. The reaction solution was filtrated to eliminate the silver compound, subsequently 14.9 g of nonafluorobutane sulfonic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 18 g of the object.

Synthesis of Triphenylsulfonium 4-dodecylbenzenesulfonate (PAG4-1)

Triphenylsulfonium iodide (10 g) was dissolved in 500 ml of methanol, and 4.44 g of silver oxide was added thereto followed by stirring at room temperature for 4 hours. The reaction solution was filtrated to eliminate the silver compound, subsequently 4.67 g of 4-dodecylbenzene sulfonic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 6 g of the object.

Synthesis of Triphenylsulfonium Nonafluoropentanoate (II-4f)

Triphenylsulfonium iodide (20 g) was dissolved in 500 ml of methanol, and 12.5 g of silver oxide was added thereto followed by stirring at room temperature for 4 hours. The reaction solution was filtrated to eliminate the silver compound, subsequently 14.9 g of nonafluoropentanoic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 18 g of the object.

[Examples 1-1 to 1-30 and Comparative Examples 1-1 and 1-2]

The resin A component (1.2 g), the acid generator B-1 component (0.024 g), the acid generator B-2 component (0.006 g), the surfactant D component (100 ppm, based on the polymer solution), and the basic compound E component (0.0012 g) shown in the following Table 2 were dissolved in 19.6 g of the solvent C component. The polymer solution was filtrated through a Teflon filter of 0.1 μm to prepare a positive photoresist.

TABLE 2

| | A component resin | Acid generator (B-1) | Acid generator (B-2) (weight ratio) | C component solvent (weight ratio) | D component surfactant | E component basic compound (weight ratio) |
|---|---|---|---|---|---|---|
| Example | | | | | | |
| 1-1 | (1-1) | (VII-4) | (PAG4-1) | S-2 | W-1 | |
| 1-2 | (1-2) | (VII-14) | (PAG4-1) | S-2 | W-2 | (N-1) |
| 1-3 | (1-3) | (VII-24) | (PAG4-4) | S-2 | W-1 | |
| 1-4 | (1-4) | (VII-36) | (PAG4-34) | S-2/S-3 (80/20) | W-1 | (N-2) |
| 1-5 | (1-5) | (VII-54) | (PAG4-34) | S-2 | W-1 | (N-3) |
| 1-6 | (1-6) | (VII-4) | (PAG4-35) | S-2/S-3 (90/10) | W-2 | |
| 1-7 | (1-7) | (VII-4) | (II-4f) | S-2 | W-1 | |
| 1-8 | (1-8) | (VII-4) | (II-5f) | S-2/S-3 (70/30) | W-1 | |
| 1-9 | (1-9) | (VII-4) | (II-49f) | S-2 | W-1 | (N-1) |
| 1-10 | (1-10) | (VII-14) | (III-3f) | S-2 | W-2 | |
| 1-11 | (1-11) | (VII-4) | (II-3) | S-2 | W-1 | |
| 1-12 | (1-12) | (VII-4) | (II-11) | S-2 | W-1 | |

TABLE 2-continued

| | A component resin | Acid generator (B-1) | Acid generator (B-2) (weight ratio) | C component solvent (weight ratio) | D component surfactant | E component basic compound (weight ratio) |
|---|---|---|---|---|---|---|
| 1-13 | (1-13) | (VII-4) | (II-4) | S-2 | W-1 | (N-1)/(N-2) = 50/50 |
| 1-14 | (1-14) | (VII-4) | (II-5) | S-2 | W-1 | |
| 1-15 | (1-15) | (PAG4-1) | (II-4f) | S-2 | W-1 | |
| 1-16 | (1-16) | (PAG4-4) | (II-5f) | S-2/S-3 (90/10) | W-2 | |
| 1-17 | (1-17) | (PAG4-34) | (II-49f) | S-2 | W-1 | |
| 1-18 | (1-18) | (PAG4-35) | (III-3f) | S-1/S-2 (5/95) | W-1 | |
| 1-19 | (1-19) | (PAG4-34) | (II-3) | S-2 | W-1 | |
| 1-20 | (1-20) | (VII-4) | (II-4)/(PAG4-35) = 50/50 | S-2 | W-2 | |
| 1-21 | (1-21) | (PAG4-35) | (II-5)/(II-5f) = 50/50 | S-2 | W-1 | |
| 1-22 | (1-22) | (PAG4-34) | (II-11) | S-1/S-2 (10/90) | W-2 | |
| 1-23 | (1-23) | (II-49f) | (II-5) | S-2 | W-1 | |
| 1-24 | (1-24) | (PAG7-3) | (II-4f) | S-2 | W-1 | |
| 1-25 | (1-25) | (PAG7-3) | (II-6) | S-2 | W-1 | |
| 1-26 | (1-26) | (VII-4) | (II-49f) | S-1/S-2 (40/60) | W-2 | (N-2) |
| 1-27 | (1-27) | (PAG4-4) | (II-5) | S-2/S-3 (50/50) | W-2 | |
| 1-28 | (1-28) | (VII-4) | (II-49f)/(II-5) = 50/50 | S-2 | W-1 | |
| 1-29 | (1-29) | (VII-4) | (PAG4-1) | S-2 | W-1 | |
| 1-30 | (1-30) | (PAG4-1) | (II-4f) | S-2/S-3 (90/10) | W-1 | |
| Comparative Example | | | | | | |
| 1-1 | (1-1) | (VII-4) | | S-2 | W-1 | (N-1) |
| 1-2 | (1-2) | (PAG4-1) | | S-2/S-3 (70/30) | W-1 | |

The symbols in Table 2 are as follows.
N-1: Hexamethylenetetramine
N-2: 1,5-Diazabicyclo[4.3.0]-5-nonene
N-3: 1,8-Diazabicyclo[5.4.0]-7-undecene
W-1: Megafac F176 (supplied from Dainippon Ink And Chemicals, Incorporated) (fluorine)
W-2: Megafac R08 (supplied from Dainippon Ink And Chemicals, Incorporated) (fluorine and silicon)
S-1: Ethyl lactate
S-2: Propyleneglycol monomethylether acetate
S-3: Propyleneglycol monomethylether
The ratio in multiple use for each component shown in Table 2 is the weight ratio.

Utilizing a spin coater, the positive photoresist solution prepared as the above was evenly applied on a silicon wafer on which anti-reflection film (DUV42-6, supplied from Brewer Science Inc.) was applied, and dried with heating at 120° C. for 60 seconds to form a positive photoresist film with a thickness of 0.1 μm. Pattern exposure was carried out for this resist film using KrF excimer laser microstepper (NA=0.63) and a mask for lines and spaces (line width 150 nm, line/space=1/1). Immediately after the exposure, the film was heated on a hot plate at 110° C. for 90 seconds. Further, it was developed in an aqueous solution of 2.38% tetramethyl ammonium hydroxide at 23° C. for 30 seconds, and rinsed with purified water followed by drying. For the pattern obtained in this way on the silicon wafer, its resist performance was evaluated by the following methods.

It was evaluated as follows.

[Line edge roughness] For the range of 5 μm edge in a longitudinal direction of the line pattern, a distance from a standard line where the edge should exist was measured for 50 points by an end-measuring SEM(S-8840, supplied from Hitachi Ltd.), standard deviation was sought, and 3σ was calculated. The smaller the value is, the better performance is indicated.

[Development time dependence] In an exposure amount which reproduces the size of mask pattern for lines and spaces of 150 nm when the development time is 30 seconds, the development time dependence indicates the size difference from 150 nm when the formed size of the same pattern is measured when the development time is 90 seconds.

The results of the performance evaluation are shown in Table 3.

TABLE 3

|  | Line edge roughness (nm) | Development time dependence (nm) |
|---|---|---|
| Example 1-1 | 8.1 | 3.1 |
| Example 1-2 | 7.7 | 2.9 |
| Example 1-3 | 7.6 | 2.7 |
| Example 1-4 | 8.2 | 3.1 |
| Example 1-5 | 8.1 | 2.9 |
| Example 1-6 | 7.9 | 2.7 |
| Example 1-7 | 8.1 | 2.6 |
| Example 1-8 | 7.7 | 2.9 |
| Example 1-9 | 7.6 | 2.9 |
| Example 1-10 | 8.2 | 2.4 |
| Example 1-11 | 8.1 | 3.1 |
| Example 1-12 | 7.9 | 3.0 |
| Example 1-13 | 8.0 | 3.2 |
| Example 1-14 | 8.1 | 3.1 |
| Example 1-15 | 7.6 | 2.9 |
| Example 1-16 | 8.2 | 2.8 |
| Example 1-17 | 8.1 | 2.9 |
| Example 1-18 | 7.9 | 3.1 |
| Example 1-19 | 8.1 | 2.9 |
| Example 1-20 | 7.7 | 2.8 |
| Example 1-21 | 7.6 | 2.9 |
| Example 1-22 | 8.1 | 2.8 |
| Example 1-23 | 8.4 | 3.1 |
| Example 1-24 | 8.1 | 2.9 |
| Example 1-25 | 8.3 | 2.8 |
| Example 1-26 | 7.9 | 2.9 |
| Example 1-27 | 7.8 | 2.9 |
| Example 1-28 | 7.6 | 2.8 |
| Example 1-29 | 7.8 | 2.9 |
| Example 1-30 | 7.9 | 2.9 |
| Comparative Example 1-1 | 12.2 | 9.1 |
| Comparative Example 1-2 | 12.7 | 9.1 |

From the results in Table 3, it is found that the composition of the invention is small and good in line edge roughness and development time dependence.

1. Synthesis Example (Synthesis of the Resin (2-7))

In a 100 ml flask with three necks equipped a reflux tube and a nitrogen inlet tube, 16 g (0.059 mol) of 4-(2-hydroxyhexafluoroisopropyl) styrene (supplied from Central Glass Co., LTD.) and 1.18 g (0.0254 mol) of 4-t-butoxystyrene (supplied from Tokyo Kasei Kogyo Co., Ltd.) were taken, and subsequently tetrahydrofuran (hereinafter, abbreviated as THF in some cases) was added. That was stirred and heated up to 65° C. under nitrogen flow. Azo polymerization initiator V-65 (supplied from Wako Pure Chemical Industries Ltd.) was added at 3.0% by mole (0.64 g) based on the sum of moles of said monomers, and reacted with stirring under nitrogen flow for 8 hours.

Then, the reaction solution was cooled to room temperature using an ice bath, and subsequently 4.13 g (0.0338 mol) of N,N-dimethyl formamide (hereinafter, abbreviated as DMAP in some cases; supplied from Tokyo Kasei Kogyo Co., Ltd.) was added. After dissolving DMAP, 10 g of solution of 7.39 g(0.0339 mol) di-t-butyl-dicarbonate in tetrahydrofuran was dripped with cooling. After the addition, the reaction solution was reacted at 0° C. for 30 min and at room temperature for 5 hours with stirring.

Then, 20 g of ethyl acetate was added, and the reaction solution was washed with 0.1N hydrochloric acid. Subsequently, 400 ml of hexane was added, and the produced polymer was precipitated from the solution to isolate and purify the unreacted monomers.

The resultant polymer was analyzed by GPC (in THF solvent, standard polystyrene conversion), and consequently the weight average molecular weight was 10,200, a dispersity was 2.20, and a percentage of fractions with molecular weighs of 1000 or less encompassed in the polymer was 15% by weight.

Similarly, the resins of the invention shown in Table 4 were synthesized.

Reference numbers of the structure units in the table mean the reference numbers given to the exemplified chemical formulae described in the Detailed Description.

TABLE 4

| Resin | Composition (structure units and their number of moles) | Molecular weight |
|---|---|---|
| 2-1 | (Y-1)/(II-1) = 51/49 | 13700 |
| 2-2 | (Y-1)/(II-2) = 50/50 | 10200 |
| 2-3 | (Y-1)/(II-1') = 51/49 | 10300 |
| 2-4 | (Y-1)/(II-3) = 52/48 | 9200 |
| 2-5 | (Y-1)/(II-3') = 51/49 | 14200 |
| 2-6 | (Y-1)/(II-4) = 49/51 | 17800 |
| 2-7 | (Y-1)/(II-1)/(A-19) = 40/29/31 | 10200 |
| 2-8 | (Y-1)/(II-1)/(A-20) = 29/36/35 | 10900 |
| 2-9 | (Y-1)/(II-1)/(A-10) = 29/35/36 | 12200 |
| 2-10 | (Y-1)/(II-1)/(A-25) = 31/35/34 | 13700 |
| 2-11 | (Y-1)/(C-1)/(A-19) = 40/31/29 | 13400 |
| 2-12 | (Y-1)/(II-1)/(A-19) (VII-1) = 39/21/29/11 | 10100 |
| 2-13 | (Y-1)/(II-1)/(A-19) (F-39) = 40/19/31/10 | 13000 |
| 2-14 | (Y-1)/(II-1)/(A-19) (B-1) = 41/19/30/10 | 12100 |
| 2-15 | (Y-1)/(II-1)/(A-19) (B-7) = 39/21/29/11 | 11600 |
| 2-16 | (Y-2)/(II-1)/(A-19) = 40/31/29 | 11200 |
| 2-17 | (Y-3)/(II-1)/(A-19) = 39/30/31 | 10800 |
| 2-18 | (Y-11)/(II-1)/(A-19) = 41/29/30 | 15200 |
| 2-19 | (Y-14)/(F-19) = 51/49 | 15200 |
| 2-20 | (Y-14)/(F-19) = 50/50 | 13800 |
| 2-21 | (Y-15)/(F-19)/(F-1) = 40/31/29 | 10500 |
| 2-22 | (Y-2)/(II-1)/(A-25) = 40/36/24 | 10300 |

Synthesis of Triphenylsulfonium 4-dodecylbenzenesulfonate (PAG4-1)

Triphenylsulfonium iodide (10 g) was dissolved in 500 ml of methanol, and 4.44 g of silver oxide was added thereto followed by stirring at room temperature for 4 hours. The reaction solution was filtrated to eliminate the silver compound, subsequently 4.67 g of 4-dodecylbenzene sulfonic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 6 g of the object.

Synthesis of Triphenyl Sulfonium Nonafluorobutane Sulfonate (VII-4)

Triphenylsulfonium iodide (20 g) was dissolved in 500 ml of methanol, and 12.5 g of silver oxide was added thereto followed by stirring at room temperature for 4 hours. The reaction solution was filtrated to eliminate the silver compound, subsequently 14.9 g of nonafluorobutane sulfonic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 18 g of the object.

Synthesis of Triphenylsulfonium Trifluoroacetate (II-1f)

Triphenylsulfonium iodide (20 g) was dissolved in 500 ml of methanol, and 12.5 g of silver oxide was added thereto followed by stirring at room temperature for 4 hours. The reaction solution was filtrated to eliminate the silver compound, subsequently 5.9 g of trifluoroacetic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 18 g of the object.

Examples 2-1 to 2-22 and Comparative Examples 2-1 to 2-3

A polymer solution where A component (1.2 g), BH component (0.024 g), BL component (0.006 g), D component (100 ppm, based on the polymer solution), and E component (0.0012 g) shown in the following Table 5 were dissolved in C component (19.6 g) was filtrated through a Teflon filter of 0.1 μm to prepare the photosensitive composition.

TABLE 5

| | (A) component resin | (BH) component | (BL) component (weight ratio) | (C) component solvent (weight ratio) | (D) component surfactant | E component basic compound (weight ratio) |
|---|---|---|---|---|---|---|
| Example | | | | | | |
| 2-1 | (2-1) | VII-4 | PAG4-1 | S-2 | W-1 | — |
| 2-2 | (2-2) | VII-14 | PAG4-1/II-1f (50/50) | S-2 | W-1 | N-1 |
| 2-3 | (2-3) | VII-24 | PAG4-1/II5f (50/50) | S-2 | W-1 | N-1/N-2 (50/50) |
| 2-4 | (2-4) | VII-36 | PAG4-34/II-1f (50/50) | S-2 | W-1 | — |
| 2-5 | (2-5) | VII-54 | PAG4-34/II-1f (50/50) | S-2 | W-1 | N-2 |
| 2-6 | (2-6) | VII-4 | PAG4-35 | S-2 | W-1 | N-6 |
| 2-7 | (2-7) | VII-4 | II-5f | S-2 | W-2 | N-3 |
| 2-8 | (2-8) | VII-4 | II-5f | S-2 | — | N-7 |
| 2-9 | (2-9) | VII-4 | II5f/II-1f (70/30) | S-2/S-3 (80/20) | W-1 | N-5 |
| 2-10 | (2-10) | VII-18 | III-3f | S-2 | — | N-4 |
| 2-11 | (2-11) | VII-4 | II-13f | S-2/S-3 (90/10) | W-2 | N-2/N-3 (50/50) |
| 2-12 | (2-12) | VII-4 | II-14f | S-2 | W-1 | — |
| 2-13 | (2-13) | VII-4 | II-15f/II-1f (30/70) | S-2 | W-1 | — |
| 2-14 | (2-14) | VII-4 | II-16f/II-5f (50/50) | S-2 | W-1 | — |
| 2-15 | (2-15) | VII-4 | II-17f/II-1f (60/40) | S-2/S-3 (70/30) | W-1 | — |
| 2-16 | (2-16) | VII-4 | II-18f | S-2 | W-2 | — |
| 2-17 | (2-17) | PAG4-37 | II-23F/II-5f (50/50) | S-2 | W-2 | — |
| 2-18 | (2-18) | VII-4 | II-25f/II-1f (40/60) | S-2 | W-3 | — |
| 2-19 | (2-19) | VII-49 | II-1f | S-2 | W-4 | — |
| 2-20 | (2-20) | VII-4 | II-31f/II-5f (50/50) | S-2 | W-1 | — |
| 2-21 | (2-21) | VII-4 | II-36f/II-5f (50/50) | S-2 | W-1 | — |
| 2-22 | (2-1) | VII-4 | II-1f | S-2 | W-2 | N-2 |
| Comparative example | | | | | | |
| 2-1 | (2-1) | PAG4-1 | — | S-2 | W-1 | N-2 |
| 2-2 | (2-2) | PAG4-37 | — | S-1/S-2 (5/95) | W-2 | N-3 |
| 2-3 | [p-1-(ethoxy)ethoxy]styrene/p-hydroxystyrene = 35/65 | PAG4-1 | II-1f | S-2 | W-1 | — |

Contents of the symbols in Table 5 are as follows.
N-1: 1,5-Diazabicyclo[4.3.0]-5-nonene
N-2: 2,4,5-Triphenylimidazole
N-3: N-Hydroxyethylpiperidine
N-4: 2,6-Diisopropylaniline
N-5: Dicyclohexylmethylamine
N-6: Hexamethylenetetramine
N-7: 1,8-Diazabicyclo[5.4.0]-7-undecene
W-1: Megafac F176 (supplied from Dainippon Ink And Chemicals, Incorporated) (fluorine)
W-2: Megafac R08 (supplied from Dainippon Ink And Chemicals, Incorporated) (fluorine and silicon)
W-3: Polysiloxane polymer KR-341 (supplied from Shin-Etsu Chemical Co., Ltd.) (silicon)
W-4: Troysol S-366 (supplied from Troy Chemical Industries Inc.)
S-1: Ethyl lactate
S-2: Propyleneglycol monomethylether acetate
S-3: Propyleneglycol monomethylether
The ratio in multiple use for each component shown in Table 5 is the weight ratio.

Utilizing a spin coater, the photosensitive composition prepared as the above was evenly applied on a silicon wafer on which anti-reflection film (DUV42-6, supplied from Brewer Science Inc.) was applied, and dried with heating at 120° C. for 60 seconds to form a positive photoresist film with a thickness of 0.1 μm. Pattern exposure was carried out for this resist film using KrF excimer laser microstepper (NA=0.63) and a mask for lines and spaces (line width 150 nm, line/space=1/1). Immediately after the exposure, the film was heated on a hot plate at 110° C. for 90 seconds. Further, it was developed in an aqueous solution of 2.38% tetramethyl ammonium hydroxide at 23° C. for 30 seconds, and rinsed with purified water followed by drying. For the pattern obtained in this way on the silicon wafer, its resist performance was evaluated by the following methods. The patterns were evaluated as follows, and the results were shown in Table 6.

[Dissolution contrast] A slope (tan) of the exposure amount—dissolution rate curve was sought.

[Footing shape] The line and space pattern of which dimension size was 0.20 μm was observed by SEM (S-8840, supplied from Hitachi Ltd.), and levels of the footing formation shown in FIG. 1 was assessed by the following formula. The smaller the value is, the smaller level of footing formation is indicated.

Formula: (B−A)/2B×100(%)

[Line edge roughness] For the range of 5 μm edge in a longitudinal direction of the line pattern, a distance from a standard line where the edge should exist was measured for 50 points by an end-measuring SEM(S-8840, supplied from Hitachi Ltd.), standard deviation was sought, and 3σ was calculated. The smaller the value is, it indicates the better performance.

TABLE 6

| | Dissolution contrast (tan θ) | Footing formation | Line edge roughness |
|---|---|---|---|
| Example 2-1 | 6.9 | 11 | 4.5 |
| Example 2-2 | 7.1 | 10 | 4.3 |
| Example 2-3 | 6.8 | 12 | 4.1 |
| Example 2-4 | 6.9 | 9 | 3.8 |
| Example 2-5 | 6.8 | 15 | 3.6 |
| Example 2-6 | 7.1 | 16 | 3.7 |
| Example 2-7 | 7.3 | 13 | 3.5 |
| Example 2-8 | 7.4 | 12 | 3.8 |
| Example 2-9 | 6.9 | 9 | 3.9 |
| Example 2-10 | 6.9 | 14 | 4.1 |
| Example 2-11 | 7.1 | 17 | 4.0 |
| Example 2-12 | 6.8 | 13 | 4.3 |
| Example 2-13 | 7.1 | 18 | 4.2 |
| Example 2-14 | 7.3 | 9 | 4.4 |
| Example 2-15 | 7.4 | 19 | 4.1 |
| Example 2-16 | 6.9 | 17 | 3.6 |
| Example 2-17 | 6.9 | 13 | 3.8 |
| Example 2-18 | 7.1 | 11 | 3.9 |
| Example 2-19 | 6.8 | 9 | 3.8 |
| Example 2-20 | 7.1 | 10 | 3.6 |
| Example 2-21 | 6.9 | 16 | 3.7 |
| Example 2-22 | 7.0 | 13 | 3.4 |
| Comparative example 2-1 | 5.9 | 24 | 6.8 |
| Comparative example 2-2 | 5.7 | 25 | 5.6 |
| Comparative example 2-3 | 5.2 | 30 | 10.5 |

From the results of Table 6, it is found that the composition of the invention is capable of fabricating excellent ones with small line edge roughness and less footing formation.

Synthesis of the Resin (42)

In a 100 ml flask with three necks equipped a reflux tube and a nitrogen inlet tube, 4-(2-hydroxyhexafluoroisopropyl) styrene (supplied from Central Glass Co., LTD.), and 4-(1-methoxyethoxy) styrene (supplied from Tosoh) were taken at a molar ratio of 50/50, respectively, and subsequently tetrahydrofuran was added to prepare total 30 g of reaction solution with a monomer concentration of 30% by weight. That was stirred and heated up to 65° C. under a nitrogen flow. Azo polymerization initiator V-65 (supplied from Wako Pure Chemical Industries Ltd.) was added at 5.0% by mole based on the sum of moles of said two monomers, and the mixture was reacted for 8 hours with stirring under nitrogen flow. Hexane (200 ml) was added to the resultant reaction solution, and produced polymer was precipitated from the solution to isolate and purify the unreacted monomers. The composition of the polymer estimated from $C^{13}$MNR was 49/51.

The resultant polymer was analyzed by GPC (in THF solvent, standard polystyrene conversion), and consequently the weight average molecular weight was 10,200, a dispersity was 2.20, and a percentage of fractions with molecular weighs of 1000 or less encompassed in the polymer was 15% by weight.

Similarly, the resins of the invention shown in Table 7 were synthesized.

TABLE 7

| Resin | Composition (structure units and molar ratio) | Molecular weight |
|---|---|---|
| (41) | (II-1)/(A-1) = 48/52 | 8,900 |
| (42) | (II-1)/(A-2) = 49/51 | 10,200 |
| (42) | (II-1)/(A-3') = 53/47 | 5,800 |
| (44) | (II-1)/(A-10) = 61/39 | 9,200 |
| (45) | (II-1)/(A-19) = 64/36 | 8,500 |
| (46) | (II-1)/(A-34) = 60/40 | 8,600 |
| (47) | (II-1)/(A-35) = 51/49 | 8,800 |
| (48) | (II-1)/(A-36) = 50/50 | 8,400 |
| (49) | (II-2)/(A-19) = 64/36 | 10,100 |
| (50) | (II-1')/(A-20) = 61/39 | 9,200 |
| (51) | (II-1")/(A-26) = 55/45 | 9,100 |
| (52) | (II-3)/(A-26) = 49/51 | 7,800 |
| (53) | (II-4)/(A-26) = 52/48 | 12,100 |
| (54) | (II-1)/(B-1) = 58/42 | 14,200 |
| (55) | (II-1)/(B-1') = 70/30 | 16,600 |
| (56) | (II-1)/(B-7) = 78/22 | 9,200 |
| (57) | (II-1)/(B-8) = 73/27 | 8,400 |
| (58) | (II-1)/(B-12') = 69/31 | 8,600 |
| (59) | (II-1)/(A-19)/(VII-2) = 64/26/10 | 9,200 |
| (60) | (II-1)/(A-19)/(F-1) = 63/27/9 | 8,900 |
| (61) | (II-1)/(A-19)/(III-1) = 60/33/7 | 9,000 |
| (62) | (II-1)/(A-19)/(F-7) = 58/33/9 | 9,500 |
| (63) | (II-1)/(A-19)/(F-19) = 51/33/16 | 10,200 |
| (64) | (II-1)/(B-4)/(VII-2) = 61/24/15 | 10,600 |
| (65) | (II-1)/(B-12")/(F-2) = 59/33/8 | 10,000 |
| (66) | (II-1)/(B-10)/(III-3) = 56/30/14 | 7,200 |
| (67) | (II-3)/(B-8)/(F-7) = 49/36/15 | 9,200 |
| (68) | (II-4)/(B-12")/(F-24) = 59/33/8 | 8,300 |

Synthesis of Triphenyl Sulfonium Nonafluorobutane Sulfonate (VII-4)

Triphenylsulfonium iodide (20 g) was dissolved in 500 ml of methanol, and 12.5 g of silver oxide was added thereto followed by stirring at room temperature for 4 hours. The reaction solution was filtrated to eliminate the silver compound, subsequently 14.9 g of nonafluorobutane sulfonic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 18 g of the object.

Synthesis of Triphenylsulfonium 4-dodecylbenzenesulfonate (PAG4-1)

Triphenylsulfonium iodide (10 g) was dissolved in 500 ml of methanol, and 4.44 g of silver oxide was added thereto followed by stirring at room temperature for 4 hours. The reaction solution was filtrated to eliminate the silver compound, subsequently 4.67 g of 4-dodecylbenzene sulfonic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 6 g of the object.

Synthesis of Triphenylsulfonium Nonafluoropentanoate (II-4f)

Triphenylsulfonium iodide (20 g) was dissolved in 500 ml of methanol, and 12.5 g of silver oxide was added thereto followed by stirring at room temperature for 4 hours. The reaction solution was filtrated to eliminate the silver compound, subsequently 14.9 g of nonafluoropentanoic acid was added to this solution, and this solution was concentrated. Diisopropyl ether (300 ml) was added to the obtained oil, stirred thoroughly, and subsequently the manipulation where diisopropyl ether was eliminated by decantation was repeated twice. The obtained oil was dried under reduced pressure to yield 18 g of the object.

Examples 3-1 to 3-23 and Comparative Examples 3-1 and 3-2

A polymer solution where resin A component (1.2 g), the acid generator B-1 component (0.024 g), the acid generator B-2 component (0.006 g), the surfactant D component (100 ppm, based on the polymer solution), and the basic compound E component (0.0012 g) shown in the following Table 8 were dissolved in the solvent C component (19.6 g) was filtrated through a Teflon filter of 0.1 μm to prepare the positive photoresist solution.

TABLE 8

| | (A) component resin | Acid generator (B-1) | Acid generator (B-2) (weight ratio) | (C) component solvent (weight ratio) | (D) component surfactant | (E) component basic (weight ratio) |
|---|---|---|---|---|---|---|
| Example | | | | | | |
| 3-1 | (41) | (VII-4) | (PAG4-1) | S-2 | W-1 | |
| 3-2 | (42) | (VII-14) | (PAG4-1) | S-2 | W-2 | (N-1) |
| 3-3 | (43) | (VII-24) | (PAG4-4) | S-2 | W-1 | |
| 3-4 | (44) | (VII-36) | (PAG4-34) | S-2/S-3 (80/20) | W-1 | (N-2) |
| 3-5 | (45) | (VII-54) | (PAG4-34) | S-2 | W-1 | (N-3) |
| 3-6 | (46) | (VII-4) | (PAG4-35) | S-2/S-3 (90/10) | W-2 | |
| 3-7 | (47) | (VII-4) | (II-4f) | S-2 | W-1 | |
| 3-8 | (48) | (VII-4) | (II-5f) | S-2/S-3 (70/30) | W-1 | |
| 3-9 | (49) | (VII-4) | (II-49f) | S-2 | W-1 | (N-1) |
| 3-10 | (50) | (VII-14) | (III-3f) | S-2 | W-2 | |
| 3-11 | (51) | (VII-4) | (II-3) | S-2 | W-1 | |
| 3-12 | (52) | (VII-4) | (II-11) | S-2 | W-1 | |
| 3-13 | (53) | (VII-4) | (II-4) | S-2 | W-1 | (N-1)/(N-2) = 50/50 |
| 3-14 | (54) | (VII-4) | (II-5) | S-2 | W-1 | |
| 3-15 | (55) | (PAG4-1) | (II-4f) | S-2 | W-1 | |
| 3-16 | (56) | (PAG4-4) | (II-5f) | S-2/S-3 (90/10) | W-2 | |
| 3-17 | (57) | (PAG3-34) | (II-49f) | S-2 | W-1 | |
| 3-18 | (58) | (PAG4-35) | (III-3f) | S-1/S-2 (5/95) | W-1 | |
| 3-19 | (59) | (PAG4-34) | (II-3) | S-2 | W-1 | |
| 3-20 | (60) | (VII-4) | (II-4)/(PAG-35) = 50/50 | S-2 | W-2 | |
| 3-21 | (61) | (PAG4-35) | (II-5)/(II-5f) = 50/50 | S-2 | W-1 | |
| 3-22 | (62) | (PAG4-34) | (II-11) | S-1/S-2 (10/90) | W-2 | |
| 3-23 | (63) | (II-49f) | (II-5) | S-2 | W-1 | |
| Comparative example | | | | | | |
| 3-1 | (41) | (VII-14) | | S-2 | W-1 | (N-1) |

TABLE 8-continued

|  | (A) component resin | Acid generator (B-1) | Acid generator (B-2) (weight ratio) | (C) component solvent (weight ratio) | (D) component surfactant | (E) component basic (weight ratio) |
|---|---|---|---|---|---|---|
| 3-2 | (51) | (PAG4-1) |  | S-2/S-3 (70/30) | W-1 |  |

The contents of the symbols in Table 8 are as follows.
N-1: Hexamethylenetetramine
N-2: 1,5-diazabicyclo[4.3.0]-5-nonene
N-3: 1,8-diazabicyclo[5.4.0]-7-undecene
W-1: Megafac F176 (supplied from Dainippon Ink And Chemicals, Incorporated) (fluorine)
W-2: Megafac R08 (supplied from Dainippon Ink And Chemicals, Incorporated) (fluorine and silicon)
S-1: Ethyl lactate
S-2: Propyleneglycol monomethylether acetate
S-3: Propyleneglycol monomethylether Utilizing a spin coater, the positive photoresist solution prepared as the above was evenly applied on a silicon wafer on which anti-reflection film (DUV42-6, supplied from Brewer Science Inc.) was applied, and dried with heating at 120° C. for 60 seconds to form a positive photoresist film with a thickness of 0.1 µm. Pattern exposure was carried out for this resist film using KrF excimer laser microstepper (NA=0.63) and a mask for lines and spaces (line width 150 nm, line/space=1/1). Immediately after the exposure, the film was heated on a hot plate at 110° C. for 90 seconds. Further, it was developed in an aqueous solution of 2.38% tetramethyl ammonium hydroxide at 23° C. for 30 seconds, and rinsed with purified water followed by drying. For the pattern obtained in this way on the silicon wafer, its resist performance was evaluated by the following methods.

It was evaluated as follows.

[Line edge roughness] For the range of 5 µm edge in a longitudinal direction of the line pattern, a distance from a standard line where the edge should exist was measured for 50 points by an end-measuring SEM(S-8840, supplied from Hitachi Ltd.), standard deviation was sought, and 3σ was calculated. The smaller the value is, it indicates the better performance.

[Development time dependence] In an exposure amount which reproduces the size of mask pattern for lines and spaces of 150 nm when the development time is 30 seconds, the development time dependence indicates the size difference from 150 nm when the formed size of the same pattern is measured when the development time is 90 seconds.

The results of the performance evaluation were shown in Table 9.

TABLE 9

|  | Line edge roughness (nm) | Development time dependence (nm) |
|---|---|---|
| Example 3-1 | 7.7 | 2.8 |
| Example 3-2 | 7.8 | 3.5 |
| Example 3-3 | 8.1 | 3.4 |
| Example 3-4 | 7.9 | 3.1 |
| Example 3-5 | 8.0 | 2.9 |
| Example 3-6 | 8.1 | 2.7 |
| Example 3-7 | 7.9 | 3.1 |
| Example 3-8 | 7.8 | 3.0 |
| Example 3-9 | 8.1 | 3.1 |
| Example 3-10 | 7.7 | 2.9 |
| Example 3-11 | 7.6 | 2.7 |
| Example 3-12 | 8.2 | 2.6 |
| Example 3-13 | 8.1 | 2.9 |
| Example 3-14 | 7.9 | 2.4 |
| Example 3-15 | 8.0 | 3.1 |
| Example 3-16 | 8.1 | 3.0 |
| Example 3-17 | 7.8 | 3.2 |
| Example 3-18 | 7.7 | 3.1 |
| Example 3-19 | 8.0 | 2.9 |
| Example 3-20 | 8.1 | 2.8 |
| Example 3-21 | 8.3 | 2.9 |
| Example 3-22 | 8.1 | 3.1 |
| Example 3-23 | 8.4 | 3.1 |
| Comparative example 3-1 | 13.2 | 9.1 |
| Comparative example 3-2 | 12.7 | 8.9 |

From the results in Table 9, it is found that the composition of the invention is small and good in line edge roughness and development time dependence.

According to the present invention, it is possible to provide the photosensitive composition where the problems of line edge roughness, development time dependence and footing formation are improved.

The entire disclosure of each and every foreign patent application from which the benefit of foreign priority has been claimed in the present application is incorporated herein by reference, as if fully set forth.

What is claimed is:

1. A photosensitive resin composition comprising:
   (A) a resin which decomposes by an action of acid to increase the solubility in alkali developer, in which the resin contains: a repeat unit having a group represented by the following general formula (Z); and a repeat unit having a group which decomposes by an action of acid to become an alkali soluble group;
   (B) a compound capable of generating an acid upon irradiation with one of an actinic ray and a radiation, in which the compound includes at least two kinds of compounds selected from the group consisting of compounds (B1), (B2), (B3) and (B4):
   (B1) a compound capable of generating aliphatic or aromatic sulfonic acid substituted with at least one fluorine atom upon irradiation with one of an actinic ray and a radiation;
   (B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation;

(C) a solvent; and (D) a surfactant:

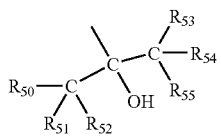
(Z)

wherein $R_{50}$ to $R_{55}$ are the same or different, and represent a hydrogen atom, a fluorine atom, or an alkyl group which may have a substituent, and at least one of $R_{50}$ to $R_{55}$ represents a fluorine atom, or an alkyl group wherein at least one hydrogen atom is substituted with a fluorine atom.

2. The photosensitive resin composition according to claim 1, wherein the repeat unit having the group represented by the general formula (Z) is represented by the following general formula (1) or (2):

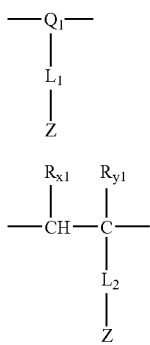

wherein $Q_1$ represents an alicyclic hydrocarbon group; $L_1$ and $L_2$ each independently represent a linking group; Z represents a group represented by the general formula (Z); $R_{x1}$ and $R_{y1}$ each independently represent a hydrogen atom, a halogen atom, a cyano group or an alkyl group which may have a substituent.

3. The photosensitive resin composition according to claim 1, wherein the repeat unit having the group which decomposes by the action of acid to become the alkali soluble group is represented by the following formula (3) or (4):

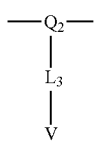
(3)

-continued

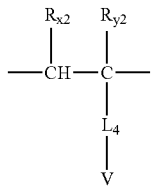
(4)

wherein $Q_2$ represents an alicyclic hydrocarbon group; $L_3$ and $L_4$ each independently represent a linking group; V represents a group which decomposes by an action of acid to become an alkali soluble group; $R_{x2}$ and $R_{y2}$ each independently represent a hydrogen atom, a halogen atom, a cyano group or an alkyl group which may have a substituent.

4. The photosensitive resin composition according to claim 1, wherein the resin (A) is a resin having: at least one of repeat units represented by the following formula (I); at least one of repeat units represented by the following formula (II); and at least one of repeat units represented by the following formula (VI):

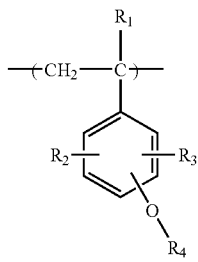
(I)

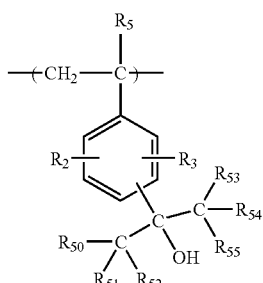
(II)

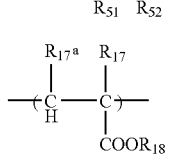
(VI)

wherein $R_1$, $R_5$, $R_{17a}$ and $R_{17}$ are the same or different, and represent a hydrogen atom, a halogen atom, a cyano group and an alkyl group which may have a substituent; $R_2$, $R_3$, $R_6$ and $R_7$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent; $R_{50}$ to $R_{55}$ are the same or different, and represent a hydrogen atom, a fluorine atom, or an alkyl group which may have a substituent, and at least one of $R_{50}$ to $R_{55}$ represents a fluorine atom, or an alkyl group wherein at least one hydrogen atom is substituted with a fluorine atom; $R_4$ represents a group represented by the following general formula (IV) or (V);

$R_{18}$ represents —C($R_{18d}$)($R_{18e}$)($R_{18f}$) or —C($R_{18d}$)($R_{18e}$)(O$R_{18g}$); $R_{18d}$ to $R_{18g}$ are the same or different, and represent a hydrogen atom, or an alkyl, cycloalkyl, alkenyl, aralkyl or aryl group which may have a substituent; two of $R_{18d}$, $R_{18e}$ and $R_{18f}$, or two of $R_{18d}$, $R_{18e}$ and $R_{18g}$ may combine to form a ring:

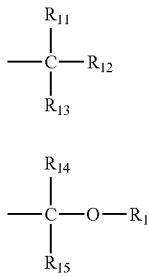

(IV)

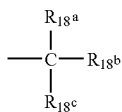

(V)

wherein $R_{11}$, $R_{12}$ and $R_{13}$ are the same or different, and represent an alkyl, cycloalkyl, alkenyl, aralkyl or aryl group which may have a substituent;

$R_{14}$ and $R_{15}$ are the same or different, and represent a hydrogen atom, or an alkyl group which may have a substituent; $R_{16}$ represents an alkyl, cycloalkyl, aralkyl or aryl group which may have a substituent; two of $R_{14}$ to $R_{16}$ may combine to form a ring.

5. The photosensitive resin composition according to claim 4, wherein $R_{18}$ in the general formula (VI) is represented by the following general formula (VI-A):

(VI-A)

wherein $R_{18a}$ and $R_{18b}$ are the same or different, and represent an alkyl group which may have a substituent; $R_{18c}$ represents a cycloalkyl group which may have a substituent.

6. The photosensitive resin composition according to claim 4, wherein $R_{18}$ in the general formula (VI) is represented by the following general formula (VI-B):

(VI-B)

wherein $R_{18h}$ represents an alkyl, alkenyl, alkynyl, aralkyl or aryl group which may have a substituent; Z represents an atomic group which composes a monocyclic or polycyclic alicyclic group with the carbon atom in the general formula (VI-B).

7. The photosensitive resin composition according to claim 4, wherein $R_{18}$ in the general formula (VI) is represented by the following general formula (VI-C):

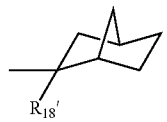

(VI-C)

wherein $R_{18'}$ represents an alkyl, alkenyl, alkynyl, aralkyl or aryl group which may have a substituent.

8. The photosensitive resin composition according to claim 4, wherein at least one of $R_1$ in the general formula (I), $R_5$ in the general formula (II) and $R_{17}$ in the general formula (IV) is a trifluoromethyl group.

9. The photosensitive resin composition according to claim 4, wherein the resin (A) further contains at least one repeat unit represented by the following general formula (III) or (VII):

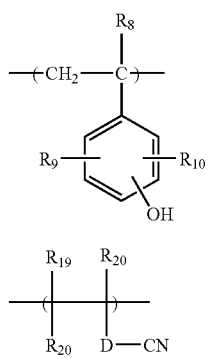

(III)

(VII)

wherein $R_8$ represents a hydrogen atom, a halogen atom, a cyano group, or an alkyl group which may have a substituent; $R_9$ and $R_{10}$ are the same or different, and represent a hydrogen atom, a halogen atom, a cyano group, or an alkyl, cycloalkyl, alkoxy, acyl, acyloxy, alkenyl, aryl or aralkyl group which may have a substituent;

$R_{19}$ and $R_{20}$ are the same or different, and represent a hydrogen atom, a halogen atom, a cyano group, or an alkyl group which may have a substituent; $R_{21}$ represents a hydrogen atom, a halogen atom, an alkyl group which may have a substituent, or —D—CN group; D represents a single bond or a bivalent linking group.

10. The photosensitive resin composition according to claim 4, wherein the resin (A) further contains at least one repeating unit represented by the following general formulae (VIII) to (XVII):

-continued

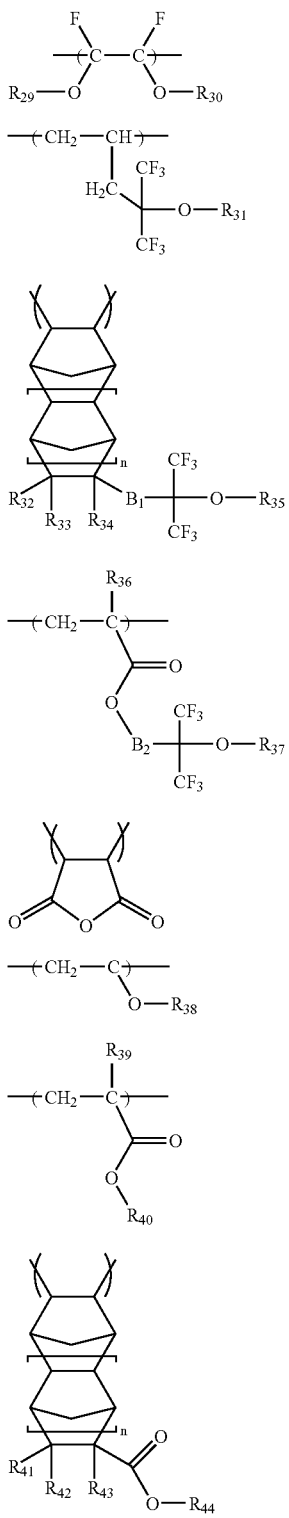

(X)

(XI)

(XII)

(XIII)

(XIV)

(XV)

(XVI)

(XVII)

wherein R$_{25}$, R$_{26}$ and R$_{27}$ are the same or different, and represent a hydrogen atom, a fluorine atom, or an alkyl, cycloalkyl or aryl group which may have a substituent; R$_{28}$, R$_{29}$ and R$_{30}$ are the same or different, and represent an alkyl, cycloalkyl or aryl group which may have a substituent; R$_{25}$ and R$_{26}$, R$_{27}$ and R$_{28}$, and, R$_{29}$ and R$_{30}$ may combine each other to form a ring; R$_{31}$, R$_{35}$, R$_{37}$, R$_{40}$ and R$_{44}$ are the same or different, and represent a hydrogen atom, or an alkyl, cycloalkyl, acyl or alkoxycarbonyl group which may have a substituent; R$_{32}$, R$_{33}$, R$_{34}$, R$_{41}$, R$_{42}$ and R$_{43}$ are the same or different, and represent a hydrogen atom, a halogen atom, or an alkyl or alkoxy group which may have a substituent; R$_{36}$ and R$_{39}$ are the same or different, and represent a hydrogen atom, a halogen atom, a cyano group, or an alkyl group which may have a substituent; R$_{38}$ represents an alkyl, cycloalkyl, aralkyl or aryl group which may have a substituent; B$_1$ and B$_2$ each represents a single bond or bivalent linking group; B$_3$ represents a bivalent linking group; and n represents 0 or 1.

11. A photosensitive resin composition comprising:
(A) a resin which decomposes by an action of an acid to increase the solubility in an alkali developer, in which the resin contains a repeat unit having a group represented by the following general formula (Y); and
(B) a compound capable of generating an acid upon irradiation with one of an actinic ray and a radiation, in which the compound includes at least two kinds of compounds selected from the group consisting of compounds (B1), (B2), (B3) and (B4):
(B1) a compound capable of generating aliphatic or aromatic sulfonic acid substituted with at least one fluorine atom upon irradiation with one of an actinic ray and a radiation;
(B2) a compound capable of generating aliphatic or aromatic sulfonic acid containing no fluorine atom upon irradiation with one of an actinic ray and a radiation;
(B3) a compound capable of generating aliphatic or aromatic carboxylic acid substituted with at least one fluorine atom upon irradiation with one of an actinic ray and a radiation; and
(B4) a compound capable of generating aliphatic or aromatic carboxylic acid containing no fluorine atom upon irradiation with one of an actinic ray and a radiation;

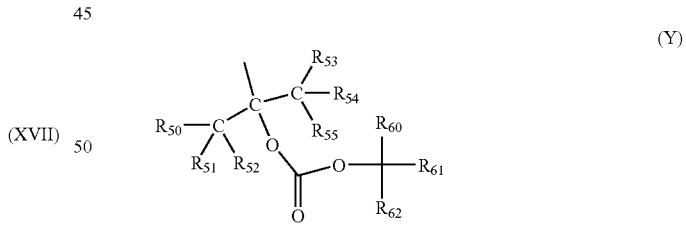

(Y)

wherein R$_{50}$ to R$_{55}$ are the same or different, and represent a hydrogen atom, a fluorine atom, or an alkyl group which may have a substituent; at least one of R$_{50}$ to R$_{55}$ represents a fluorine atom, or an alkyl group wherein at least one hydrogen atom is substituted with a fluorine atom; R$_{60}$ to R$_{62}$ are the same or different, and represent an alkyl, cycloalkyl, alkenyl, aralkyl or aryl group which may have a substituent.

12. The photosensitive resin composition according to claim 11, wherein the repeat unit having the group represented by the general formula (Y) is represented by the following general formula (1') or (2'):

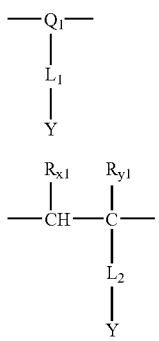

(1)

(2)

$Q_1$ represents an alicyclic hydrocarbon group; $L_1$ and $L_2$ each independently represent a linking group; Y represents a group represented by the general formula (Y); $R_{x1}$ and $R_{y1}$ each independently represent a hydrogen atom, a halogen atom, a cyano group or an alkyl group which may have a substituent.

13. The photosensitive resin composition according to claim 11, wherein the resin (A) is a resin having: at least one of repeat units represented by the following formula (II); and at least one of repeat units represented by the following formula (II'):

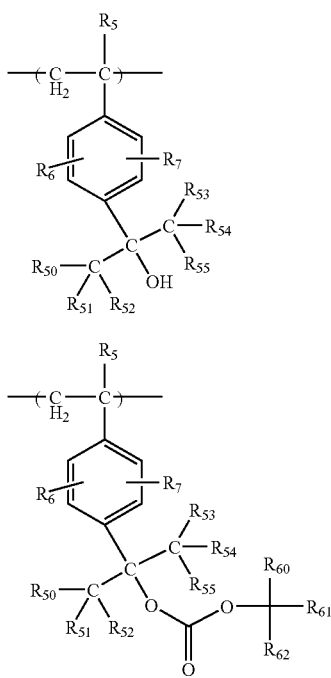

(II)

(II')

wherein $R_5$ are the same or different, and represents a hydrogen atom, a halogen atom, a cyano group, or an alkyl group which may have a substituent; $R_6$ and $R_7$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent;

$R_{50}$ to $R_{55}$ are the same or different, and represent a hydrogen atom, a fluorine atom, or an alkyl group which may have a substituent, and at least one of $R_{50}$ to $R_{55}$ represents a fluorine atom, or an alkyl group wherein at least one hydrogen atom is substituted with a fluorine atom;

$R_{60}$ to $R_{62}$ are the same or different, and represent an alkyl, cycloalkyl, alkenyl, aralkyl or aryl group which may have a substituent.

14. The photosensitive resin composition according to claim 11, wherein the resin (A) is a resin having: at least one of repeat units represented by the following formula (I); at least one of repeat units represented by the following formula (II); and at least one of repeat units represented by the following formula (II'):

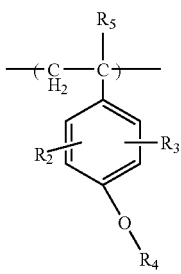

(I)

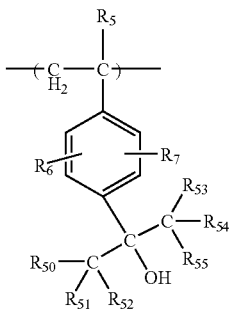

(II)

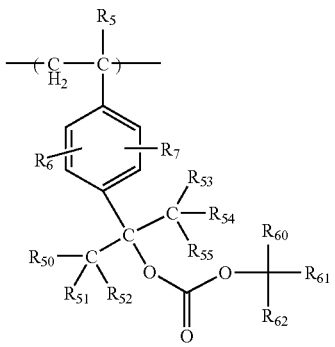

(II')

wherein $R_2$, $R_3$, $R_6$ and $R_7$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent;

$R_4$ represents a group of the following general formula (IV) or (V);

$R_5$ are the same or different, and represents a hydrogen atom, a halogen atom, a cyano group or an alkyl group which may have a substituent;

$R_{50}$ to $R_{55}$ are the same or different, and represent a hydrogen atom, a fluorine atom, or an alkyl group which may have a substituent, and at least one of $R_{50}$ to $R_{55}$ represents a fluorine atom or an alkyl group wherein at least one hydrogen atom is substituted with a fluorine atom;

$R_{60}$ to $R_{62}$ are the same or different, and represent an alkyl, cycloalkyl, alkenyl, aralkyl or aryl group which may have a substituent;

(IV)

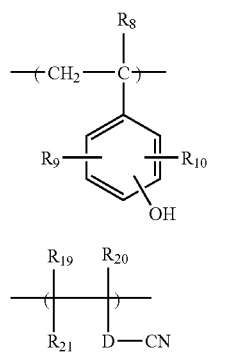

(V)

$R_{11}$, $R_{12}$ and $R_{13}$ are the same or different, and represent an alkyl, cycloalkyl, alkenyl, aralkyl or aryl group which may have a substituent;

$R_{14}$ and $R_{15}$ are the same or different, and represent a hydrogen atom or an alkyl group which may have a substituent;

$R_{16}$ represents an alkyl, cycloalkyl, aralkyl or aryl group which may have a substituent, and two of $R_{14}$ to $R_{16}$ may combine to form a ring.

15. The photosensitive resin composition according to claim 14, wherein at least one of $R_5$ in the general formula (I), $R_5$ in the general formula (II) and $R_5$ in the general formula (II') is a trifluoromethyl group.

16. The photosensitive resin composition according to claim 14, wherein the resin (A) further has at least one repeat unit represented by the following general formula (III) or (VII):

(III)

(VII)

wherein $R_8$ represents a hydrogen atom, a halogen atom a cyano group, or an alkyl group which may have a substituent; $R_9$ and $R_{10}$ are the same or different, and represent a hydrogen atom, a halogen atom, a cyano group, or an alkyl, cycloalkyl, alkoxy, acyl, acyloxy, alkenyl, aryl or aralkyl group which may have a substituent;

$R_{19}$ and $R_{20}$ are the same or different, and represent a hydrogen atom, a halogen atom, a cyano group, or an alkyl group which may have a substituent; $R_{21}$ represents a hydrogen atom, a halogen atom, an alkyl group which may have a substituent, or —D—CN group; D represents a single bond or a bivalent linking group.

17. The photosensitive resin composition according to claim 14, wherein the resin (A) further has at least one repeat unit represented by the following general formulae (VIII) to (XVII):

(VIII)

(IX)

(X)

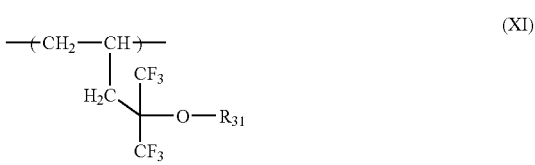

(XI)

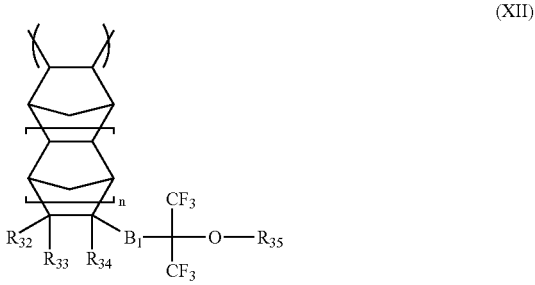

(XII)

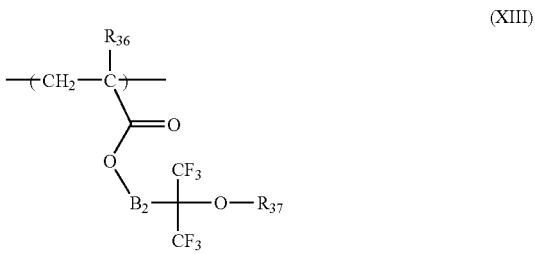

(XIII)

(XIV)

(XV)

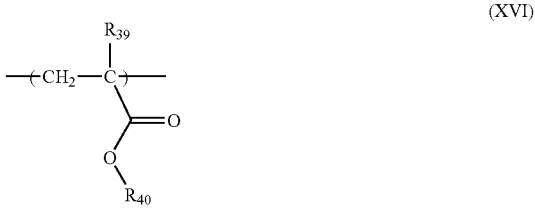

(XVI)

-continued

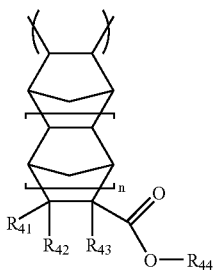
(XVII)

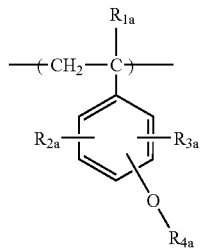
(IA)

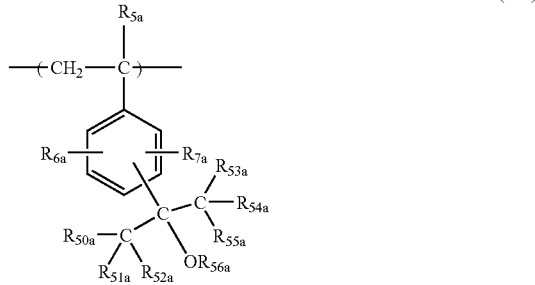
(IIA)

wherein $R_{25}$, $R_{26}$ and $R_{27}$ are the same or different, and represent a hydrogen atom, a fluorine atom, or an alkyl, cycloalkyl or aryl group which may have a substituent; $R_{28}$, $R_{29}$ and $R_{30}$ are the same or different, and represent an alkyl, cycloalkyl or aryl group which may have a substituent; $R_{25}$ and $R_{26}$, $R_{27}$ and $R_{28}$, and, $R_{29}$ and $R_{30}$ may combine each other to form a ring; $R_{31}$, $R_{35}$, $R_{37}$, $R_{40}$ and $R_{44}$ are the same or different, and represent a hydrogen atom, or an alkyl, cycloalkyl, acyl or alkoxycarbonyl group which may have a substituent; $R_{32}$, $R_{33}$, $R_{34}$, $R_{41}$, $R_{42}$ and $R_{43}$ are the same or different, and represent a hydrogen atom, a halogen atom, or an alkyl or alkoxy group which may have a substituent; $R_{36}$ and $R_{39}$ are the same or different, and represent a hydrogen atom, a halogen atom, a cyano group, or an alkyl group which may have a substituent; $R_{38}$ represents an alkyl, cycloalkyl, aralkyl or aryl group which may have a substituent; $B_1$ and $B_2$ each represents a single bond or a bivalent linking group; $B_3$ represents a bivalent linking group; and n represents 0 or 1.

18. A photosensitive resin composition comprising:

(A) a resin which decomposes by an action of acid to increase the solubility in alkali developer, in which the resin has a repeat unit represented by the following general formula (IA) and a repeat unit represented by the following general formula (IIA); and (B) a compound capable of generating an acid upon irradiation with one of an actinic ray and a radiation, in which the compound includes at least two kinds of compounds selected from the group consisting of compounds (B1), (B2), (B3) and (B4):

(B1) a compound capable of generating aliphatic or aromatic sulfonic acid substituted with at least one fluorine atom upon irradiation with one of an actinic ray and a radiation;

(B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation:

wherein $R_{1a}$ and $R_{5a}$ are the same or different, and represent a hydrogen atom, a halogen atom, a cyano group, or an alkyl group which may have a substituent; $R_{2a}$, $R_{3a}$, $R_{6a}$ and $R_{7a}$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent; $R_{50a}$ to $R_{55a}$ are the same or different, and represent a hydrogen atom, a fluorine atom, or an alkyl group which may have a substituent; at least one of $R_{50a}$ to $R_{55a}$ represents a fluorine atom or an alkyl group wherein at least one hydrogen atom is substituted with a fluorine atom; $R_{56a}$ represents a hydrogen atom, or an alkyl, cycloalkyl, acyl or alkoxycarbonyl group which may have a substituent; $R_{4a}$ represents a group of the following general formula (IVA) or (VA):

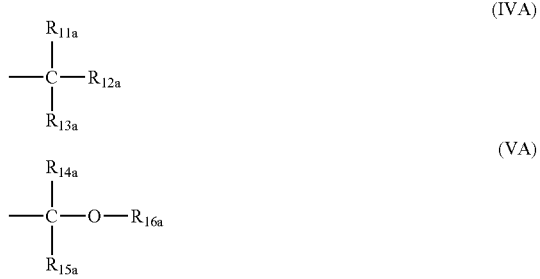

wherein $R_{11a}$, $R_{12a}$ and $R_{13a}$ are the same or different, and represent an alkyl, cycloalkyl, alkenyl, aralkyl or aryl group which may have a substituent;

$R_{14a}$ and $R_{15a}$ are the same or different, and represent a hydrogen atom or an alkyl group which may have a substituent; $R_{6a}$ represents an alkyl, cycloalkyl, aralkyl or aryl group which may have a substituent; two of $R_{14a}$ to $R_{16a}$ may combine to form a ring.

19. A photosensitive resin composition comprising:

(A) a resin which decomposes by an action of acid to increase the solubility in alkali developer, in which the resin has a repeat unit represented by the following general formula (IIA) and a repeat unit represented by the following general formula (VIA); and (B) a compound capable of generating an acid upon irradiation with one of an actinic ray and a radiation, in which the compound includes at least two kinds of compounds selected from the group consisting of compounds (B1), (B2), (B3) and (B4):

(B1) a compound capable of generating aliphatic or aromatic sulfonic acid substituted with at least one fluorine atom upon irradiation with one of an actinic ray and a radiation;

(B2) a compound capable of generating aliphatic or aromatic sulfonic acid containing no fluorine atom upon irradiation with one of an actinic ray and a radiation;

(B3) a compound capable of generating aliphatic or aromatic carboxylic acid substituted with at least one fluorine atom upon irradiation with one of an actinic ray and a radiation; and (B4) a compound capable of generating aliphatic or aromatic carboxylic acid containing no fluorine atom upon irradiation with one of an actinic ray and a radiation:

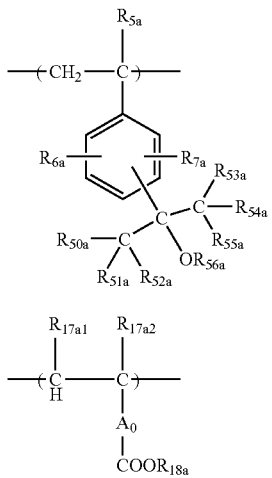

(IIA)

(VIA)

wherein $R_{5a}$ represents a hydrogen atom, a halogen atom, a cyano group, or an alkyl group which may have a substituent; $R_{6a}$ and $R_{7a}$ are the same or different, and represent a hydrogen atom, a halogen atom, a cyano group, a hydroxyl group, or an alkyl, cycloalkyl, alkoxy, acyl, acyloxy, alkenyl, aryl or aralkyl group which may have a substituent; $R_{50a}$ to $R_{55a}$ are the same or different, and represent a hydrogen atom, a fluorine atom, or an alkyl group which may have a substituent, and at least one of $R_{50a}$ to $R_{55a}$ represents a fluorine atom or an alkyl group wherein at least one hydrogen atom is substituted with a fluorine atom; $R_{56a}$ represents a hydrogen atom, or an alkyl, cycloalkyl, acyl or alkoxycarbonyl group which may have a substituent; $R_{17a1}$ and $R_{17a2}$ are the same or different, and represent a hydrogen atom, a halogen atom, a cyano group and an alkyl group which may have a substituent; $R_{18a}$ represents —C($R_{18a1}$)($R_{18a2}$)($R_{18a3}$) or —C($R_{18a1}$)($R_{18a2}$)(O$R_{18a4}$); $R_{18a1}$ to $R_{18a4}$ are the same or different, and represent a hydrogen atom or an alkyl, cycloalkyl, alkenyl, aralkyl or aryl group which may have a substituent, and two of $R_{18a1}$, $R_{18a2}$ and $R_{18a3}$ or two of $R_{18a1}$, $R_{18a2}$ and $R_{18a4}$ may combine to form a ring; $A_0$ represents a single bond or a bivalent linking group which may have a substituent.

20. The photosensitive resin composition according to claim 19, wherein $R_{18a}$ in the general formula (VIA) is represented by the following general formula (VIA-A):

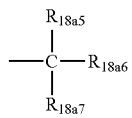

(VIA-A)

wherein $R_{18a5}$ and $R_{18a6}$ are the same or different, and represent an alkyl group which may have a substituent; $R_{18a7}$ represents a cycloalkyl group which may have a substituent.

21. The photosensitive resin composition according to claim 19, wherein $R_{18a}$ in the general formula (VIA) is represented by the following general formula (VIA-B):

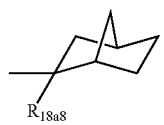

(VIA-B)

wherein $R_{18a8}$ represents an alkyl, alkenyl, alkynyl, aralkyl or aryl group which may have a substituent.

22. The photosensitive resin composition according to claim 18 or 19, wherein at least one of $R_{1a}$ in the general formula (IA), $R_{5a}$ in the general formula (IIA) and $R_{17a2}$ in the general formula (VIA) is a trifluoromethyl group.

23. The photosensitive resin composition according to claim 18 or 19, wherein the resin (A) further has at least one repeat unit represented by the following general formula (IIIA) or (VIIA):

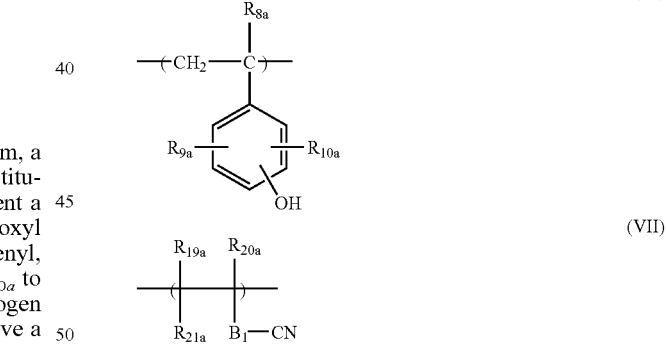

(III)

(VII)

wherein $R_{8a}$ represents a hydrogen atom, a halogen atom, a cyano group, or an alkyl group which may have a substituent; $R_{9a}$ and $R_{10a}$ are the same or different, and represent a hydrogen atom, a halogen atom, a cyano group, or an alkyl, cycloalkyl, alkoxy, acyl, acyloxy, alkenyl, aryl or aralkyl group which may have a substituent;

$R_{19a}$ and $R_{20a}$ are the same or different, and represent a hydrogen atom, a halogen atom, a cyano group, or an alkyl group which may have a substituent; $R_{21a}$ represents a hydrogen atom, a halogen atom, an alkyl group which may have a substituent, or —$B_1$—CN group; $B_1$ represents a single bond or a bivalent linking group.

* * * * *